(12) United States Patent
Lee et al.

(10) Patent No.: US 9,508,738 B2
(45) Date of Patent: Nov. 29, 2016

(54) SEMICONDUCTOR DEVICES

(71) Applicant: Samsung Electronics Co., Ltd., Suwon-si (KR)

(72) Inventors: Jae-Duk Lee, Seongnam-si (KR); Young-Woo Park, Seoul (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/591,929

(22) Filed: Jan. 8, 2015

(65) Prior Publication Data

US 2015/0325588 A1 Nov. 12, 2015

(30) Foreign Application Priority Data

May 12, 2014 (KR) ........................ 10-2014-0056222

(51) Int. Cl.
*H01L 29/66* (2006.01)
*H01L 27/115* (2006.01)

(52) U.S. Cl.
CPC ... *H01L 27/11582* (2013.01); *H01L 27/11573* (2013.01)

(58) Field of Classification Search
CPC .................... H01L 27/11582; H01L 27/11573
See application file for complete search history.

(56) References Cited

U.S. PATENT DOCUMENTS

| 8,044,448 | B2 | 10/2011 | Kamigaichi et al. | |
|---|---|---|---|---|
| 8,234,680 | B2* | 7/2012 | Da Palma | G06F 11/3684 725/93 |
| 8,324,680 | B2 | 12/2012 | Izumi et al. | |
| 8,374,033 | B2 | 2/2013 | Kito et al. | |
| 8,575,590 | B2 | 11/2013 | Muraoka et al. | |
| 8,592,789 | B2 | 11/2013 | Sasago et al. | |
| 8,619,453 | B2 | 12/2013 | Scheuerlein | |
| 8,634,242 | B2 | 1/2014 | Grossi et al. | |
| 2011/0292731 | A1 | 12/2011 | Kim et al. | |
| 2012/0201080 | A1* | 8/2012 | Kang | G11C 16/0483 365/185.11 |
| 2012/0228697 | A1* | 9/2012 | Youm | H01L 29/7926 257/329 |
| 2013/0009235 | A1* | 1/2013 | Yoo | H01L 29/7926 257/329 |
| 2015/0206587 | A1* | 7/2015 | Hasegawa | H01L 27/0694 365/185.17 |
| 2015/0294978 | A1* | 10/2015 | Lu | H01L 27/1157 438/269 |
| 2015/0348637 | A1* | 12/2015 | Han | G11C 16/16 365/185.2 |

* cited by examiner

*Primary Examiner* — Victor A Mandala
(74) *Attorney, Agent, or Firm* — Muir Patent Law, PLLC

(57) ABSTRACT

A semiconductor device includes a lower insulation layer, a plurality of base layer patterns separated from each other on the lower insulation layer, a separation layer pattern between the base layer patterns, a plurality of channels extending in a vertical direction with respect to top surfaces of the base layer patterns, and a plurality of gate lines surrounding outer sidewalls of the channels, being stacked in the vertical direction and spaced apart from each other.

19 Claims, 64 Drawing Sheets

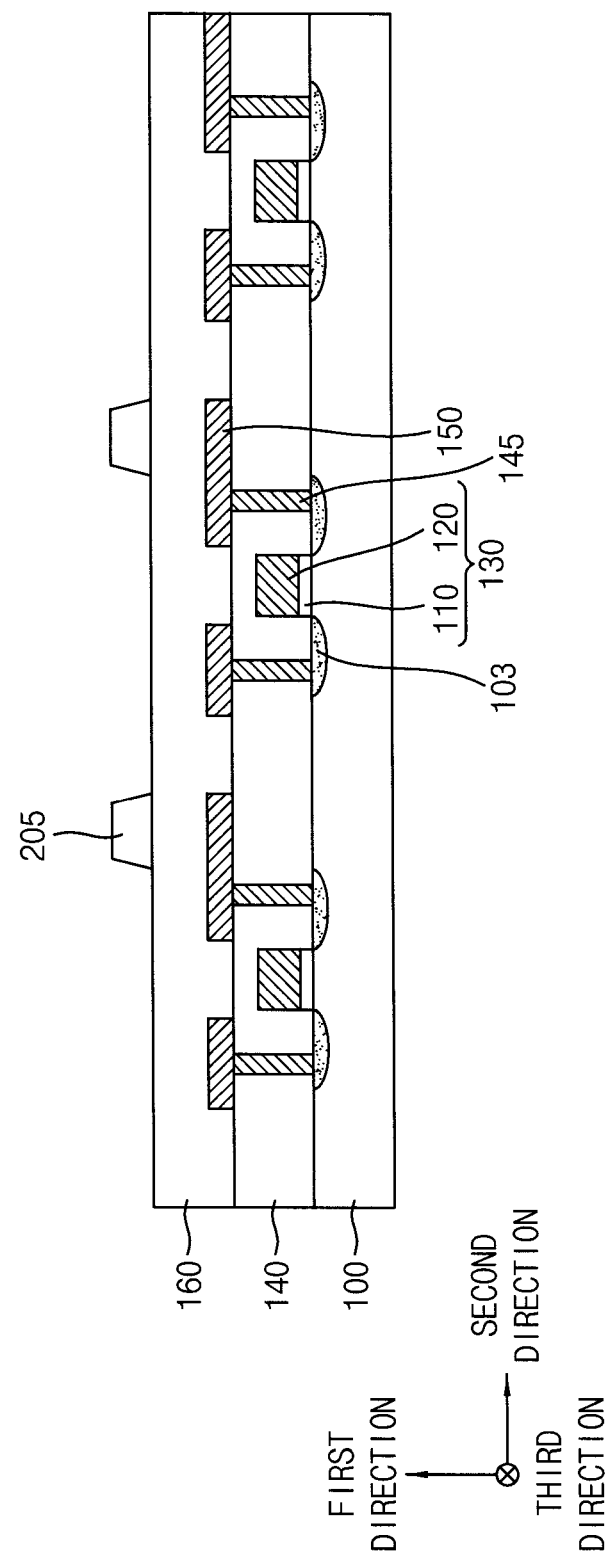

SEMICONDUCTOR DEVICES

CROSS-REFERENCE TO RELATED APPLICATION

This application claims priority under 35 USC §119 to Korean Patent Application No. 10-2014-0056222, filed on May 12, 2014 in the Korean Intellectual Property Office (KIPO), the contents of which are incorporated by reference herein in their entirety.

BACKGROUND

1. Field

Example embodiments relate to semiconductor devices. More particularly, example embodiments relate to semiconductor devices including a peripheral circuit and memory cells.

2. Description of the Related Art

Recently, a vertical memory device including a plurality of memory cells stacked repeatedly with respect to a surface of a substrate has been developed in order to realize a high degree of integration. In the vertical memory device, a channel may protrude vertically from the surface of the substrate, and gate lines and insulation layers surrounding the channel may be repeatedly stacked. Further, a peripheral circuit may be formed on the substrate, and the memory cells may be stacked on the peripheral circuit.

However, as the stacked number of the memory cells becomes greater, an operation of the vertical memory device may not be easily controlled.

SUMMARY

Example embodiments provide a semiconductor device having an improved operational efficiency.

Example embodiments provide a method of manufacturing a semiconductor device having an improved operational efficiency.

According to example embodiments, there is provided a semiconductor device. The semiconductor device includes a lower insulation layer, a plurality of base layer patterns separated from each other on the lower insulation layer, a separation layer pattern between the base layer patterns, a plurality of channels extending in a vertical direction with respect to top surfaces of the base layer patterns, and a plurality of gate lines surrounding outer sidewalls of the channels. The gate lines are stacked in the vertical direction and spaced apart from each other.

In example embodiments, the base layer patterns may include polysilicon or single crystalline silicon.

In example embodiments, the base layer patterns may serve as p-type wells.

In example embodiments, the separation layer pattern may include a first separation layer pattern and a second separation layer pattern crossing each other.

In example embodiments, the base layer patterns may include island patterns isolated from each other.

In example embodiments, the semiconductor device may further include a peripheral circuit on a substrate. The lower insulation layer may cover the peripheral circuit.

In example embodiments, the semiconductor device may further include a first impurity region formed on an upper portion of each of the base layer patterns, a first connecting contact in contact with the first impurity region, a second connecting contact electrically connected to the peripheral circuit, and a connecting wiring for electrically connecting the first connecting contact and the second connecting contact to each other. The first impurity region, the first connecting contact, the second connecting contact and the connecting wiring may be provided for each of the base layer patterns In example embodiments, the semiconductor device may further include a gate line cut pattern intersecting the gate lines in the vertical direction, and a second impurity region formed at a portion of the base layer patterns under the gate line cut pattern.

In example embodiments, the gate line cut pattern and the second impurity region may extend in a direction crossing the separation layer pattern.

In example embodiments, the gate line cut pattern and the second impurity region may extend in the same direction as an extending direction of the separation layer pattern.

In example embodiments, the gate line cut pattern may overlap the separation layer pattern along the vertical direction.

In example embodiments, the second impurity region may be formed at a central portion of each of the base layer patterns.

In example embodiments, the semiconductor device may further include a bit line electrically connected to the channels. The separation layer pattern may extend in the same direction as an extending direction of the bit line.

According to example embodiments, there is provided a semiconductor device. The semiconductor device includes a peripheral circuit on a substrate, a lower insulation layer covering the peripheral circuit, a plurality of base layer patterns separated from each other on the lower insulation layer, and a plurality of cell blocks on the base layer patterns. The cell blocks include a plurality of channels extending in a vertical direction with respect to top surfaces of the base layer patterns, and a plurality of gate lines surrounding outer sidewalls of the channels. The gate lines are stacked in the vertical direction and spaced apart from each other.

In example embodiments, each one of the cell blocks may be segmented into a plurality of sub-cell blocks.

In example embodiments, the semiconductor device may further include separation layer patterns between the base layer patterns, and gate line cut patterns between the cell blocks. The gate line cut patterns may extend in a direction that crosses the separation layer patterns. The sub-cell blocks may be defined by the separation layer patterns and the gate line cut patterns.

In example embodiments, the semiconductor device may further include a connecting contact electrically connected to the peripheral circuit and provided for each of the sub-cell blocks.

According to example embodiments, there is provided a semiconductor device. The semiconductor device includes a lower insulation layer, a plurality of base layer patterns separated from each other on the lower insulation layer, a plurality of channels extending in a vertical direction with respect to top surfaces of the base layer patterns, and a plurality of gate lines surrounding outer sidewalls of the channels, being stacked in the vertical direction and spaced apart from each other. An erase voltage is applied selectively to some of the base layer patterns.

In example embodiments, the semiconductor device may further include gate line cut patterns intersecting the gate lines. A plurality of gate line blocks may be defined by the gate line cut patterns, and a different power voltage may be applied to at least one of the gate line blocks on the base layer pattern to which the erase voltage is applied.

According to example embodiments, there is provided a method of manufacturing a semiconductor device. In the method, a plurality of base layer patterns separated from each other by a separation layer pattern is formed on a lower insulation layer. Insulating interlayers and sacrificial layers are formed alternately and repeatedly on the base layer patterns and the separation layer pattern. A plurality of channel is formed through the insulating interlayers and the sacrificial layers. The sacrificial layers are replaced with gate lines.

In example embodiments, a peripheral circuit may be formed on a substrate. The lower insulation layer covering the peripheral circuit may be formed on the substrate.

In example embodiments, in the formation of the plurality of the base layer patterns separated from each other by the separation layer pattern, the separation layer pattern may be formed on the lower insulation layer. An opening may be formed through the lower insulation layer to expose a top surface of the substrate. A base layer may be formed using the substrate as a seed. The base layer may fill the opening and may at least partially cover the lower insulation layer and the separation layer pattern.

In example embodiments, the substrate and the base layer may include single crystalline silicon.

In example embodiments, in the replacing the sacrificial layers with the gate lines, a gate line cut region may be formed through the insulating interlayers and the sacrificial layers. The sacrificial layers exposed by the gate line cut region may be removed. The gate lines may be formed in spaces from which the sacrificial layers are removed.

BRIEF DESCRIPTION OF THE DRAWINGS

Example embodiments will be more clearly understood from the following detailed description taken in conjunction with the accompanying drawings. FIGS. 1 to 45 represent non-limiting, example embodiments as described herein.

FIG. 1 is a top plan view illustrating a semiconductor device in accordance with example embodiments;

FIGS. 2 and 3 are exemplary cross-sectional views taken along lines I-I' and II-IF of FIG. 1, respectively;

FIG. 4 is a circuit diagram illustrating an operation of a semiconductor device in accordance with example embodiments;

FIGS. 5-8, 9A, 9B, 10, 11A, 11B, 12-14, 15A-23A and 15B-23B are top plan views and cross-sectional views illustrating a method of manufacturing a semiconductor device in accordance with example embodiments;

FIG. 24 is a top plan view illustrating a semiconductor device in accordance with some example embodiments;

FIG. 25 is a top plan view illustrating a semiconductor device in accordance with example embodiments;

FIGS. 26 and 27 are exemplary cross-sectional views taken along lines I-I' and II-IF of FIG. 25, respectively;

FIGS. 28A-31A, 28B-31B, 32, and 33 are cross-sectional views illustrating a method of manufacturing a vertical memory device in accordance with example embodiments;

FIG. 34 is a top plan view illustrating a semiconductor device in accordance with some example embodiments;

FIG. 35 is an exemplary cross-sectional view taken along a line II-IF of FIG. 34;

FIG. 36 is a top plan view illustrating a semiconductor device in accordance with example embodiments;

FIGS. 37 and 38 are exemplary cross-sectional views taken along lines I-I' and II-IF of FIG. 36, respectively;

FIG. 39 is a top plan view illustrating a semiconductor device in accordance with some example embodiments;

FIGS. 40 and 41 are exemplary cross-sectional views taken along lines I-I' and II-IF of FIG. 39, respectively;

FIGS. 42A-44A, 42B-44B, and 44C are top plan views and cross-sectional views illustrating a method of manufacturing a semiconductor device in accordance with example embodiments; and FIG. 45 is a block diagram illustrating a schematic construction of an information processing system in accordance with some example embodiments.

DESCRIPTION OF EMBODIMENTS

Figure 1:
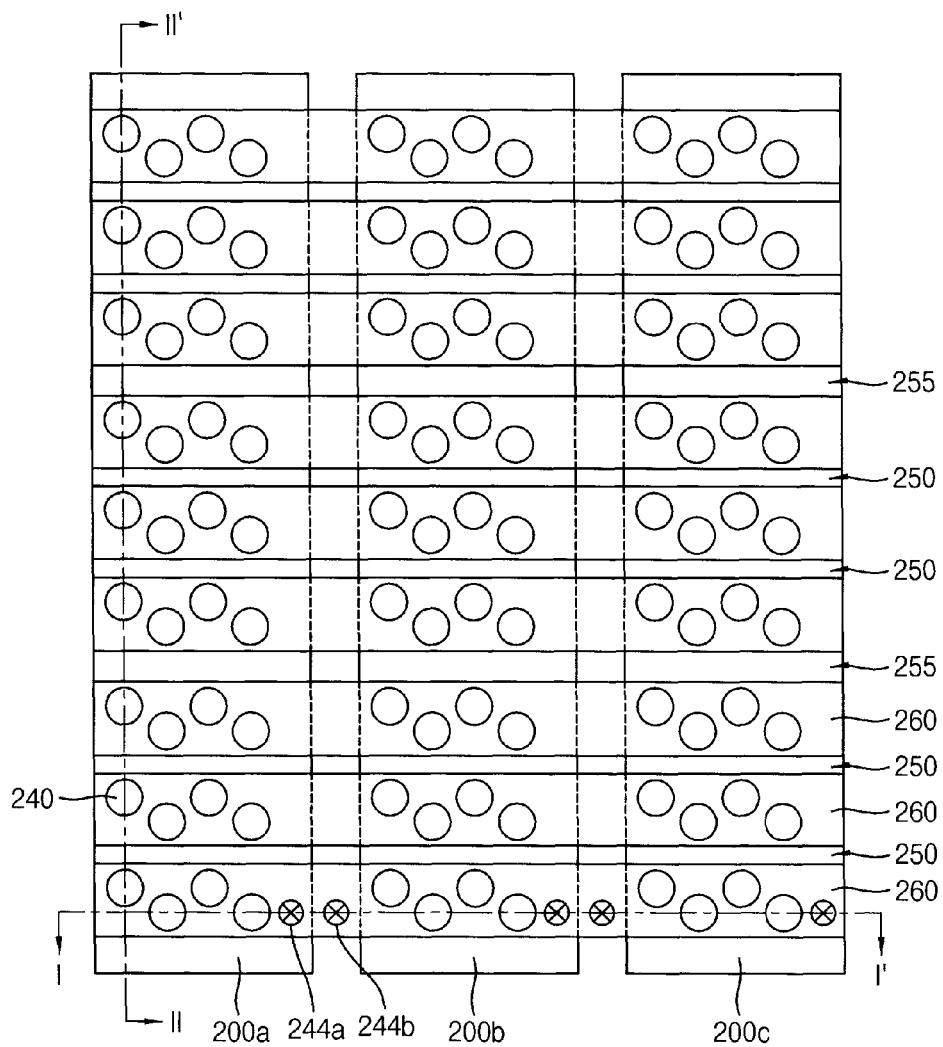

Various example embodiments will be described more fully hereinafter with reference to the accompanying drawings, in which some example embodiments are shown. The present inventive concept may, however, be embodied in many different forms and should not be construed as limited to the example embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, or "contacting" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Terms such as "same," "planar," "coplanar," or "equal" as used herein when referring to or comparing orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments of the present inventive concepts are described in detail with reference to the accompanying figures.

Figure 2:
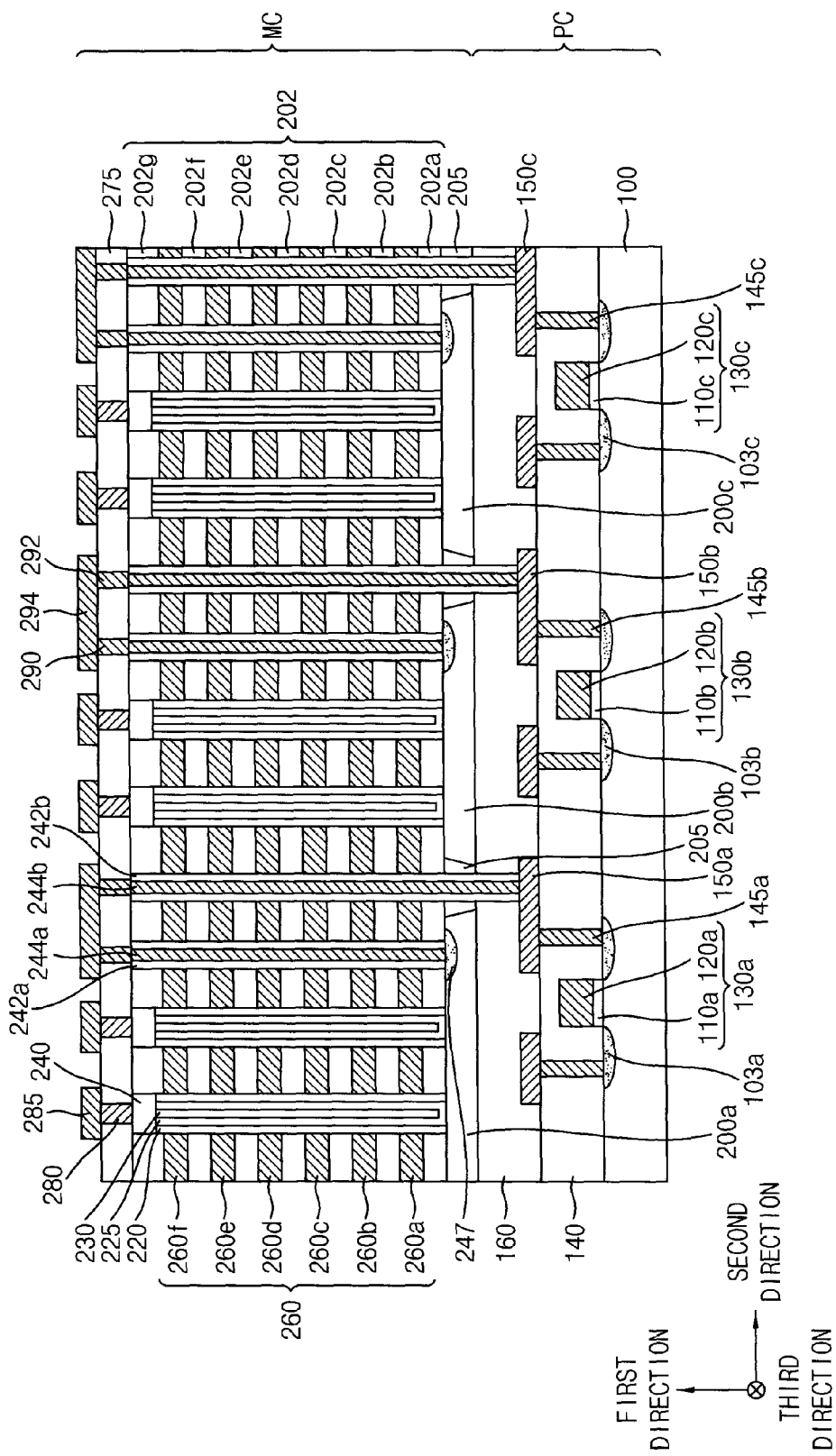
Figure 3:
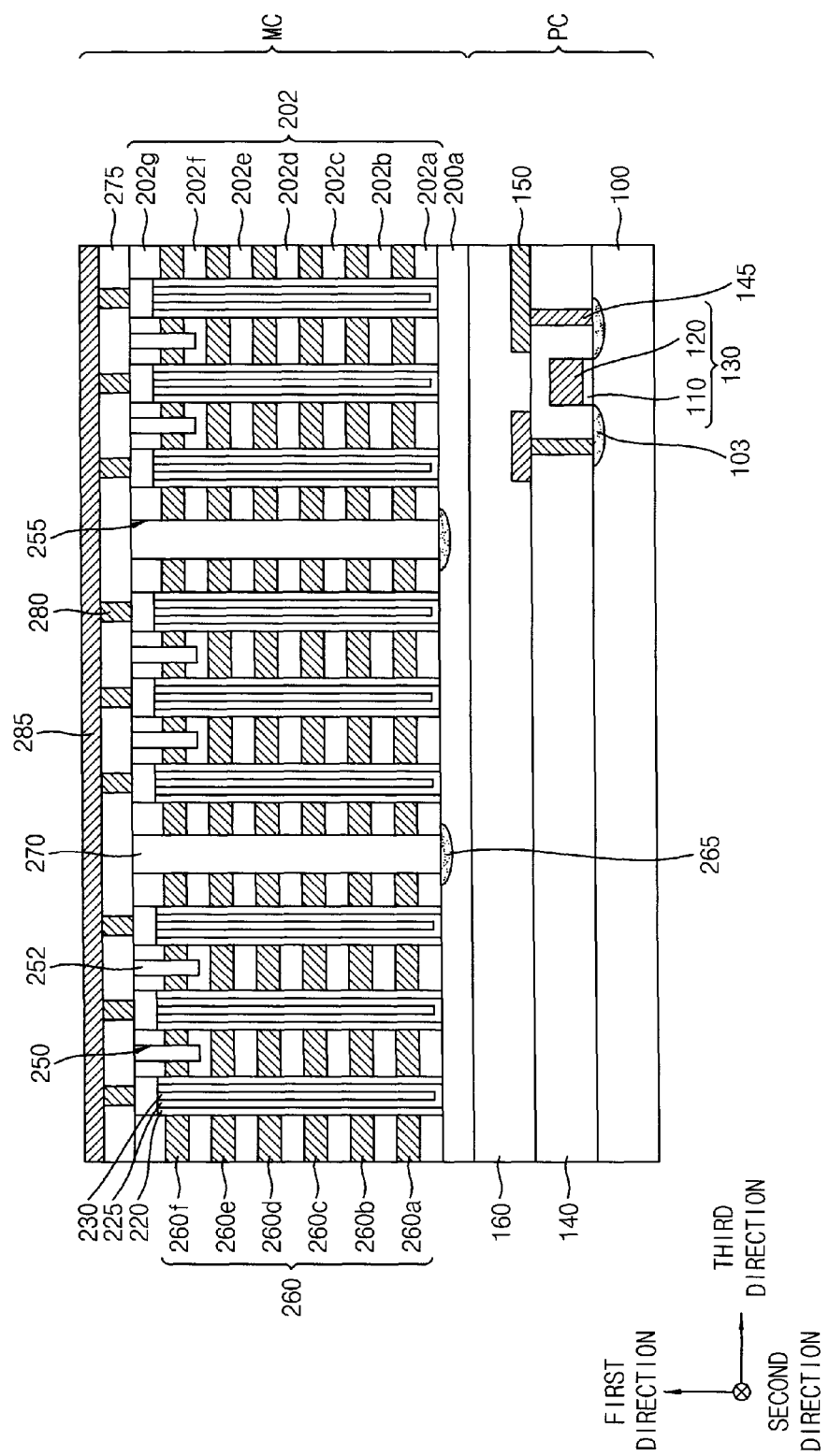

FIG. 1 is a top plan view illustrating a semiconductor device in accordance with example embodiments. FIGS. 2 and 3 are cross-sectional views taken along lines I-I' and II-II' of FIG. 1, respectively.

As used herein, a semiconductor device may refer to any of the various devices such as shown in exemplary figures, and may also refer, for example, to a device such as a semiconductor chip (e.g., memory chip and/or logic chip formed on a die), a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include memory devices such as volatile or non-volatile memory devices.

An electronic device, as used herein, may refer to these semiconductor devices, but may additionally include products that include these devices, such as a memory module, memory card, hard drive including additional components, or a mobile phone, laptop, tablet, desktop, camera, or other consumer electronic device, etc.

In example embodiments, the semiconductor device may be a non-volatile memory device. For example, the semiconductor device may have a cell-over-peri (COP) structure in which a memory cell structure is stacked on a peripheral circuit. The memory cell structure may have a vertical memory device structure including a channel extending vertically with respect to a top surface of a substrate.

In the figures cited in this specification, a direction substantially vertical to the top surface of the substrate is referred to as a first direction, and two directions substantially parallel to the top surface of the substrate and crossing each other are referred to as a second direction and a third direction. For example, the second and third directions may be perpendicular to each other. Additionally, a direction indicated by an arrow in the figures and a reverse direction thereof are considered as the same direction.

For a convenience of descriptions, some elements of the semiconductor device are omitted in FIG. 1. For example, FIG. 1 illustrates base layer patterns 200a, 200b and 200c, a pad 240, a gate line 260, an upper gate line cut region 250, a gate line cut region 255, a first connecting contact 244a and a second connecting contact 244b.

Referring to FIGS. 1 to 3, the semiconductor device may include a peripheral circuit structure (PC) and a memory cell structure (MC) stacked thereon.

The peripheral circuit structure PC may include, e.g., a transistor including a gate structure 130 and a source/drain region 103 formed on a substrate 100, lower insulation layers 140 and 160, a lower contact 145, and a lower wiring 150.

The substrate 100 may include a semiconductor material, e.g., single crystalline silicon or a single crystalline germanium.

For example, first to third gate structures 130a, 130b and 130c may be disposed on the substrate 100, and first to third source/drain regions 103a, 103b and 103c may be formed at upper portions of the substrate 100 adjacent to the first to third gate structures 130a, 130b and 130c, respectively.

The gate structure 130 may include a gate insulation layer pattern 110 and a gate electrode 120. The first gate structure 130a may include a first gate insulation layer pattern 110a and a first gate electrode 120a, the second gate structure 130b may include a second gate insulation layer pattern 110b and a second gate electrode 120b, and the third gate structure 130c may include a third gate insulation layer pattern 110c and a third gate electrode 120c.

Accordingly, first to third transistors may be disposed on the substrate 100.

The gate insulation layer pattern 110 may include, e.g., silicon oxide or a metal oxide. The gate electrode 120 may include, e.g., a metal, a metal nitride or doped polysilicon. The source/drain region 103 may include n-type or p-type impurities.

A first lower insulation layer 140 may be formed on the substrate 100 to cover the first to third transistors, and the lower contact 145 may extend through the first lower insulation layer 140 to be electrically connected to the source/drain region 103. First to third lower contacts 145a, 145b and 145c may contact with the first to third source/drain regions 103a, 103b and 103c, respectively.

The lower wiring 150 may be disposed on the first lower insulation layer 140 and may be electrically connected to the lower contact 145. First to third lower wirings 150a, 150b and 150c may be electrically connected to the first to third lower contacts 145a, 145b and 145c, respectively. A second lower insulation layer 160 may be formed on the first lower insulation layer 140 to cover the lower wiring 150.

The first and second lower insulation layers 140 and 160 may include an insulating material, e.g., silicon oxide. The lower contact 145 and the lower wiring 150 may include, e.g., a metal, a metal nitride or dope polysilicon.

The memory cell structure MC may include first to third base layer patterns 200a, 200b and 200c, a channel 225, the gate line 260, a bit line 285 and a connecting wiring 294.

The first to third base layer patterns 200a, 200b and 200c may extend in the third direction, and may be physically separated along the second direction by a separation layer pattern 205. FIGS. 1 to 3 illustrate three base layer patterns 200a, 200b and 200c, however, the number of the base layer patterns is not be specifically limited herein.

The base layer patterns 200a, 200b and 200c may include polysilicon or single crystalline silicon. In some embodiments, the base layer patterns 200a, 200b and 200c may further include p-type impurities such as boron (B). In this case, the base layer patterns 200a, 200b and 200c may serve as a p-type well.

The separation layer pattern 205 may extend linearly in the third direction. The base layer patterns 200a, 200b and 200c may be physically separated by the separation layer pattern 205. The separation layer pattern 205 may include an insulation layer pattern, e.g., silicon oxide.

The channel 225 may be disposed on the base layer patterns 200a, 200b and 200c, and may extend in the first direction from top surfaces of the base layer patterns 200a, 200b and 200c. The channel 225 may have a hollow cylindrical shape or a cup shape. The channel may include polysilicon or single crystalline silicon, and may include an impurity region doped with, e.g. p-type impurities such as boron.

A plurality of the channels 225 may be arranged in the second direction to form a channel row, and a plurality of the channel rows may be arranged in the third direction. In example embodiments, the channels 225 included in the neighboring channel rows may be arranged in a zigzag arrangement. Thus, a density of the channels 225 in a unit area of the base layer pattern 200a, 200b and 200c may be increased.

A filling layer pattern 230 may be formed in an inner space of the channel 225. The filling layer pattern 230 may have a pillar shape or a solid cylindrical shape. The filling layer pattern 230 may include an insulation layer pattern, e.g., silicon oxide.

In one embodiment, the channel 225 may have a pillar shape or a solid cylindrical shape. In this case, the filling layer pattern 230 may be omitted.

A dielectric layer structure 220 may be formed on an outer sidewall of the channel 225. The dielectric layer structure 220 may have a cup shape of which a central bottom is opened, or a straw shape.

The dielectric layer structure 220 may include a tunnel insulation layer, a charge storage layer and a blocking layer which may be sequentially stacked from the outer sidewall of the channel 225. The blocking layer may include silicon oxide or a metal oxide such as hafnium oxide or aluminum oxide. The charge storage layer may include a nitride such as silicon nitride or a metal oxide, and the tunnel insulation layer may include an oxide such as silicon oxide. For example, the dielectric layer structure 220 may have an oxide-nitride-oxide (ONO) layers-stacked structure.

In some embodiments, a semiconductor pattern (not illustrated) may be interposed between a bottom of the channel 225 and the top surface of the base layer pattern 200a, 200b and 200c. In this case, the dielectric layer structure 220 may be disposed on a peripheral portion of a top surface of the semiconductor pattern. The semiconductor pattern may include, e.g., single crystalline silicon or polysilicon.

The pad 240 may be formed on the filling layer pattern 230, the channel 225 and the dielectric layer structure 220. For example, the filling layer pattern 230, the channel 225 and the dielectric layer structure 220 may be capped or closed by the pad 240. The pad 240 may include a polysilicon or single crystalline silicon. The pad 240 may further include n-type impurities, for example, phosphorus (P) or arsenic (As).

As illustrated in FIG. 1, a plurality of the pads 240 may be arranged in the second direction to form a pad row substantially comparable to the channel row. A plurality of the pad rows may be arranged in the third direction.

The gate lines 260 (e.g., 260a through 260f) may be disposed on an outer sidewall of the dielectric layer structure 220 and may be spaced apart from each other in the first direction. In example embodiments, each gate line 260 may surround the channels 225 included in at least one channel row and may extend in the second direction.

For example, as illustrated in FIGS. 1 to 3, the each gate line 260 may surround six channel rows, however, the number of the channel rows surrounded by the each gate line 260 is not specifically limited.

The gate line 260 may include a metal having a low electrical resistance and/or a nitride thereof. For example, the gate line 260 may include tungsten (W), tungsten nitride, titanium (Ti), titanium nitride, tantalum (Ta), tantalum nitride, platinum (Pt), or the like. In some embodiments, the gate line 260 may have a multi-layered structure including a barrier layer formed of a metal nitride and a metal layer.

For example, a lowermost gate line 260a may serve as a ground selection line (GSL). Four gate lines 260b, 260c, 260d and 260e on the GSL may serve as word lines. An uppermost gate line 260f on the word lines may serve as a string selection line (SSL).

In this case, the GSL, the word lines, and the SSL may be formed at a single level, four levels and a single level, respectively. However, the number of levels at which the GSL, the word line and the SSL are formed is not specifically limited. In some embodiments, the GSL and the SSL may be formed at two levels, respectively, and the word line may be formed at $2^n$ levels such as 4, 8 or 16 levels. The stacked number of the gate lines 260 may be determined in consideration of a circuit design and a degree of integration of the semiconductor device.

If the semiconductor pattern is interposed between the channel 225 and the base layer pattern 200a, 200b and 200c, the GSL 260a may surround an outer sidewall of the semiconductor pattern. In this case, a gate insulation layer (not illustrated) may be further formed between the GSL 260a and the semiconductor pattern.

Insulating interlayers 202 (e.g., 202a to 202g) may be disposed between the gate lines 260 neighboring the first direction. The insulating interlayers 202 may include a silicon oxide based material, e.g., silicon dioxide ($SiO_2$), silicon oxycarbide (SiOC) or silicon oxyfluoride (SiOF). The gate lines 260 may be insulated from each other along the first direction by the insulating interlayers 202.

The gate line cut region 255 may be formed through the gate lines 260 and the insulating interlayers 202 along the first direction. The gate line cut region 255 may be formed between some of the channel rows neighboring in the third direction. The gate line cut region 255 may have a trench shape or a ditch shape extending in the second direction.

In example embodiments, the gate line cut region 255 may intersect the gate lines 260 in a predetermined unit to define a gate line block. Hereinafter, a structure including the gate line block and the channel rows included in the gate line block is described as a cell block. For example, as illustrated in FIG. 1, six channel rows may be included in each cell block.

In example embodiments, the top surface of the base layer pattern 200*a*, 200*b* and 200*c* may be exposed through the gate line cut region 255. A gate line cut pattern 270 may be formed in the gate line cut region 255. The gate line cut pattern 270 may include an insulation material, e.g., silicon oxide.

A second impurity region 265 may be formed at an upper portion of the base layer pattern 200*a*, 200*b* and 200*c* exposed through the gate line cut region 255. The second impurity region 265 may extend in the second direction, and may serve as a common source line (CSL) of the semiconductor device. The second impurity region 265 may be cut or separated by the separation layer pattern 205 extending in the third direction.

In some embodiments, the second impurity region 265 may include n-type impurities such as P or As. A metal silicide pattern (not illustrated) such as a cobalt silicide pattern and/or a nickel silicide pattern may be further formed on the second impurity region 265.

In one embodiment, a CSL contact (not illustrated) may be further formed through the gate line cut pattern 270 to be in contact with the second impurity region 265.

The upper gate line cut region 250 may be formed between some of the channel rows included in the each cell block. The upper gate line cut region 250 may extend through the gate line 260 and the insulating interlayer 202 disposed at an upper portion of the memory cell structure MC. The upper gate line cut region 250 may have a trench shape or a ditch shape extending in the second direction.

An upper gate line cut pattern 252 may be formed in the upper gate line cut region 250. The upper gate line cut pattern 252 may include an insulation material, e.g., silicon oxide.

In example embodiments, the upper gate line cut region 250 or the upper gate line cut pattern 252 may be provided for a separation of the SSL in the each cell block. In this case, the upper gate line cut region 250 or the upper gate line cut pattern 252 may extend through an uppermost insulating interlayer 202*g* and the SSL 260*f*, and may extend partially through an insulating interlayer 202*f* directly under the SSL 260*f*.

In example embodiments, a signal or a voltage may be transferred from the peripheral circuit to each of the base layer patterns 200*a*, 200*b* and 200*c* through a connecting contact. The connecting contact may include the first connecting contact 244*a* and the second connecting contact 244*b*. The first connecting contact 244*a* may be in contact with or electrically connected to a first impurity region 247 formed at an upper portion of the base layer pattern 200*a*, 200*b* and 200*c*. The second connecting contact 244*b* may be in contact with or electrically connected to the lower wiring 150 included in the peripheral circuit structure PC.

The first connecting contact 244*a* may extend through the gate lines 260 and the insulating interlayers 202 to make contact with the first impurity region 247. As illustrated in FIGS. 1 and 2, one first connecting contact 244*a* may be provided for each of the base layer patterns 200*a*, 200*b* and 200*c* to apply the voltage thereto.

In example embodiments, the first impurity region 247 may include p-type impurities such as boron. Thus, a functional characteristic of the base layer pattern 200*a*, 200*b* and 200*c* as the p-type well may be enhanced.

The second connecting contact 244*b* may extend through the gate lines 260, the insulating interlayers 202, the separation layer pattern 205 and the second lower insulation layer 160 to be electrically connected to the lower wiring 150. In example embodiments, one second connecting contact 244*b* may be provided for each of the base layer patterns 200*a*, 200*b* and 200*c* to transfer the signal or the voltage from the transistor included in the peripheral circuit structure PC to the base layer pattern 200*a*, 200*b* and 200*c*.

The first and second connecting contacts 244*a* and 244*b* may include a conductive material, e.g., a metal or a metal nitride.

A first insulation layer pattern 242*a* and a second insulation layer pattern 242*b* may surround an outer sidewall of the first connecting contact 244*a* and the second connecting contact 244*b*, respectively. The first and second insulation layer patterns 242*a* and 242*b* may include an insulation material, e.g., silicon oxide.

An upper insulation layer 275 may be formed on the uppermost insulating interlayer 202*g*, the pad 240, the upper gate line cut pattern 252, the gate line cut pattern 270, the first connecting contact 244*a* and the second connecting contact 244*b*.

A bit line contact 280 may be formed through the upper insulation layer 275 to make contact with the pad 240. A plurality of the bit line contacts 280 may be formed to define an array comparable to an arrangement of the channels 225 or the pads 240.

A first plug 290 and a second plug 292 may be formed through the upper insulation layer 275 to make contact with the first connecting contact 244*a* and the second connecting contact 244*b*, respectively.

The bit line 285 may be disposed on the upper insulation layer 275 to be electrically connected to the bit line contact 280. For example, the bit line 285 may extend in the third direction to be electrically connected to a plurality of the bit line contacts 280. The bit line 285 and the separation layer pattern 205 may extend in substantially the same direction.

The connecting wiring 294 may be disposed on the upper insulation layer 275 to electrically connect the first and second plugs 290 and 292 to each other. Thus, the first and second connecting contacts 244*a* and 244*b* may be electrically connected to each other via the connecting wiring 294. Accordingly, the base layer pattern 200*a*, 200*b* and 200*c*, and the transistor of the peripheral circuit structure PC may be electrically connected so that an electrical operation therebetween may be achieved.

In example embodiments, the connection wiring 294 may be provided for each of the base layer patterns 200*a*, 200*b* and 200*c*. Thus, the signal or the voltage may be applied from the first, second and third transistors to the first, second and third base layer patterns 200*a*, 200*b* and 200*c*, respectively. Certain of the wirings, plugs, and/or contacts described herein may also be referred to as terminals, or conductive terminals.

According to example embodiments described above, the base layer may be physically separated by the separation layer pattern 205. Thus, the first to third base layer patterns 200*a*, 200*b* and 200*c* capable of being operated independently or individually may be obtained.

As described above, the gate lines 260 may be cut or separated by the gate line cut pattern 270 such that the cell block extending in the second direction may be defined. The cell block may be further segmented by the separation layer pattern 205 extending in the third direction such that sub-cell blocks may be defined. For example, as illustrated in FIGS. 1 to 3, nine sub-cell blocks may be formed by two gate line cut patterns 270 and two separation layer patterns 205.

The CSL (e.g., the second impurity region 265) may be cut or separated by the separation layer pattern 205. In this case, the sub-cell block may have an island shape defined by two CSLs and the two separation layer patterns 205.

The cell block may be further segmented or divided by the separation layer pattern 205, and thus signal interference or disturbance occurring when a dimension or a size of the cell block becomes increased may be prevented. Therefore, an operational reliability of the semiconductor device may be improved.

If one mat of the semiconductor device is formed as a single base layer, only a single value of the voltage may be provided into the base layer. For example, a predetermined erase voltage (Vers) may be provided into a whole area of the base layer for an erase operation.

However, according to example embodiments, the base layer may be physically divided by the separation layer pattern 205 into, e.g., the first to third base layer patterns 200a, 200b and 200c. In this case, different values or different types of voltages may be provided independently into the respective base layer patterns 200a, 200b and 200c.

Figure 4:
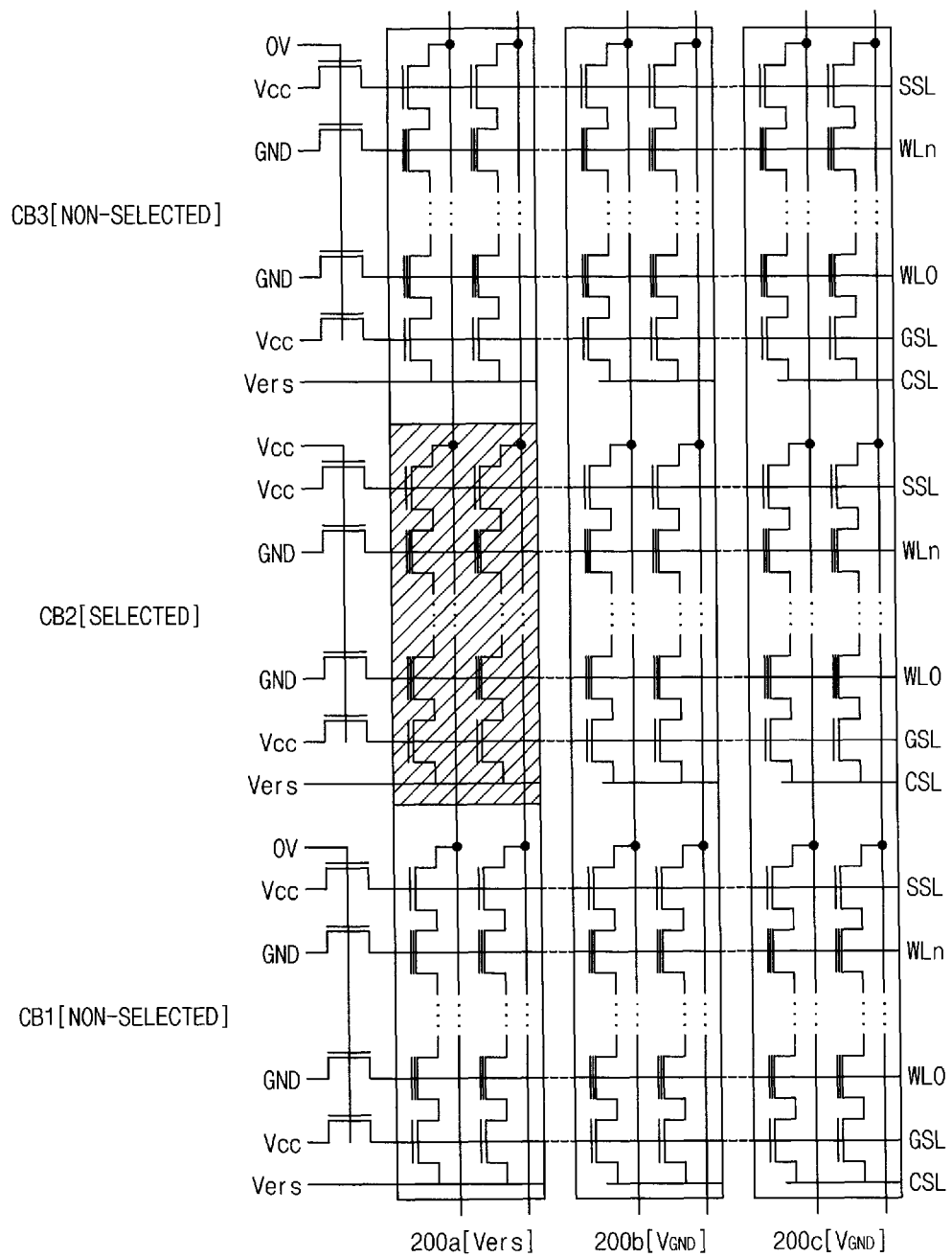

FIG. 4 is a circuit diagram illustrating an operation of a semiconductor device in accordance with example embodiments.

Referring to FIG. 4, to induce an erase operation only at one sub-cell block included in a first base layer pattern 200a, a predetermined erase voltage Vers may be applied to the first base layer pattern 200a, and ground voltages $V_{GND}$ may be applied to the second and third base layer patterns 200b and 200c.

Different voltages may be applied to cell blocks separated by CSLs. For example, first, second and third cell blocks CB1, CB2 and CB3 may be defined by the CSLs. A zero voltage (0V) may be applied to each of the first cell block CB1 and the third cell block CB3. A predetermined power voltage (Vcc) may be applied to the second cell block CB2 from a collector. Thus, the second cell block CB2 may be selected from the cell blocks CB1, CB2 and CB3 for the erase operation.

As described above, the first base layer pattern 200a and the second cell block CB2 may be selected. Accordingly, the sub-cell block indicated by diagonal lines may be only selected for the erase operation.

FIGS. 5 to 23B are top plan views and cross-sectional views illustrating a method of manufacturing a semiconductor device in accordance with example embodiments. For example, FIGS. 5 to 23B illustrate a method of manufacturing a semiconductor device of FIGS. 1 to 3.

Specifically, FIGS. 9A, 11A, 15A, 16A, 17A, 18A, 19A and 22A are top plan views illustrating the method of manufacturing the semiconductor device. FIGS. 5 to 8, 9B, 10, 11B, 12 to 14, 15B, 16B, 17B, 20A, 21A and 23A are cross-sectional views taken along a line I-I' indicated in FIG. 1 along the first direction. FIGS. 18B, 19B, 20B, 21B, 22B and 23B are cross-sectional views taken along a line II-IF indicated in FIG. 1 along the first direction.

Figure 5:
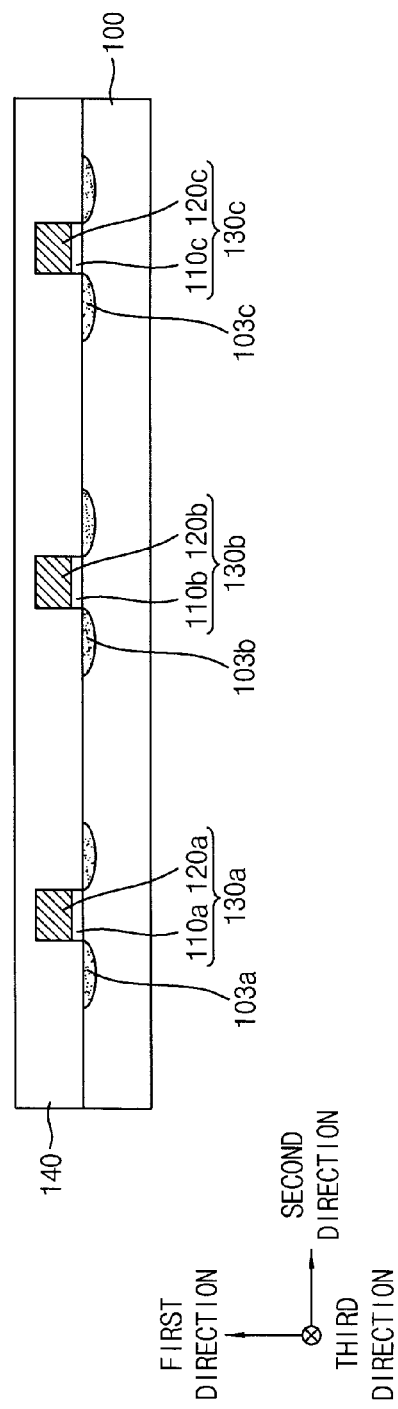

Referring to FIG. 5, gate structures 130 (e.g., 130a, 130b, 130c) and source/drain regions 103 (e.g., 103a, 103b, 103c) may be formed on a substrate 100.

A semiconductor substrate including single crystalline silicon and/or single crystalline germanium may be used as the substrate 100. For example, the substrate 100 may be obtained from a silicon wafer.

A gate insulation layer and a gate electrode layer may be formed on the substrate 100, and then may be etched to form a gate insulation layer pattern 110 and a gate electrode 120. Thus, the gate structure 130 including the gate insulation layer pattern 110 and the gate electrode 120 sequentially stacked on the substrate 100 may be formed.

For example, first to third gate insulation layer patterns 110a, 110, and 110c, and first to third gate electrodes 120a, 120b and 120c may be formed. Accordingly, first to third gate structures 130a, 130b and 130c may be formed.

An ion-implantation process may be performed using the gate structure 130 as an implantation mask to form the source/drain region 103 at an upper portion of the substrate 100 adjacent to the gate structure 130. Accordingly, first to third source/drain regions 103a, 103b and 103c may be formed at the upper portions of the substrate 100 adjacent to the first to third gate structures 130a, 130b and 130c, respectively. Thus, first to third transistors may be formed on the substrate 100.

The gate insulation layer may be formed using silicon oxide or a metal oxide by a chemical vapor deposition (CVD) process, a plasma enhanced chemical vapor deposition (PECVD) process, a spin coating process, an atomic layer deposition (ALD) process, etc. Alternatively, the gate insulation layer may be formed by a thermal oxidation process on a top surface of the substrate 100. The gate electrode layer may be formed using a metal, a metal nitride or doped polysilicon by, e.g., an ALD process or a sputtering process.

A first lower insulation layer 140 covering the gate structures 130 may be formed on the substrate 100.

Figure 6:
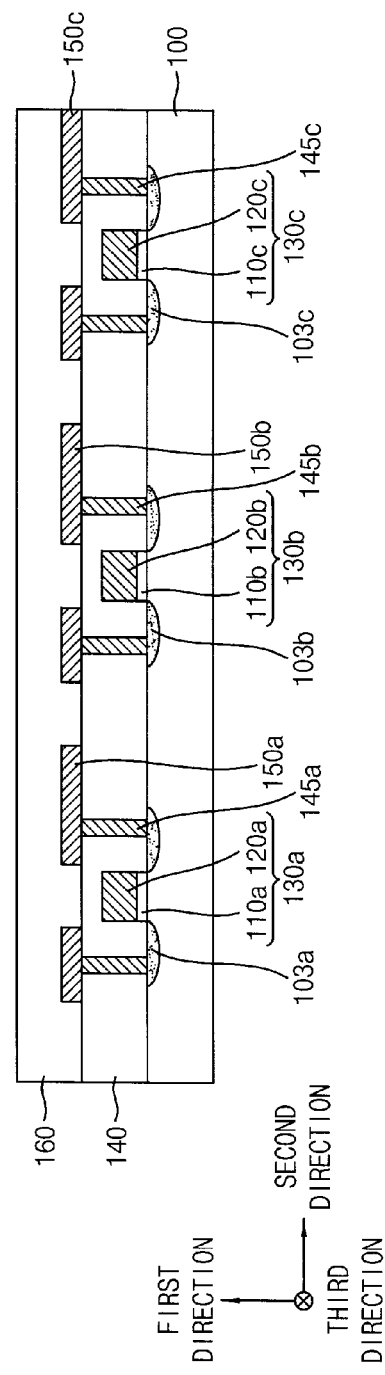

Referring to FIG. 6, a lower contact 145 may be formed through the first lower insulation layer 140 to be in contact with the source/drain region 103. Accordingly, first to third lower contacts 145a, 145b and 145c may be formed to be in contact with the first to third source/drain regions 103a, 103b and 103c, respectively.

A lower wiring 150 electrically connected to the lower contact 145 may be formed on the first lower insulation layer 140. Accordingly, first to third lower wirings 150a, 150b and 150c electrically connected to the first to third lower contacts 145a, 145b and 145c, respectively, may be formed.

A second lower insulation layer 160 covering the lower wirings 150 may be formed on the first lower insulation layer 140.

The first and second lower insulation layers 140 and 160 may be formed using an insulating material, e.g., silicon oxide by, e.g., a CVD process or a spin coating process. The lower contact 145 and the lower wiring 150 may be formed using a metal or a metal nitride by, e.g., an ALD process or a sputtering process.

FIG. 6 illustrates a single-leveled lower wiring, however, additional lower insulation layers and lower wirings may be stacked.

Figure 7:
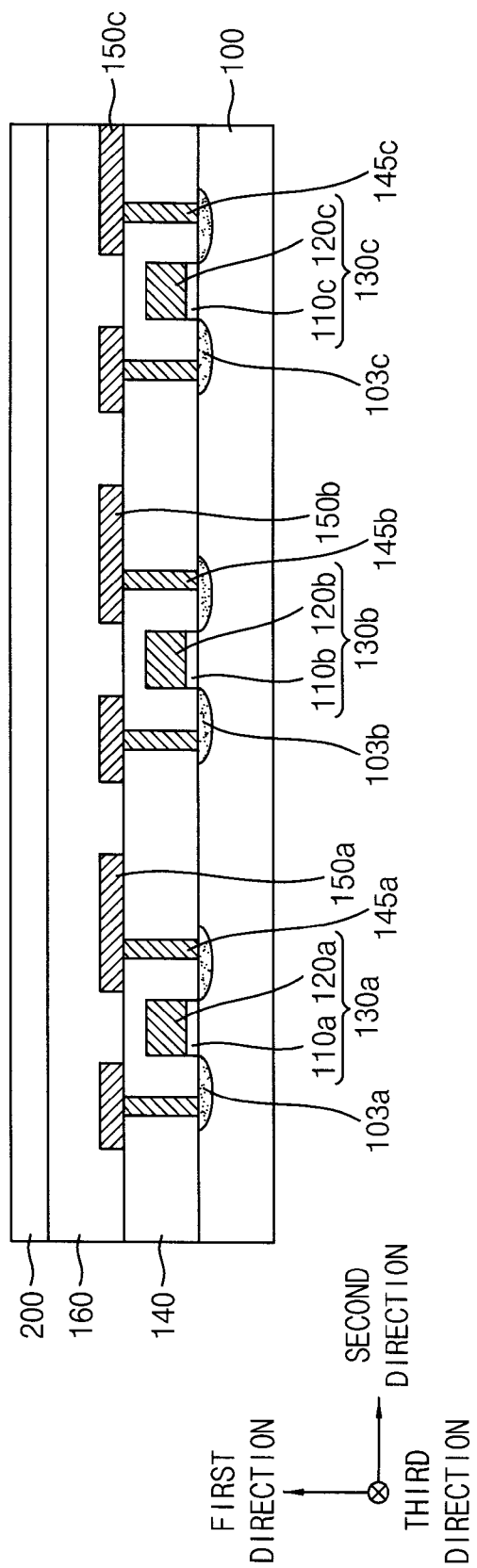

Referring to FIG. 7, a base layer 200 may be formed on the second lower insulation layer 160.

In some embodiments, the base layer 200 may be formed using polysilicon by a sputtering process, a CVD process, an ALD process, a physical vapor deposition (PVD) process, etc. The base layer 200 may be formed using polysilicon doped with, e.g., p-type impurities. In this case, the base layer 200 may serve as a p-type well.

In some embodiments, an amorphous silicon layer may be formed on the second lower insulation layer 160, and then a thermal treatment or a laser irradiation may be performed to transform the amorphous silicon layer into the base layer 200 including single crystalline silicon. In this case, defects in the base layer 200 may be cured so that a functional characteristic of the base layer 200 as the p-type well may be enhanced.

In some embodiments, the base layer 200 may be formed by a wafer bonding process. In this case, a wafer (e.g., a single crystalline silicon wafer) may be attached on the second lower insulation layer 160. An upper portion of the wafer may be removed or planarized to form the base layer 200.

Figure 8:
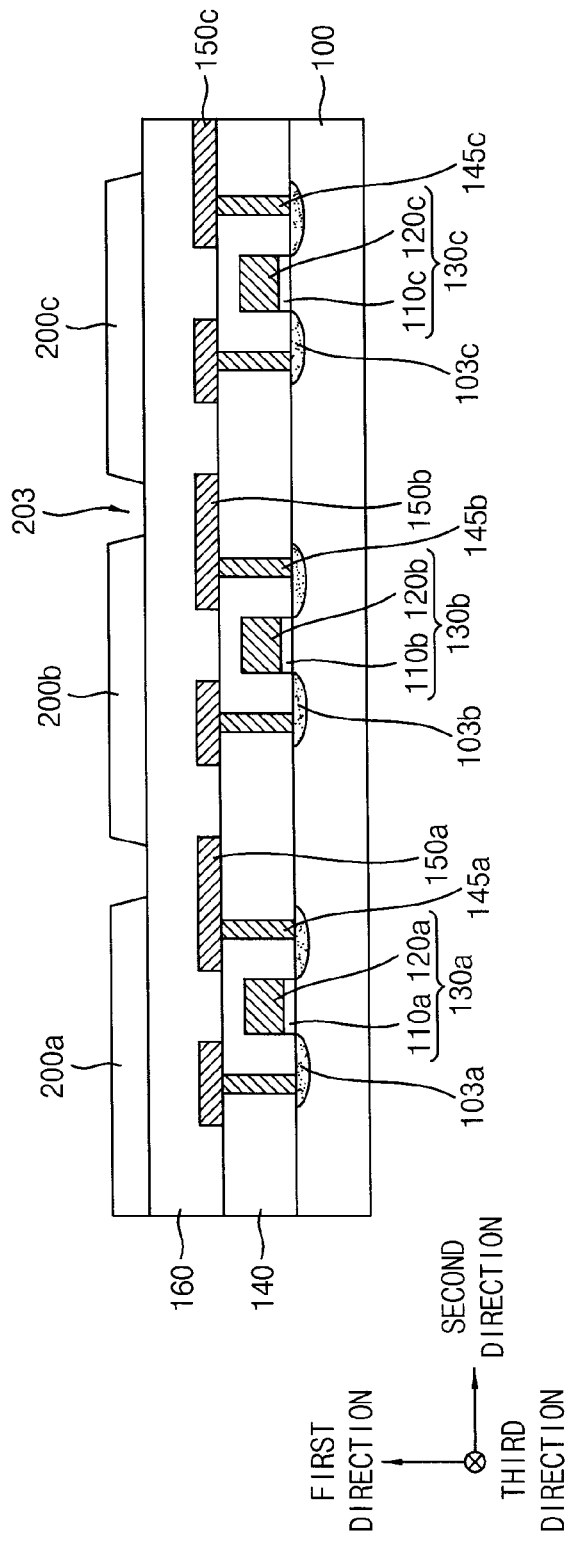

Referring to FIG. 8, the base layer 200 may be patterned to form base layer patterns 200a, 200b and 200c.

In example embodiments, a mask pattern (not illustrated) may be formed on the base layer 200 using, e.g., a photoresist material. The base layer 200 may be partially etched using the mask pattern to form an opening 203. The opening 203 may have a trench shape or a ditch shape extending in the third direction, and a plurality of the openings 203 may be formed along the second direction. A top surface of the second lower insulation layer 160 may be exposed through the opening 203.

After the formation of the opening 203, first to third base layer pattern 200a, 200b and 200c may be formed. The first to third base layer patterns 200a, 200b and 200c may extend in the third direction.

The mask pattern may be removed by an ashing process and/or a strip process after the formation of the first to third base layer patterns 200a, 200b and 200c.

Figure 9A:
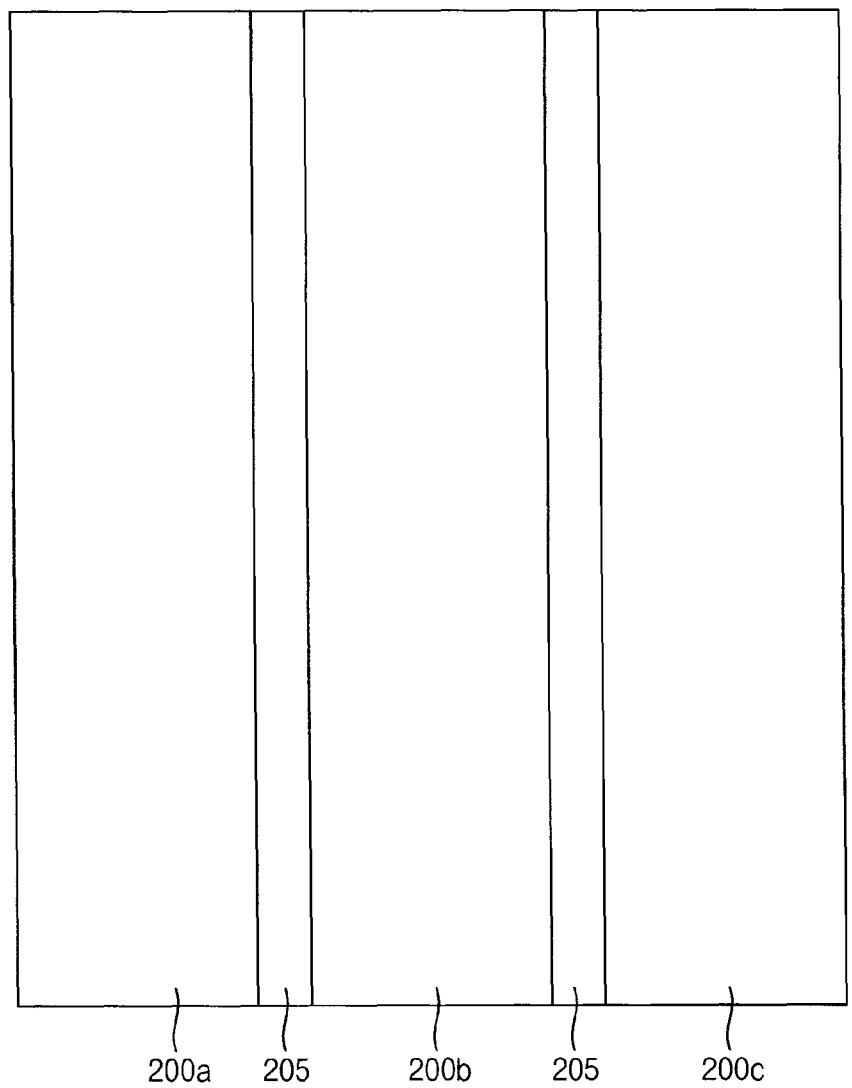
Figure 9B:
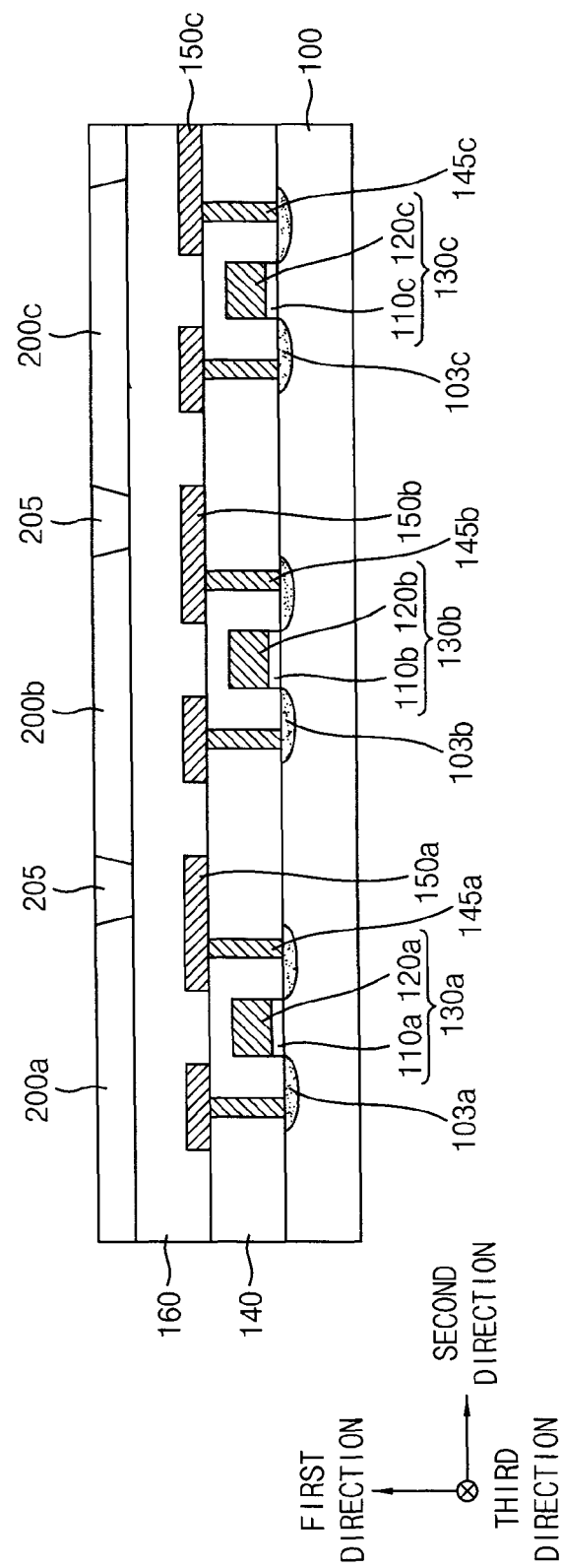

Referring to FIGS. 9A and 9B, a separation layer pattern 205 may be formed in the opening 203.

For example, a separation layer filling the openings 203 may be formed on the base layer patterns 200a, 200b and 200c, and on the exposed top surface of the second lower insulation layer 160. An upper portion of the separation layer may be planarized until top surfaces of the base layer patterns 200a, 200b and 200c are exposed to form the separation layer pattern 205. The planarization process may include a chemical mechanical polish (CMP) process or an etch-back process.

The separation layer pattern 205 may extend linearly in the third direction. The separation layer may be formed using an insulation material, e.g., silicon oxide by a CVD process, a spin coating process, etc.

Figure 10:
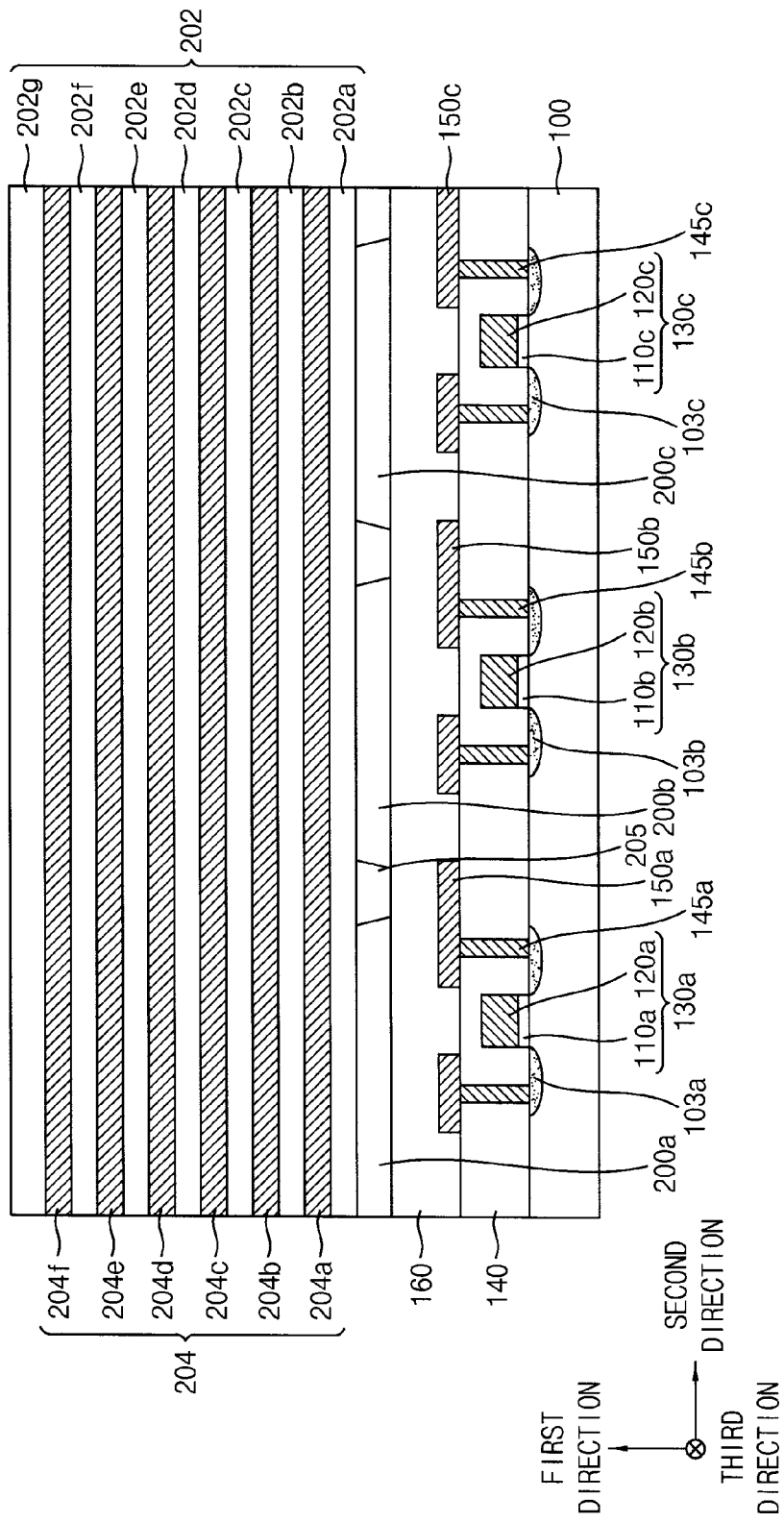

Referring to FIG. 10, insulating interlayers 202 (e.g., 202a through 202g) and sacrificial layers (e.g., 204a through 204f) may be formed alternately and repeatedly on the base layer patterns 200a, 200b and 200c, and on the separation layer patterns 205 to form a mold structure.

In example embodiments, the insulating interlayer 202 may be formed using a silicon oxide based material, e.g., silicon dioxide, silicon oxycarbide and/or silicon oxyfluoride. The sacrificial layer 204 may be formed using a material that may have an etching selectivity with respect to the insulating interlayer 202 and may be easily removed by a wet etching process. For example, the sacrificial layer 204 may be formed using a silicon nitride and/or silicon boronitride (SiBN).

The insulating interlayer 202 and the sacrificial layer 204 may be formed by a CVD process, a PECVD process, a spin coating process, an ALD process, etc. A lowermost insulating interlayer 202a may be substantially integral or unitary with the separation layer pattern 205. In an embodiment, the formation of the separation layer may be omitted, and the lowermost insulating interlayer 202a may fill the opening 203 and cover the base layer patterns 200a, 200b and 200c.

The sacrificial layers 204 may be removed in a subsequent process to provide spaces for a GSL, a word line and an SSL. For example, each of the GSL and the SSL may be formed at a single level, and the word line may be formed at 4 levels. In this case, the sacrificial layers 204 may be formed at 6 levels, and the insulating interlayers 202 may be formed at 7 levels as illustrated in FIG. 10. In some embodiments, each of the GSL and the SSL may be formed at 2 levels, and the word line may be formed at $2^n$ levels, e.g., 2, 8 or 16 levels. In this case, the sacrificial layers 204 may be formed at 6, 12 or 20 levels, and the insulating interlayers 202 may be formed at 7, 13 or 21 levels. However, the stacked number of the GSL, the SSL and the word lines may not be limited to the examples provided herein.

Figure 11A:
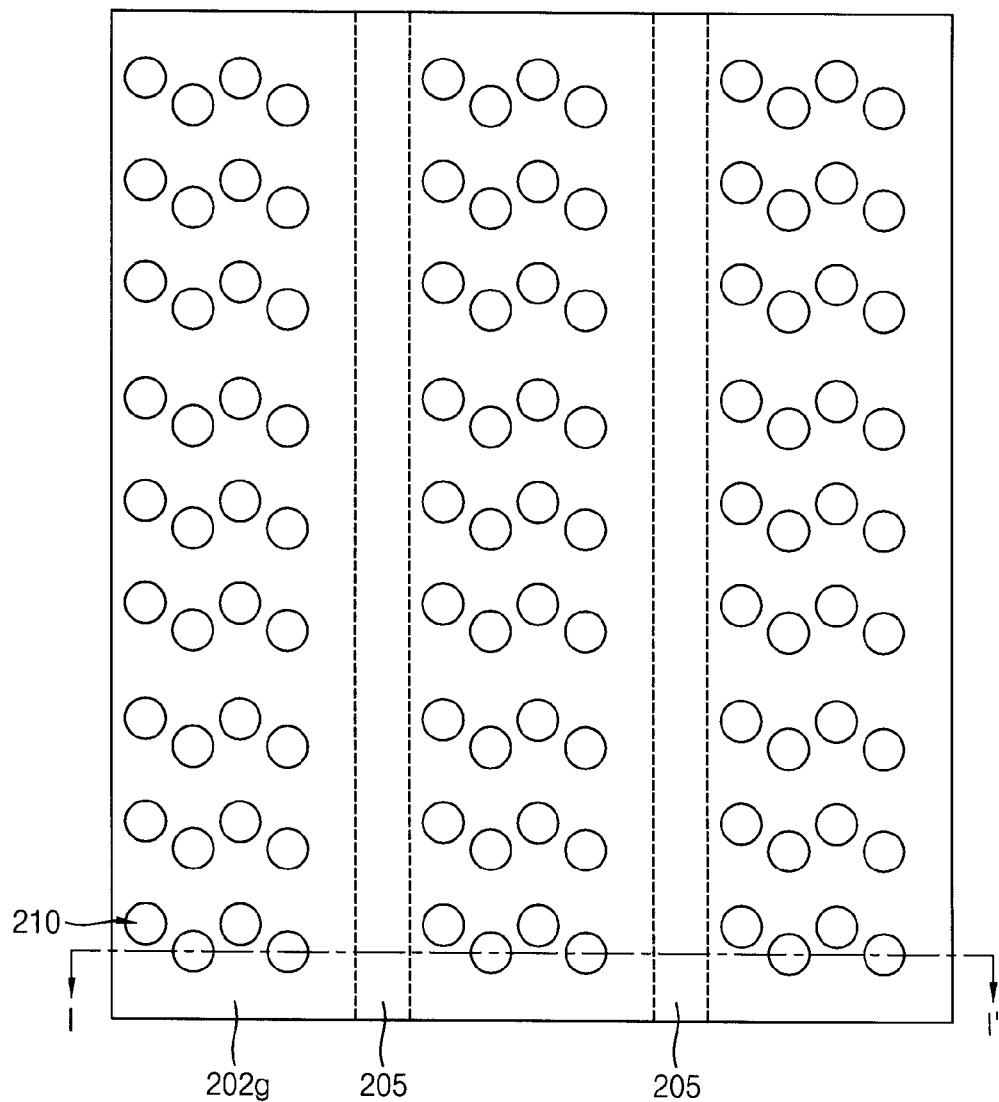
Figure 11B:
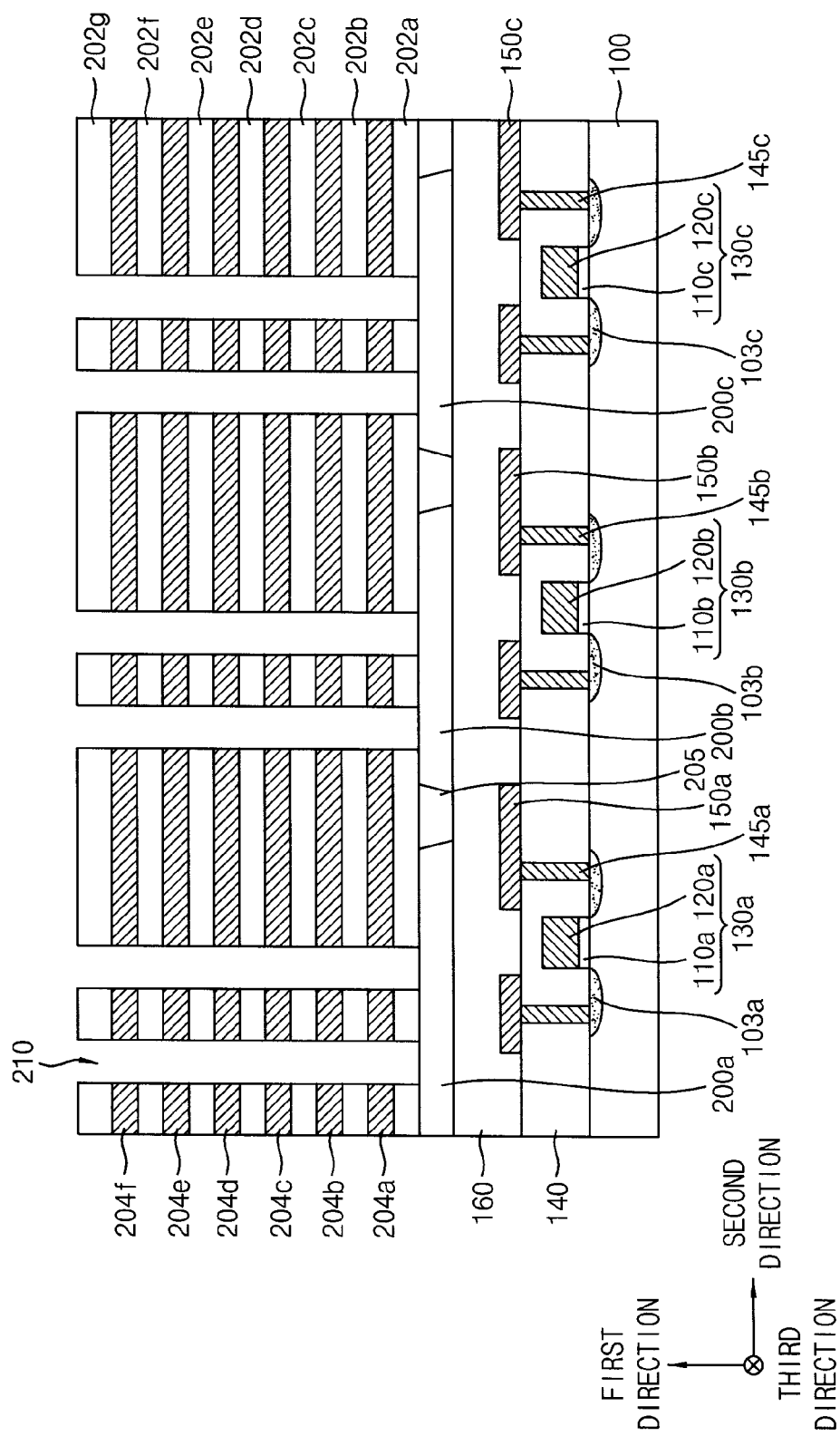

Referring to FIGS. 11A and 11B, a plurality of channel holes 210 may be formed through the mold structure.

In example embodiments, a hard mask (not illustrated) may be formed on an uppermost insulating interlayer 202g. The insulating interlayers 202 and the sacrificial layers 204 may be partially etched by performing, e.g., a dry etching process. The hard mask may be used as an etching mask to form the channel hole 210. Top surfaces of the base layer patterns 200a, 200b and 200c may be partially exposed through the channel holes 210. The channel hole 210 may extend in the first direction from the top surface of the base layer pattern 200a, 200b and 200c.

The hard mask may be formed using silicon-based or carbon-based spin-on hardmask (SOH) materials, and/or a photoresist material. The hard mask may be removed by an ashing process and/or a strip process after the formation of the channel hole 210.

In example embodiments, a plurality of the channel holes 210 may be formed along the second direction such that a channel hole row may be defined. A plurality of the channel hole rows may be formed along the third direction. The channel holes 210 included in the adjacent channel hole rows may face each other in a zigzag arrangement.

In one embodiment, an upper portion of the base layer pattern 200a, 200b and 200c may be partially removed during the etching process for the channel hole 210. In this case, the channel hole 210 may extend partially through the upper portion of the base layer pattern 200a, 200b and 200c.

Figure 12:
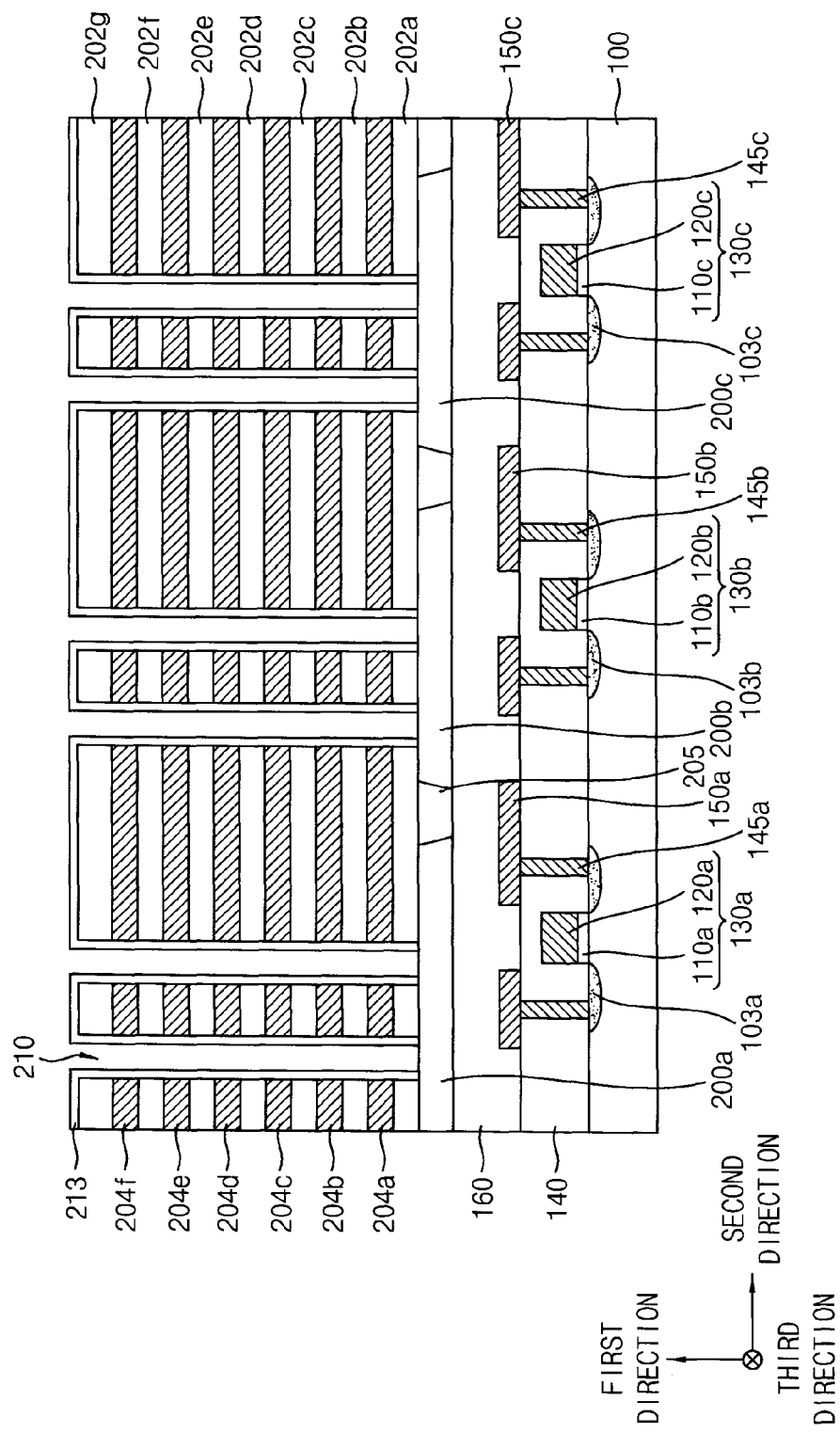

Referring to FIG. 12, a dielectric layer 213 may be formed conformally on the uppermost insulating interlayer 202g, and on sidewalls and bottoms of the channel holes 210. A portion of the dielectric layer 213 formed on the bottoms of the channel holes 210 may be partially removed by, e.g., an anisotropic etching process. Accordingly, the top surface of the base layer pattern 200a, 200b and 200c may be exposed through the channel holes 210 again.

In example embodiments, a blocking layer, a charge storage layer and a tunnel insulation layer may be sequentially formed to obtain the dielectric layer 213. For example, the blocking layer may be formed using an oxide, e.g., silicon oxide, the charge storage layer may be formed using silicon nitride or a metal oxide, and the tunnel insulation layer may be formed using an oxide, e.g., silicon oxide. In example embodiments, the dielectric layer 213 may have an oxide-nitride-oxide (ONO) layer structure. The blocking layer, the charge storage layer and the tunnel insulation layer may be formed by a CVD process, a PECVD process, an ALD process, s spin coating process, etc.

Figure 13:
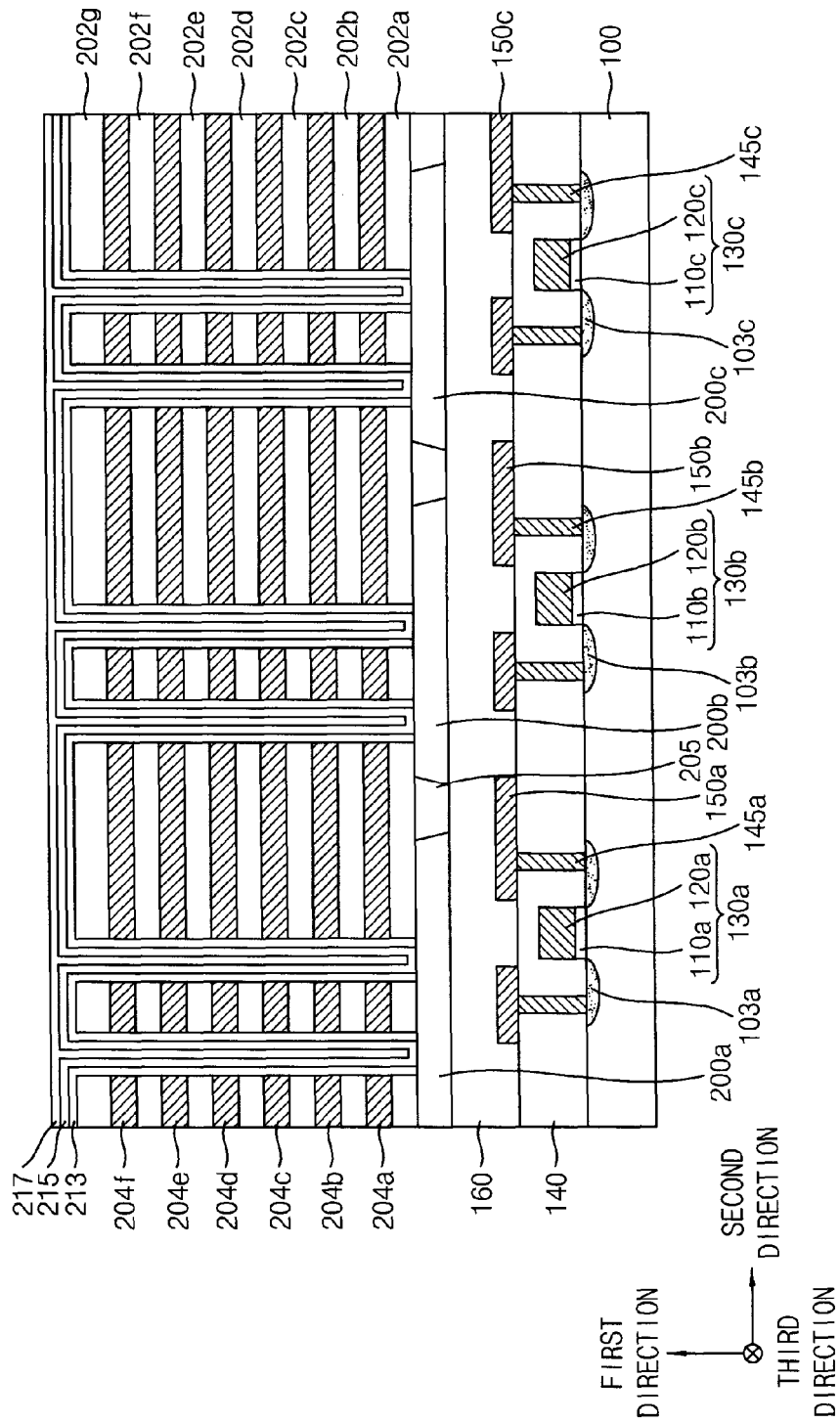

Referring to FIG. 13, a channel layer 215 may be formed on the dielectric layer 213 and the bottom of the channel hole 210, and a filling layer 217 filling a remaining portion of the channel hole 210 may be formed on the channel layer 215.

In example embodiments, the channel layer 215 may be formed using polysilicon or amorphous silicon optionally doped with impurities. In some embodiments, a heat treatment or a laser beam irradiation may be further performed on the channel layer 215. In this case, the channel layer 215 may include single crystalline silicon and defects therein may be cured. The filling layer 217 may be formed using an insulation material, e.g., silicon oxide or silicon nitride.

The channel layer 215 and the filling layer 217 may be formed by a CVD process, a PECVD process, a PVD process, an ALD process, etc.

Figure 14:
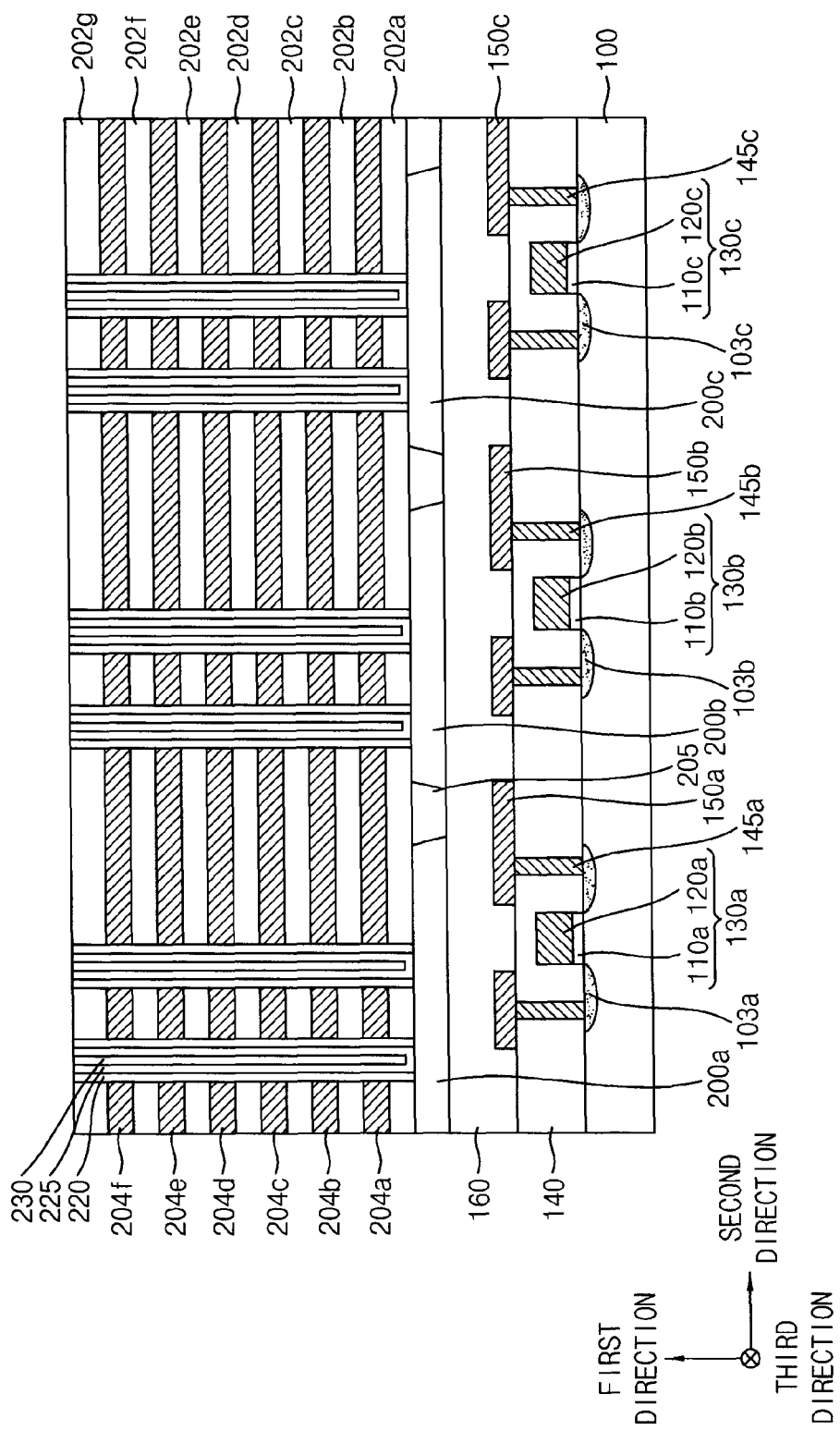

Referring to FIG. 14, upper portions of the filling layer 217, the channel layer 215, the dielectric layer 21 may be planarized until a top surface of the uppermost insulating interlayer 202g is exposed to form a dielectric layer structure 220, a channel 225 and a filling layer pattern 230 sequentially stacked in the channel hole 210. The planarization process may include an etch-back process or a CMP process.

In example embodiments, the dielectric layer structure 220 may have a substantially hollow cylindrical shape of which a central bottom is opened, or a straw shape. The channel 225 may have a substantially cup shape. The filling layer pattern 230 may have a substantially solid cylindrical shape or a substantially pillar shape.

In some embodiments, the channel layer 215 may sufficiently fill the channel hole, and the formation of the filling layer 217 may be omitted. In this case, the channel 225 may have a substantially solid cylindrical shape or a substantially pillar shape.

In some embodiments, a semiconductor pattern (not illustrated) may be further formed after the formation of the channel hole 210, and before the formations of the dielectric layer 213 and the channel layer 215. The semiconductor pattern may fill a lower portion of the channel hole 210. The semiconductor pattern may be formed by a selective epitaxial growth (SEG) process using the top surface of the base layer pattern 200a, 200b and 200c as a seed. Thus, the semiconductor pattern may include polysilicon or single crystalline silicon. Alternatively, an amorphous silicon layer filling the lower portion of the channel hole 210 may be formed, and then a laser epitaxial growth (LEG) process or a solid phase epitaxi (SPE) process may be performed thereon to form the semiconductor pattern. In this case, the dielectric layer structure 220 and the channel 225 may be formed on a top surface of the semiconductor pattern.

As the channel 225 is formed in each channel hole 210, a channel row may be formed substantially comparable to the channel hole row. In example embodiments, a plurality of the channels 225 may be arranged in the second direction to form the channel row, and a plurality of the channel rows may be arranged in the third direction. The channels 225 included in the different channel rows may be adjacent to each other in a zigzag arrangement.

Figure 15A:
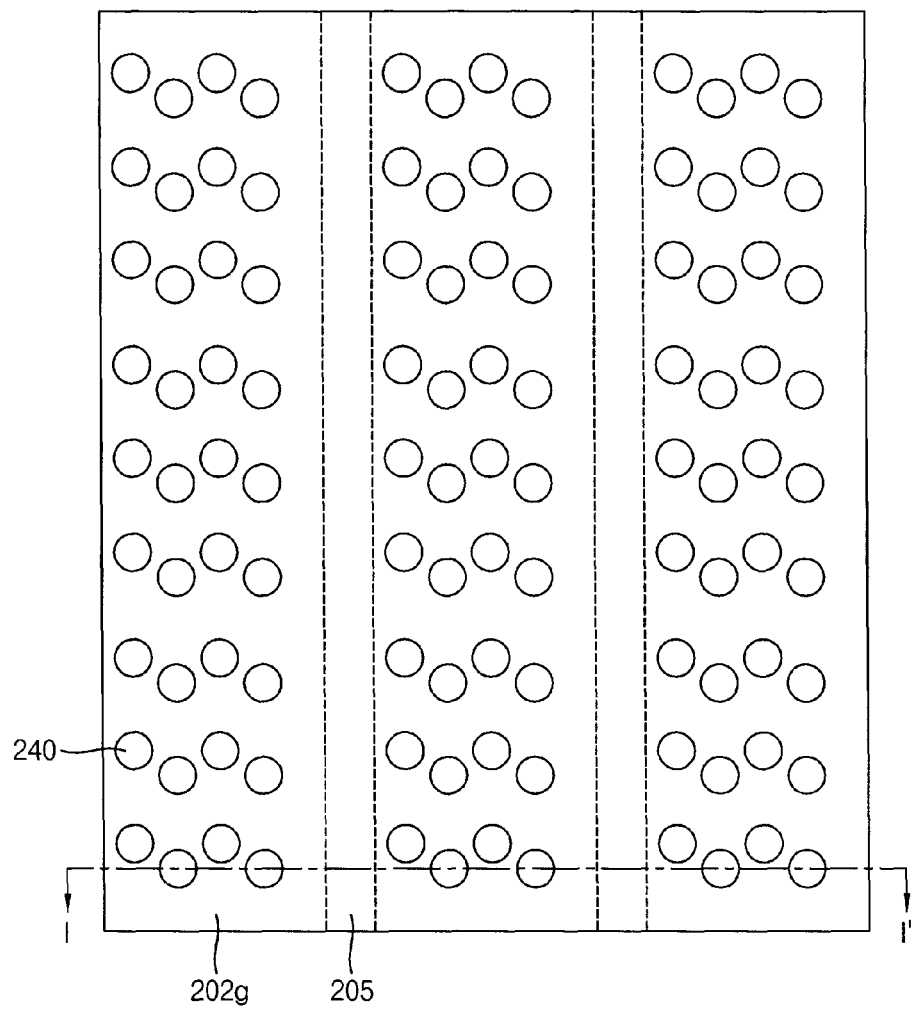
Figure 15B:
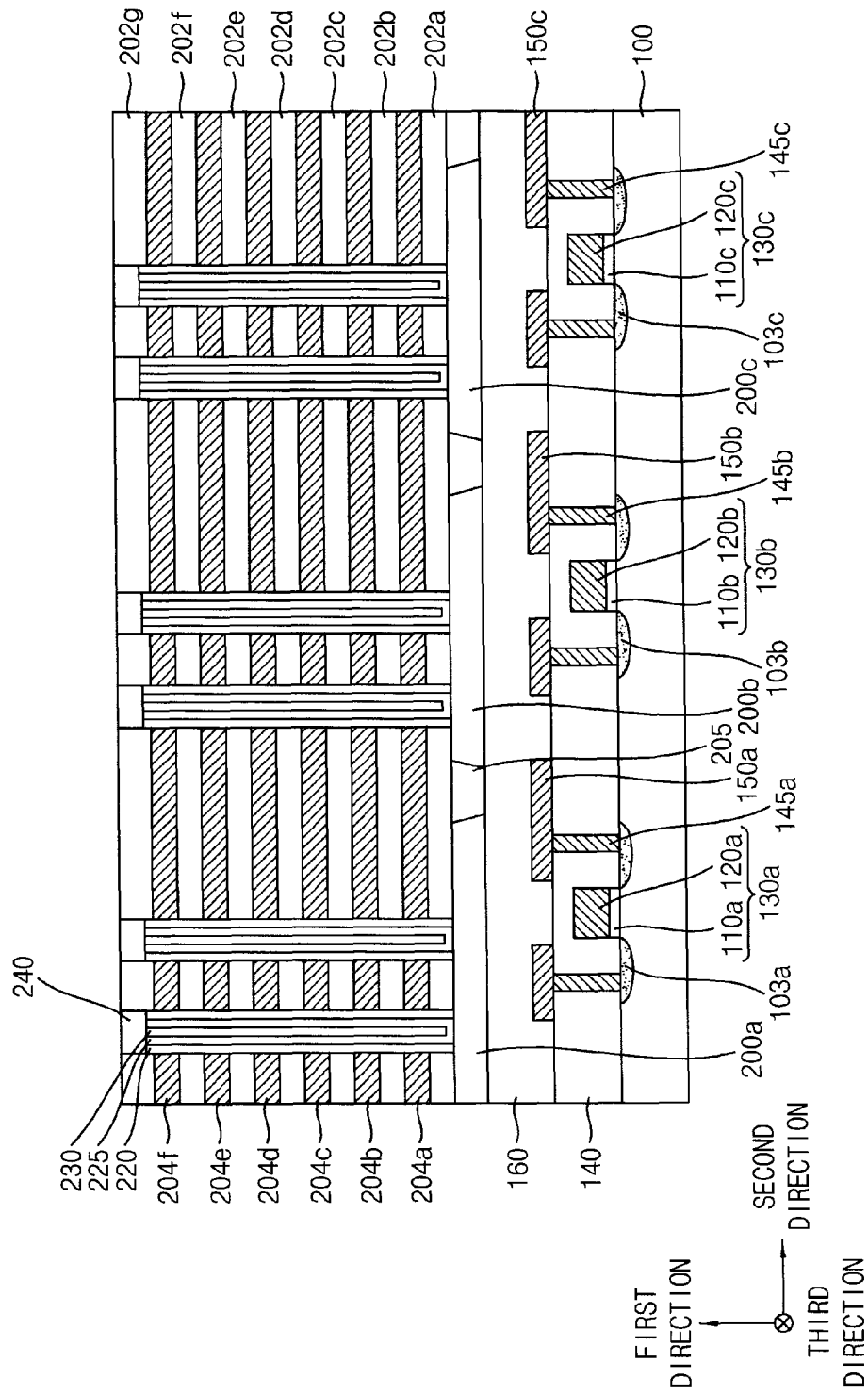

Referring to FIGS. 15A and 15B, a pad 240 filling an upper portion of the channel hole 210 may be formed.

In example embodiments, upper portions of the dielectric layer structure 220, the channel 225 and the filling layer pattern 230 may be partially removed by, e.g., an etch-back process to form a recess. A pad layer may be formed on the dielectric layer structure 220, the channel 225, the filling layer pattern 230 and the uppermost insulating interlayer 202g to sufficiently fill the recess. An upper portion of the pad layer may be planarized until the top surface of the uppermost insulating interlayer 202g is exposed to form the pad 240. In example embodiments, the pad layer may be formed using polysilicon optionally doped with n-type impurities. In some embodiments, a preliminary pad layer including amorphous silicon may be formed, and then a crystallization process may be performed thereon to form the pad layer. The planarization process may include a CMP process or the like.

As illustrated in FIG. 15A, a plurality of the pads 240 may define a pad row substantially comparable to the channel row, and a plurality of the pad rows may be arranged along the third direction.

Figure 16A:
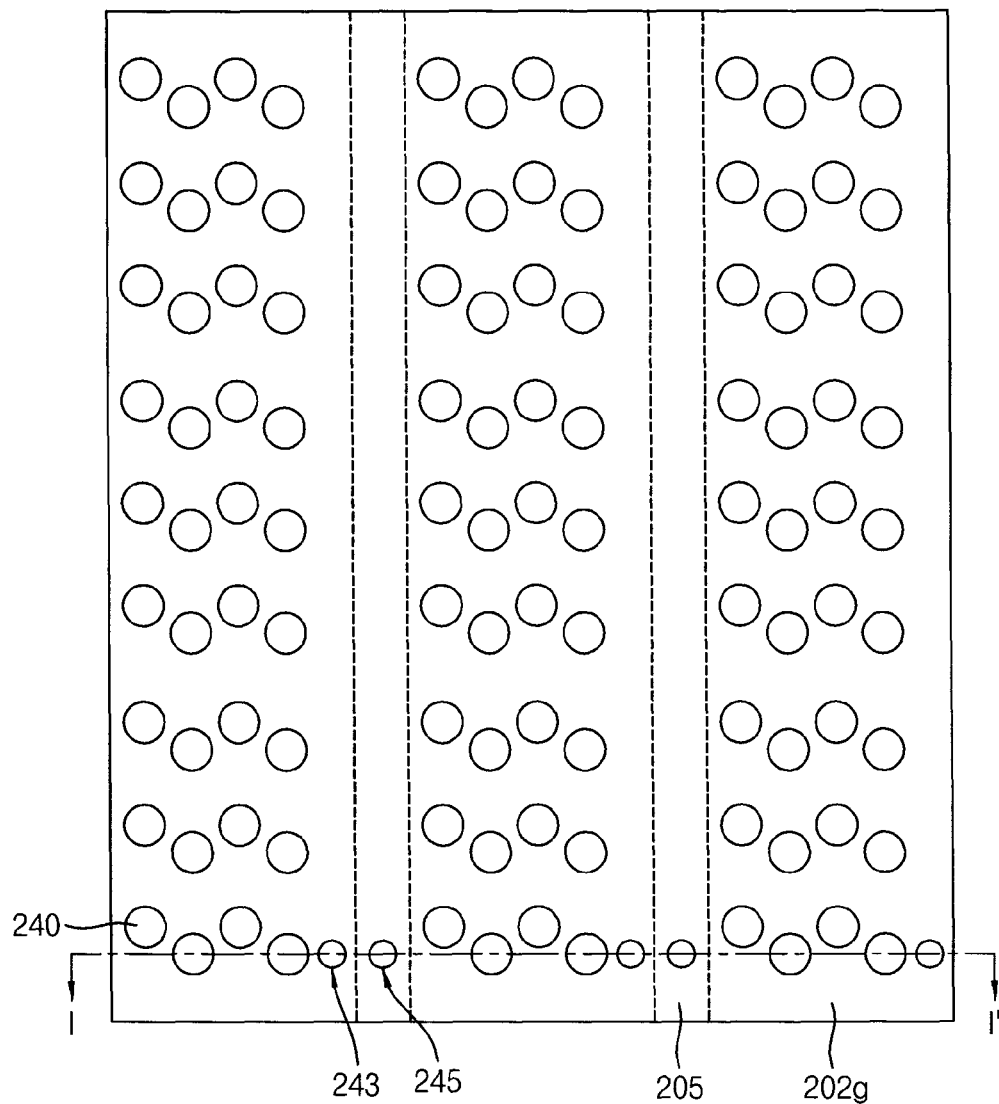
Figure 16B:
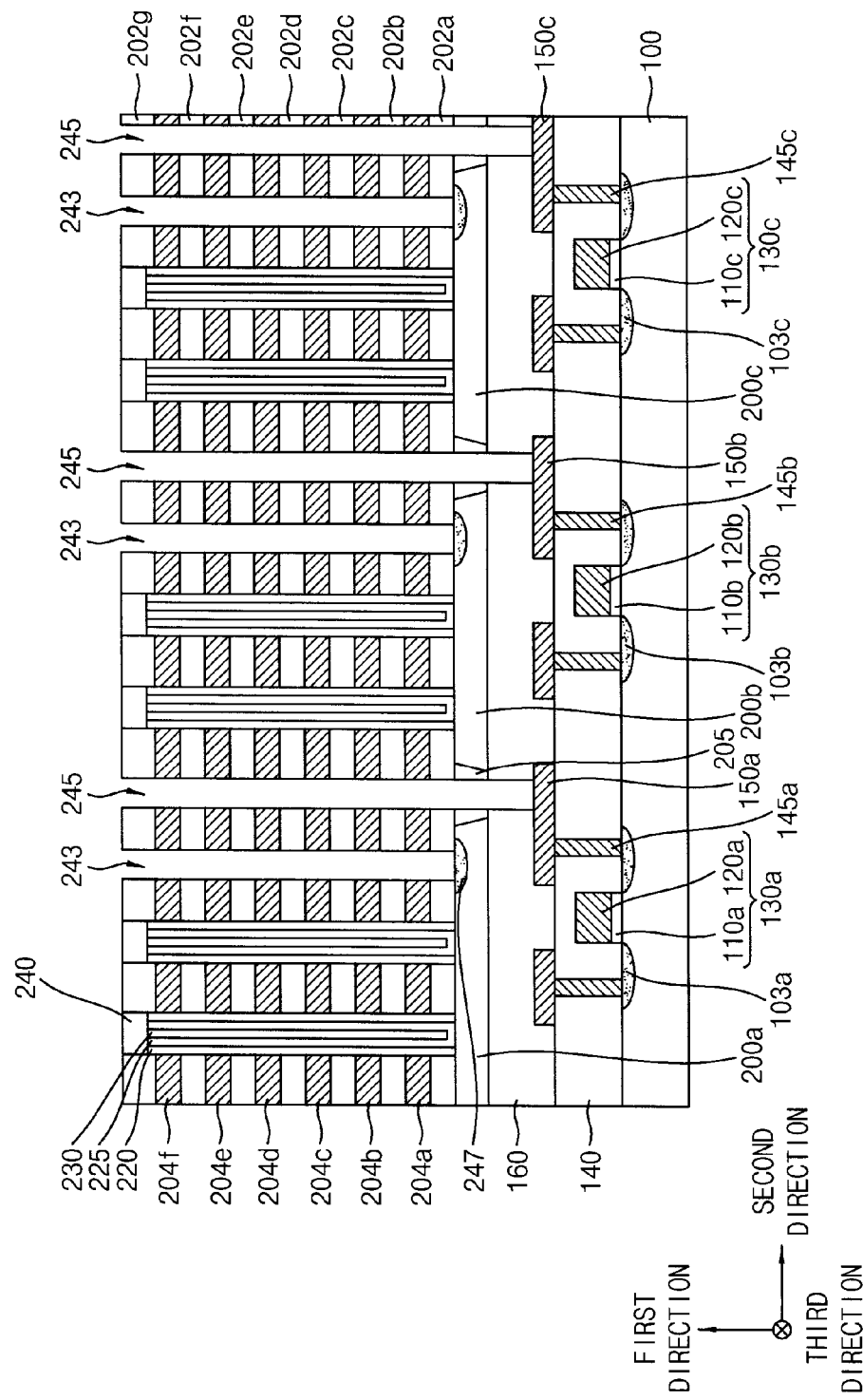

Referring to FIGS. 16A and 16B, first and second contact holes 243 and 245 may be formed through the mold structure.

In example embodiments, the insulating interlayers 202 and the sacrificial layers 204 may be partially etched to form the first contact holes 243 through which the top surface of the base layer patterns 200a, 200b and 200c. In an embodiment, the first contact hole 243 may be formed per each of the base layer patterns 200a, 200b and 200c.

For example, p-type impurities may be implanted through the first contact hole 243 into the base layer pattern 200a, 200b and 200c to form a first impurity region 247.

The insulating interlayers 202, the sacrificial layers 204, the separation layer pattern 205 and the second lower insulation layer 160 may be partially etched to form the second contact holes 245. In example embodiments, top surfaces of the first to third lower wirings 150a, 150b and 150c may be exposed through the second contact holes 245.

Figure 17A:
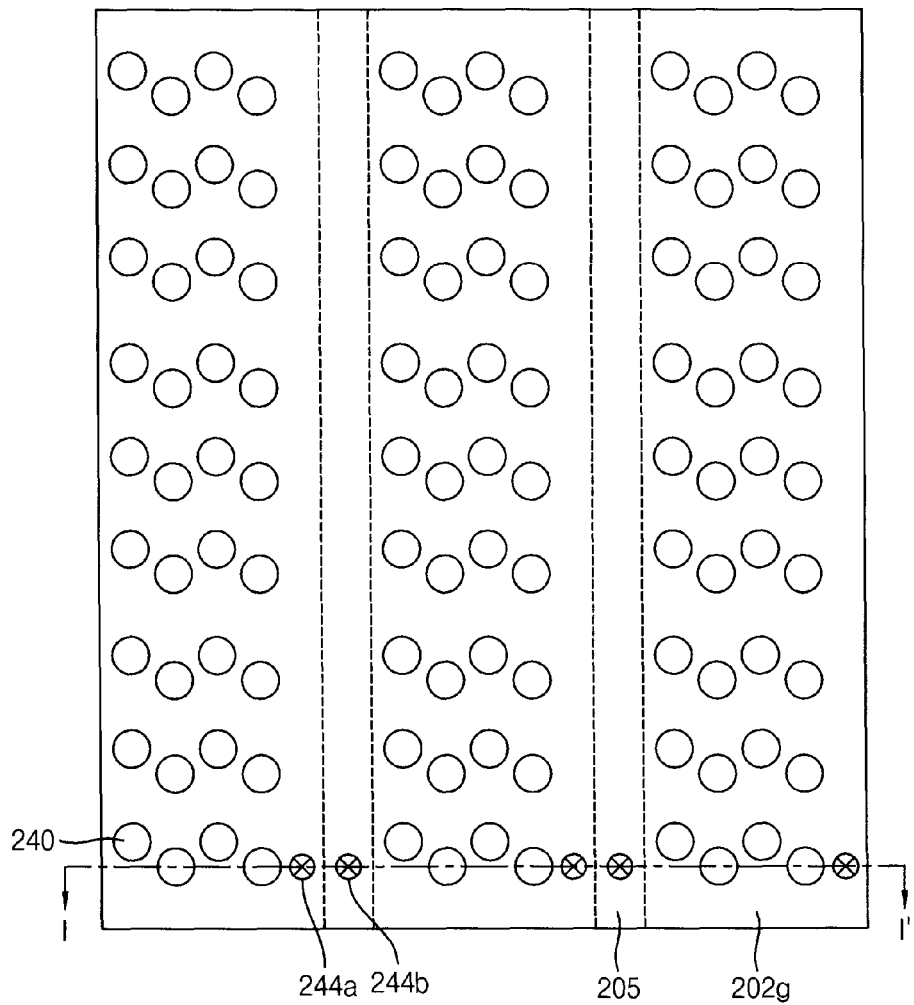
Figure 17B:
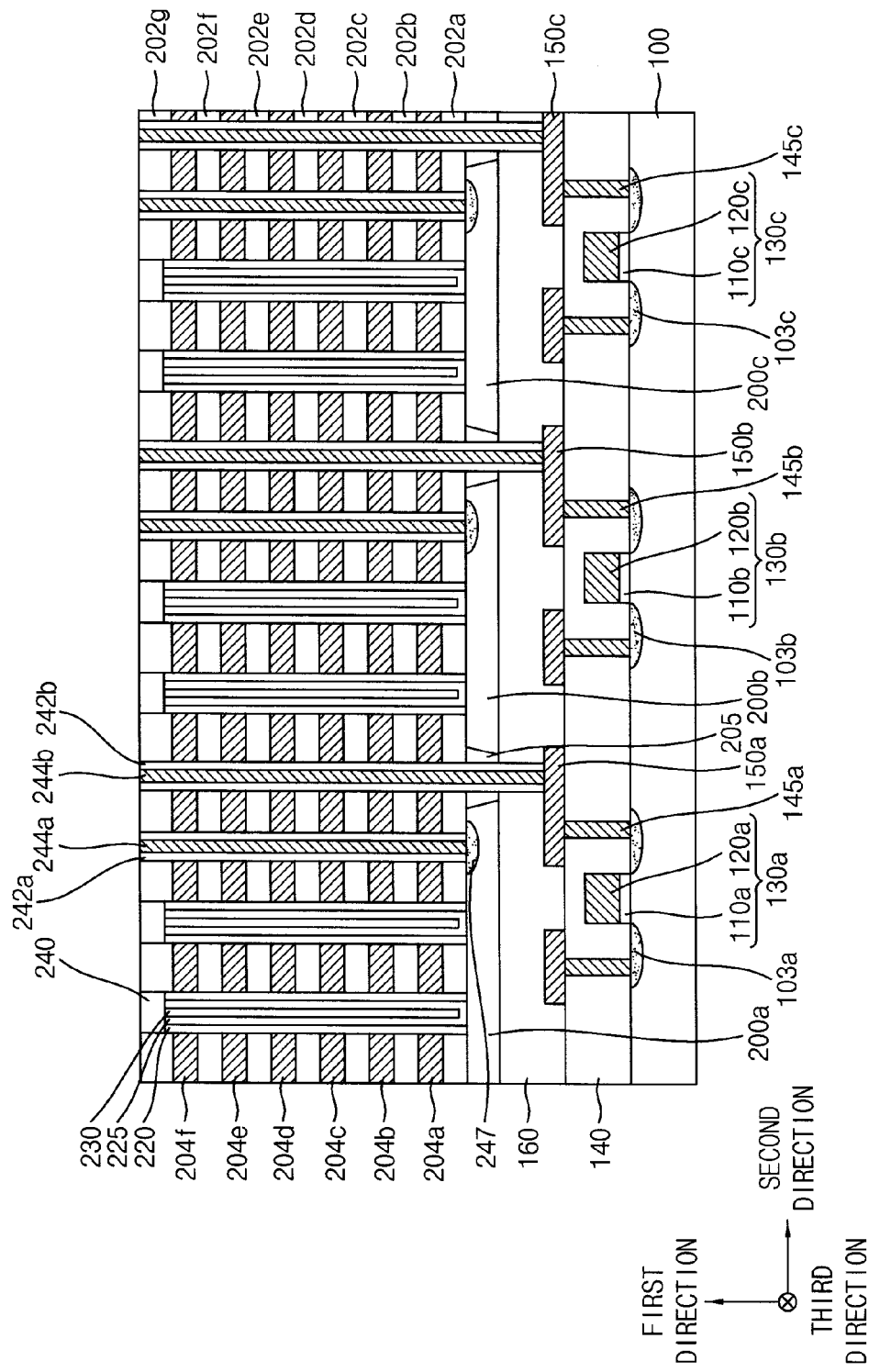

Referring to FIGS. 17A and 17B, a first insulation layer pattern 242a and a first connecting contact 244a may be formed in the first contact hole 243, and a second insulation layer pattern 242b and a second connecting contact 244b may be formed in the second contact hole 245.

In example embodiments, an insulation layer including, e.g., silicon oxide may be formed on the uppermost insulating interlayer 202g, the pads 240, and bottoms and sidewalls of the first and second contact holes 243 and 245. Portions of the insulation layer formed on bottoms of the first and second contact holes 243 and 245 may be removed by, e.g., an etch-back process such that the first impurity region 247 and the lower wiring 150a, 150b and 150c may be exposed again.

A conductive layer sufficiently filling remaining portions of the first and second contact holes 243 and 245 may be formed on the insulation layer. Upper portions of the insulation layer and the conductive layer may be planarized until the uppermost insulating interlayer 202g is exposed to form the first insulation layer pattern 242a, the second insulation layer pattern 242b, the first connecting contact 244a and the second connecting contact 244b may be formed. The conductive layer may be formed using a metal or a metal nitride by, e.g., a sputtering process or an ALD process.

In example embodiments, the first connecting contact 244a and the second connecting contact 244b may be in contact with or electrically connected to the first impurity region 247 and the lower wiring 150, respectively. In some embodiments, the first connecting contact 244a and the second connecting contact 244b may be formed per each of the base layer patterns 200a, 200b and 200c.

Figure 18A:
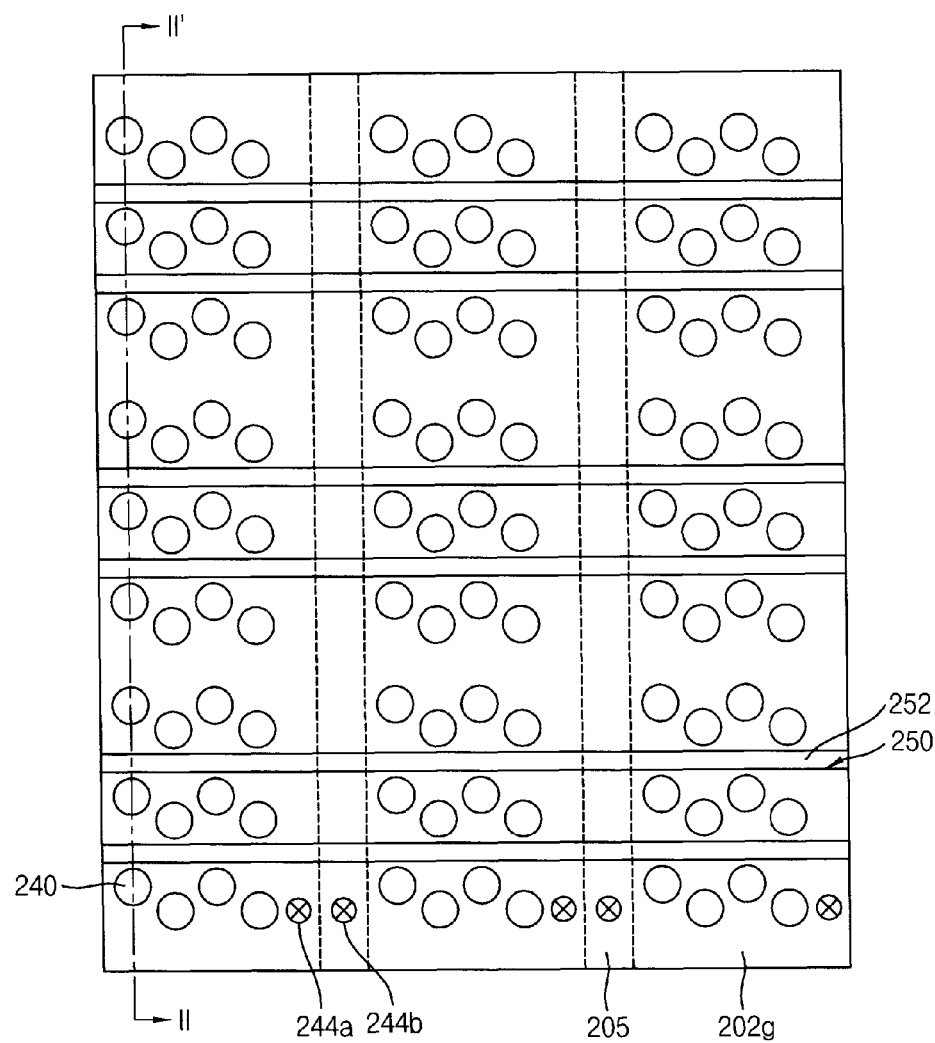
Figure 18B:
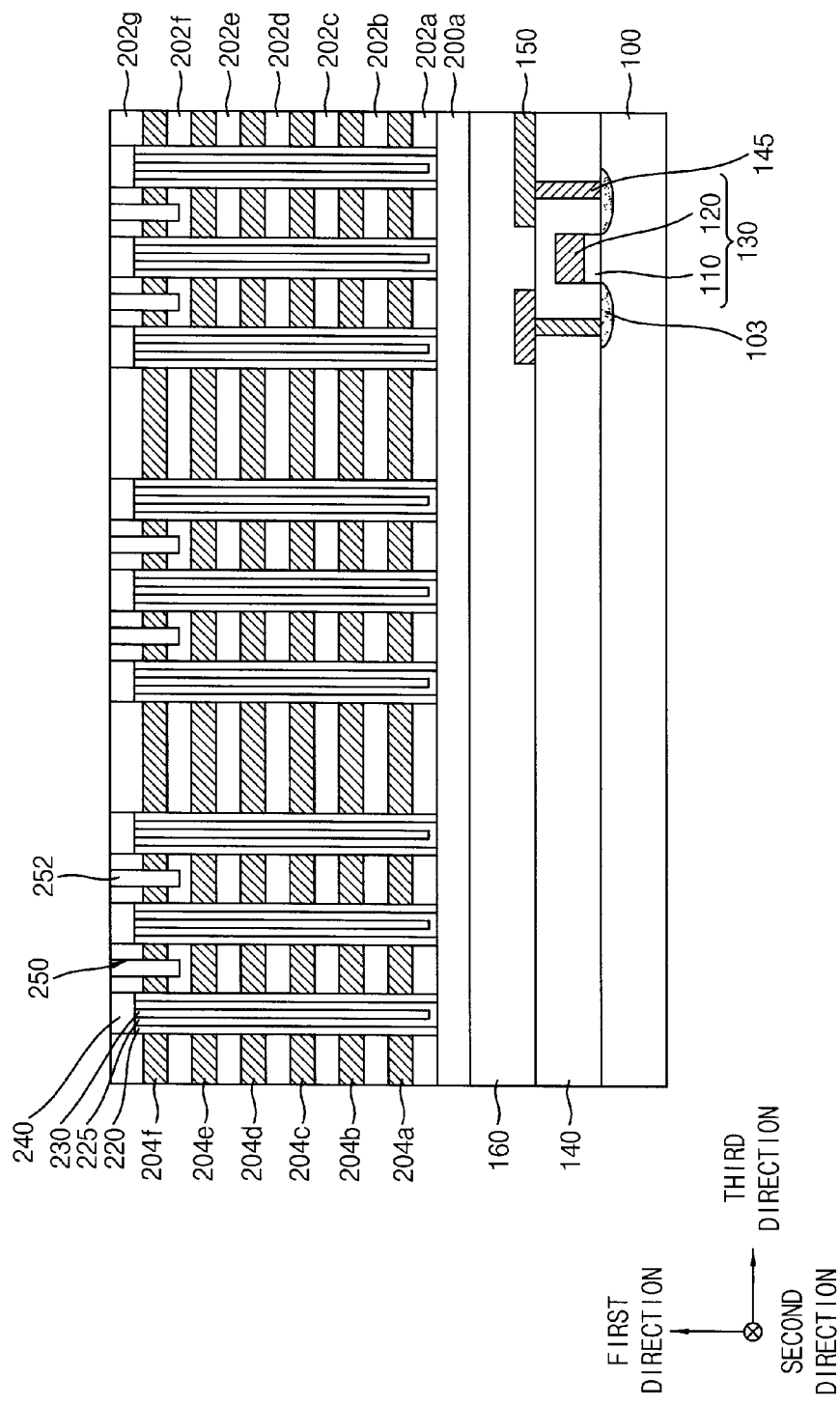

Referring to FIGS. 18A and 18B, an upper gate line cut pattern 252 extending through some of the insulating interlayers 202 and the sacrificial layers 204 may be formed between some of the neighboring channel rows.

In example embodiments, the insulating interlayers 202 and the sacrificial layers 204 between the some of the neighboring channel rows may be partially etched to form an upper gate line cut region 250. The upper gate cut region 250 may extend through a sacrificial layer 204f which may be replaced with the SSL. In this case, the gate line cut region 250 may also extend through the uppermost insulating interlayer 202g and partially through an insulating interlayer 202f directly under the sacrificial layer 204f.

In example embodiments, the upper gate line cut region 250 may have a trench shape extending in the second direction. A plurality of the upper gate line cut regions 250 may be formed along the third direction by a predetermined distance.

An insulation layer sufficiently filling the gate line cut regions 250 may be formed on the upper insulating interlayer 202f and the pads 240. An upper portion of the insulation layer may be planarized until the uppermost insulating interlayer 202g is exposed to form the gate line cut patterns 252. The insulation layer may be formed using, e.g., silicon oxide by a CVD process, a PECVD process, a spin coating process, etc.

The predetermined number of the channel rows may form a unit or a group by the upper gate line cut patterns 252.

Figure 19A:
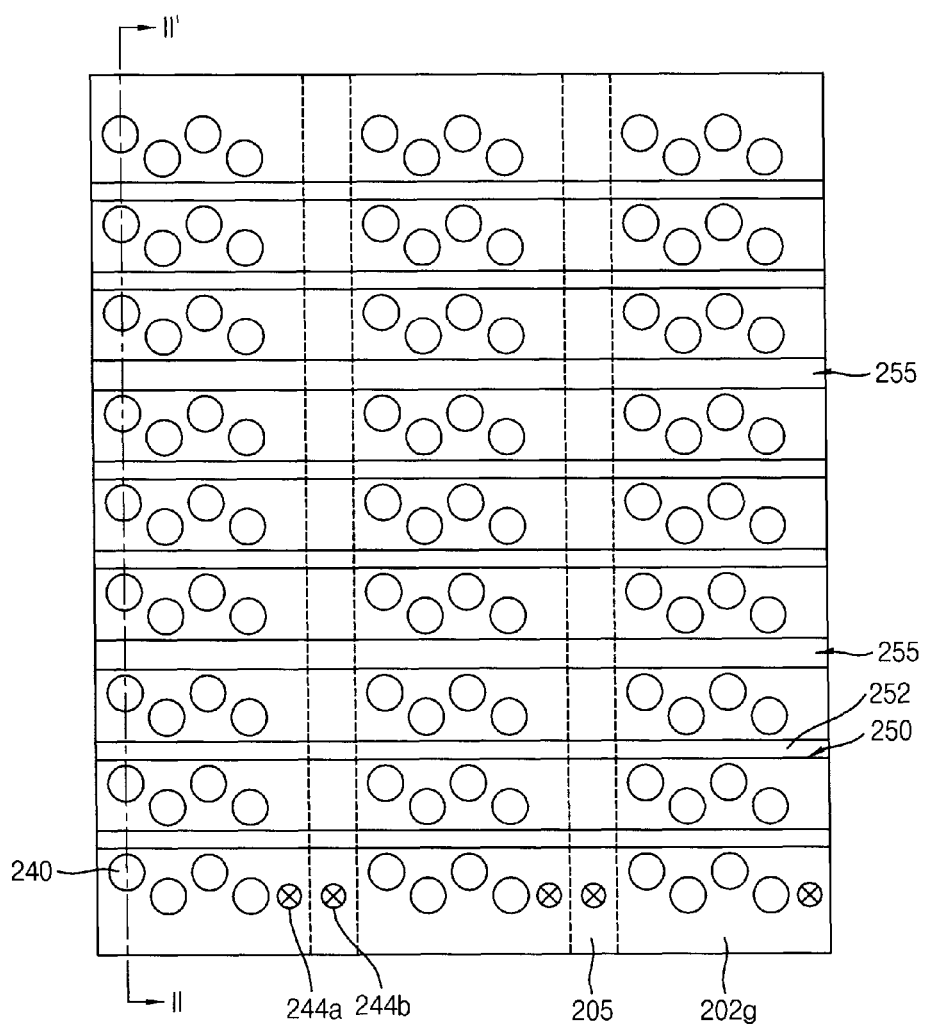
Figure 19B:
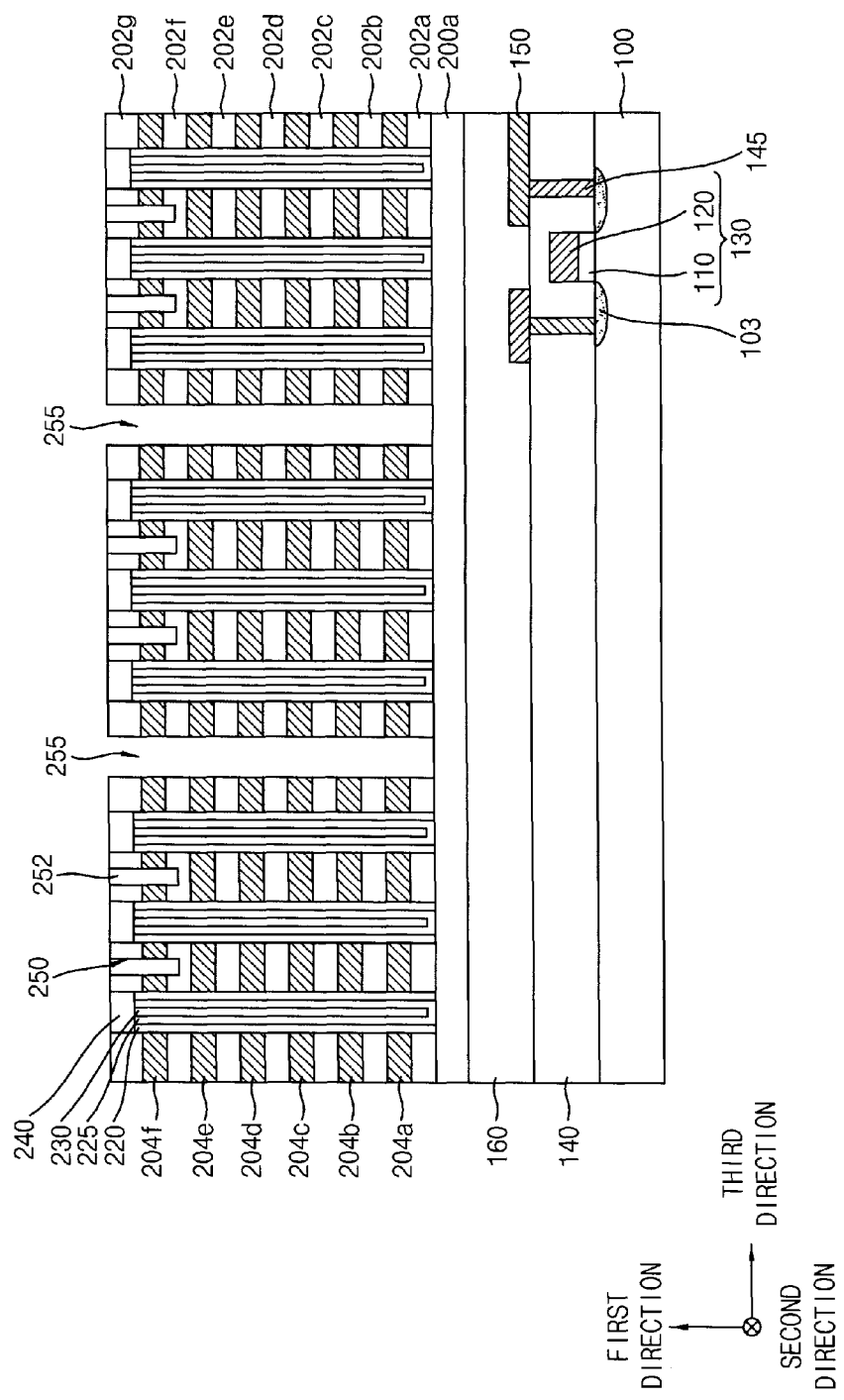

Referring to FIGS. 19A and 19B, the insulating interlayers 202 and the sacrificial layers 204 between some of the neighboring channel rows may be partially etched to form a gate line cut region 255.

In example embodiments, the gate line cut region 255 may be formed through the insulating interlayers 202 and the sacrificial layers 204 to expose the top surfaces of the base layer pattern 200a, 200b and 200c, and a top surface of the separation layer pattern 205. The gate line cut region 255 may extend in the second direction, and a plurality of the gate line cut regions 255 may be formed along the third direction.

A distance between the gate line cut regions 255 neighboring each other may be greater than a distance between the upper gate line cut regions 250 neighboring each other. For example, at least two upper gate line cut regions 250 may be formed between two neighboring gate line cut regions 255.

In example embodiments, the number of the channel rows included in one cell block may be defined by the gate line cut regions 255. For example, as illustrated in FIG. 19A, six channel rows may be included between the two neighboring gate line cut regions 255.

Figure 20A:
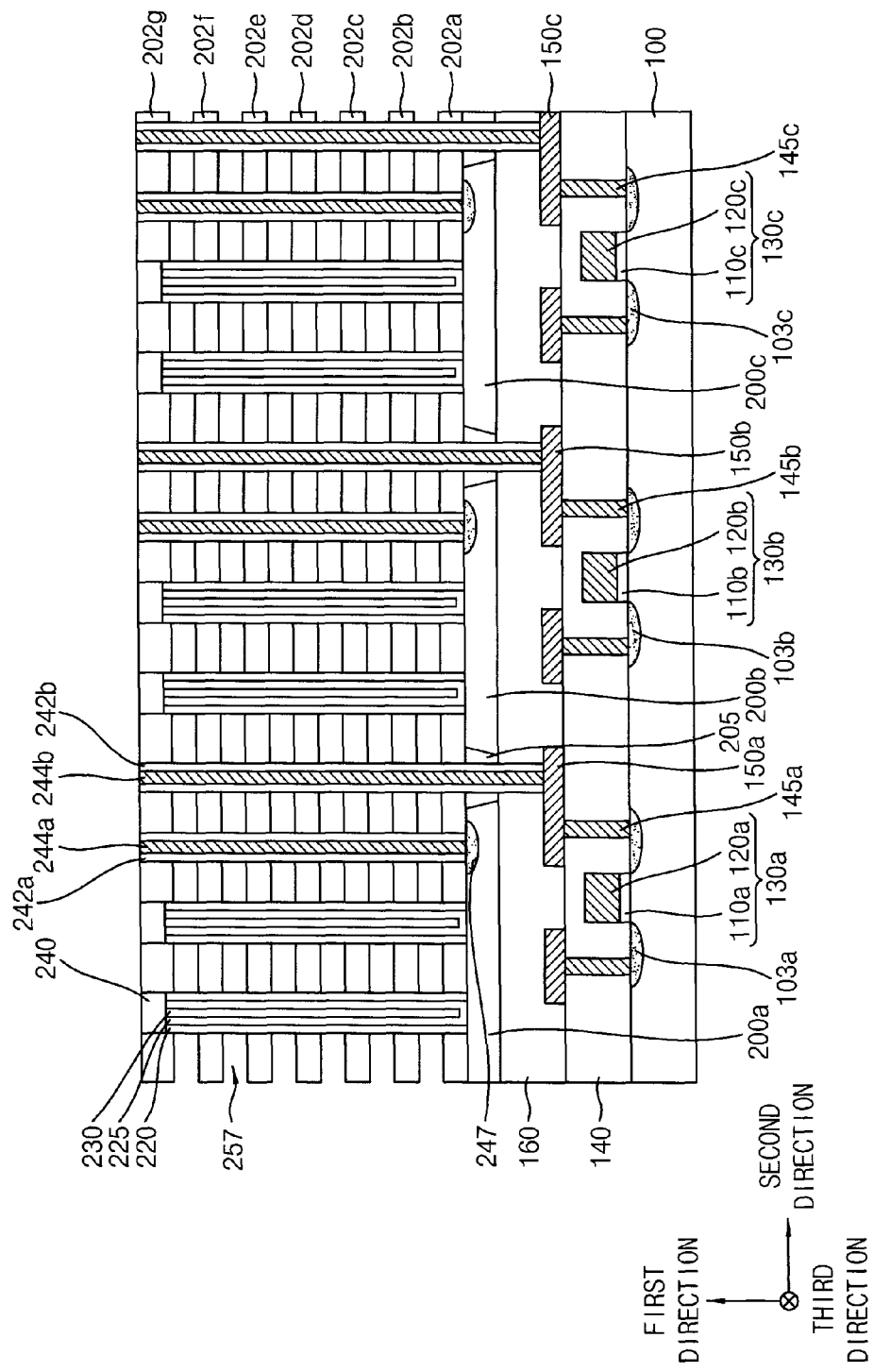
Figure 20B:
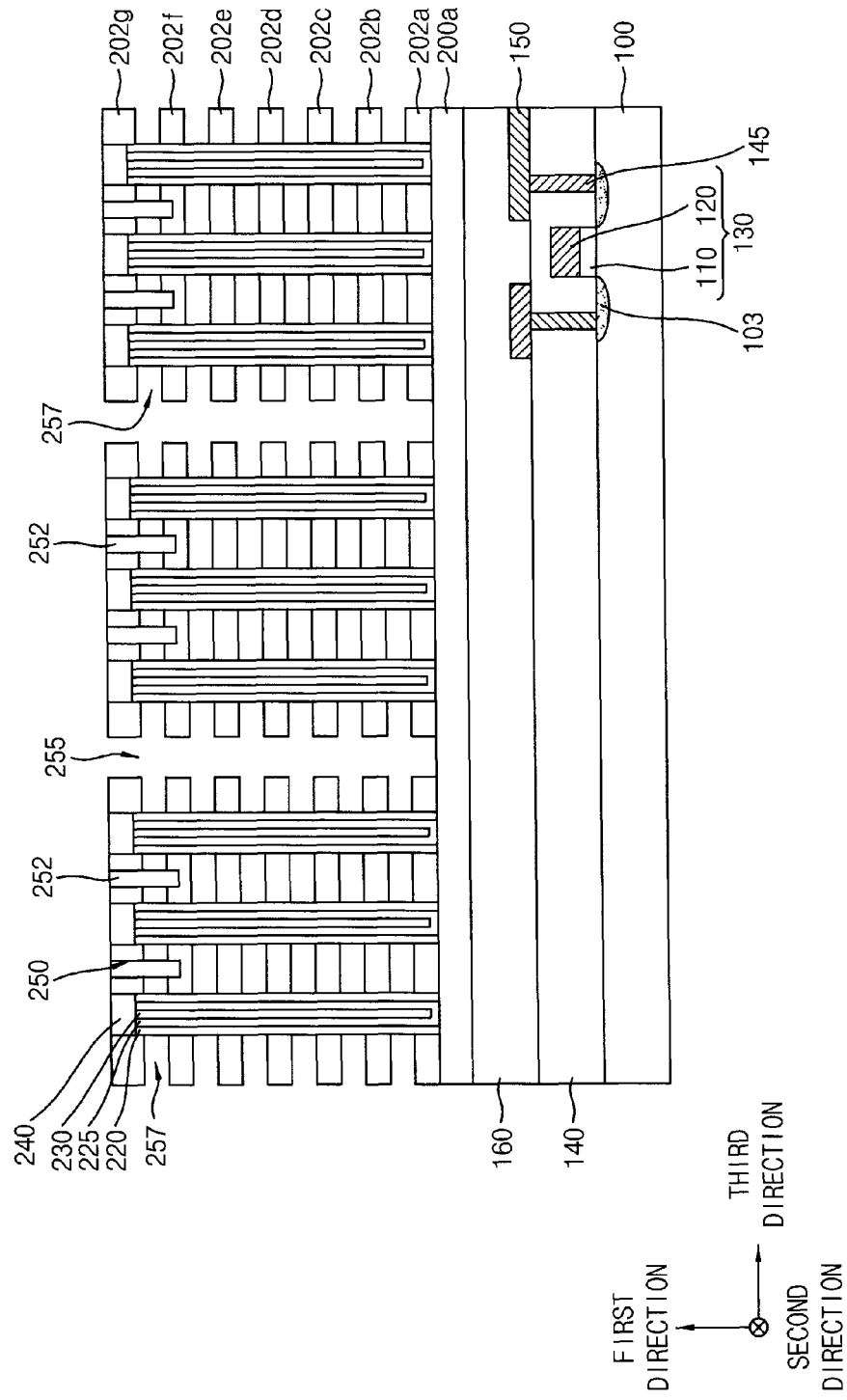

Referring to FIGS. 20A and 20B, the sacrificial layers 204, the sidewalls of which are exposed by the gate line cut region 255 may be removed. In example embodiments, the sacrificial layers 204 may be removed by a wet etching process using an etchant solution that may have an etching selectivity for silicon nitride. For example, the etchant solution may include phosphoric acid or sulfuric acid.

A gap 257 may be defined by a space from which the sacrificial layer 204 is removed. A plurality of the gaps 257 may be formed along the first direction. Each gap 257 may be formed between the adjacent insulating interlayers 202. An outer sidewall of the dielectric layer structure 220 may be partially exposed by the gap 257. A sidewall of the upper gate line cut pattern 252 may be also exposed by the gap 257.

Figure 21A:
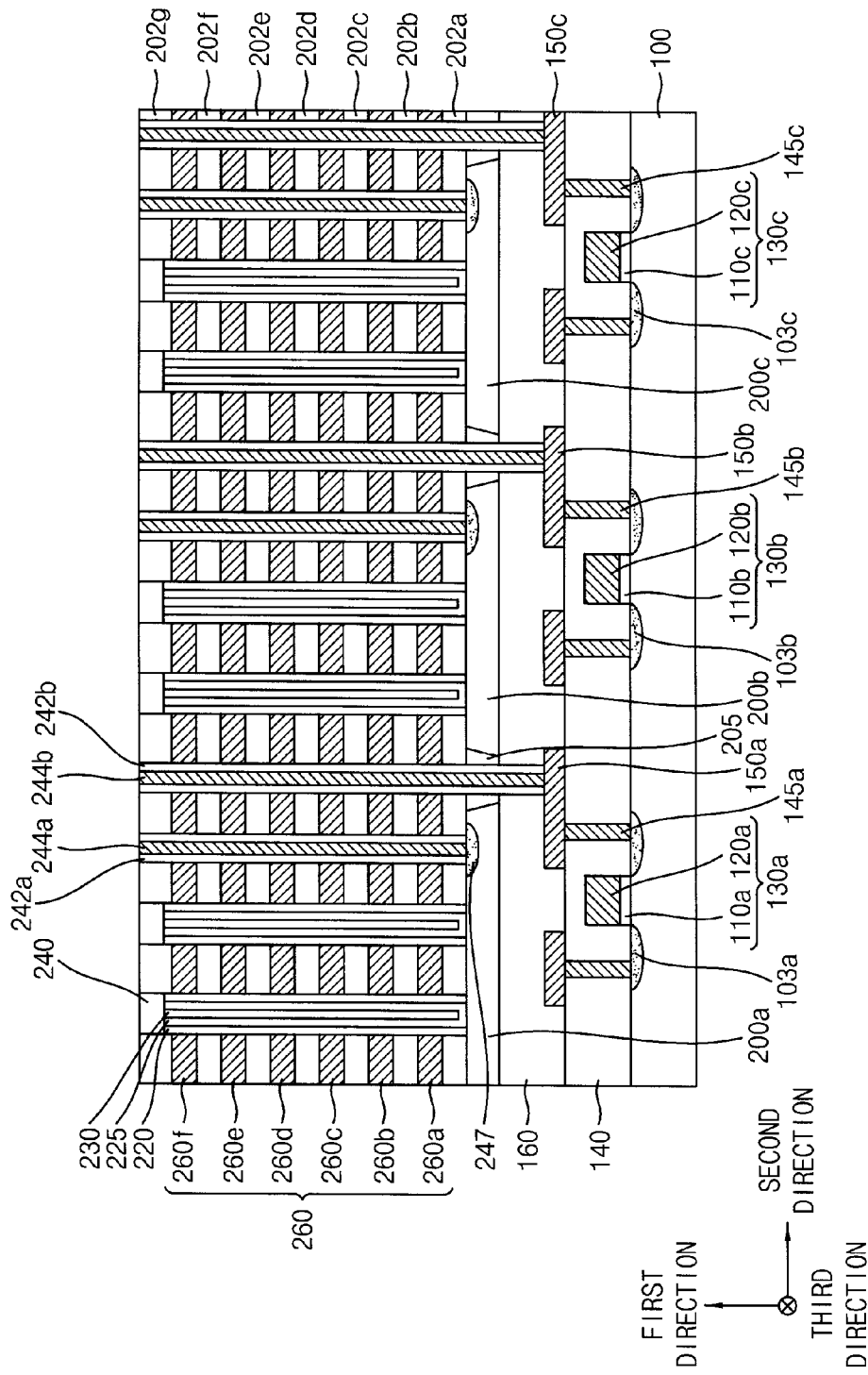
Figure 21B:
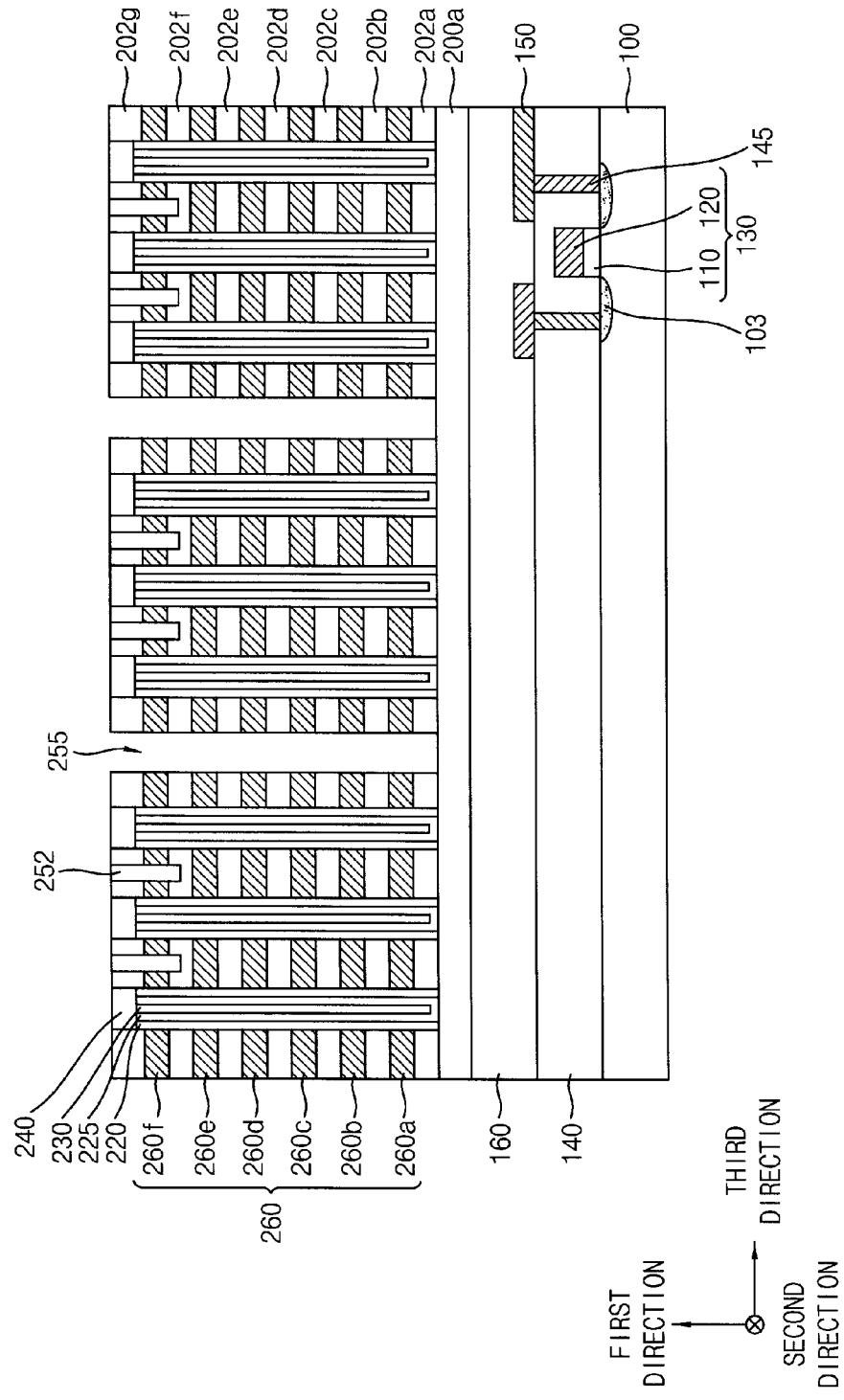

Referring to FIGS. 21A and 21B, a gate line 260 (e.g., 260a through 260f) may be formed in the gate 257 at each level. Accordingly, the sacrificial layer 204 at each level may be replaced with the gate line 260.

In example embodiments, a gate electrode layer may be formed on the exposed outer sidewalls of the dielectric layer structures 220, surfaces of the insulating interlayers 202, the exposed top surfaces of the base layer pattern 200a, 200b and 200c, and top surfaces of the pads 240. The gate electrode layer may sufficiently fill the gaps 257 and at least partially fill the gate line cut region 255.

The gate electrode layer may be formed using a metal or a metal nitride having low electrical resistance and work function. For example, the gate electrode layer may be formed using tungsten, tungsten nitride, titanium, titanium nitride, tantalum, tantalum nitride, platinum, etc. In some embodiments, the gate electrode layer may be formed as a multi-layered structure including a barrier layer formed of a metal nitride and/or a metal layer. The gate electrode layer may be formed by a deposition process such as a CVD process, a PECVD process, an ALD process, a PVD process, a sputtering process, etc.

In one embodiment, an additional blocking layer may be formed along inner walls of the gaps 257 and the surfaces of the insulating interlayers 202 prior to the formation of the gate electrode layer. The additional blocking layer may be formed using silicon oxide or a metal oxide.

The gate electrode layer may be partially removed to form the gate line 260 in the gap 257 at each level.

For example, an upper portion of the gate electrode layer may be planarized by a CMP process until the uppermost insulating interlayer 202g is exposed. Portions of the gate electrode layer formed in the gate line cut region 255 and on the top surface of the base layer pattern 200a, 200b and 200c may be etched to obtain the gate lines 260. The gate electrode layer may be partially etched by a wet etching process using, e.g., a hydrogen peroxide-containing solution.

The gate lines 260 may include the GSL, the word line and the SSL, for example, described herein, which are sequentially stacked and spaced apart from one another in the first direction. For example, a lowermost gate line 260a may serve as the GSL. Four gate lines 260b, 260c, 260d and 260e on the GSL may serve as the word line. An uppermost gate line 260f on the word line may serve as the SSL.

The gate line 260 at each level may partially surround the channel row and extend in the second direction. The gate lines 260 may be cut or segmented by the gate line cut region 255 according to a predetermined unit or length along the third direction. Accordingly, the cell block may be defined by the predetermined number of the channel rows (e.g., 6 channel rows) and the gate lines 260 surrounding the channel rows.

Figure 22A:
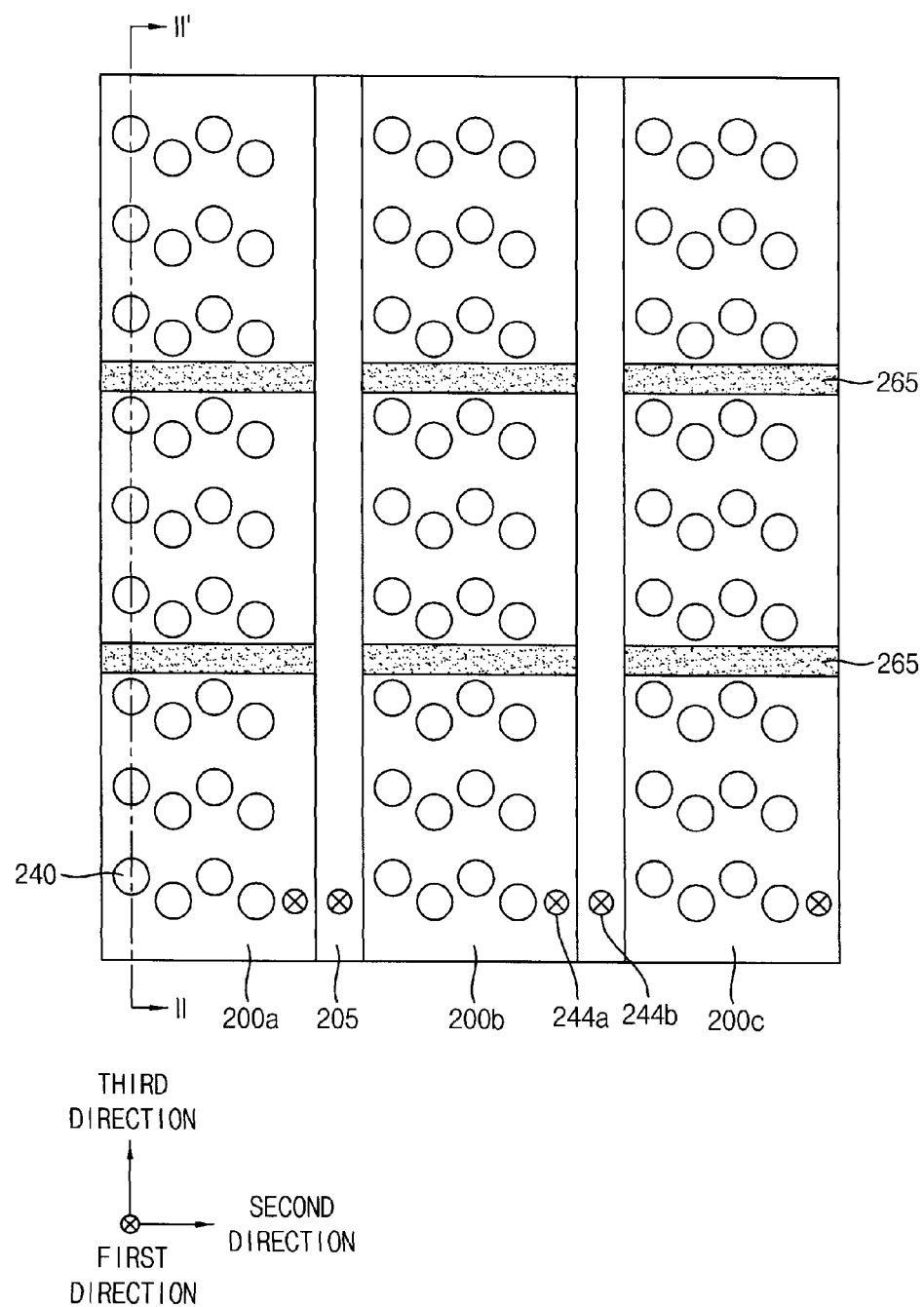
Figure 22B:
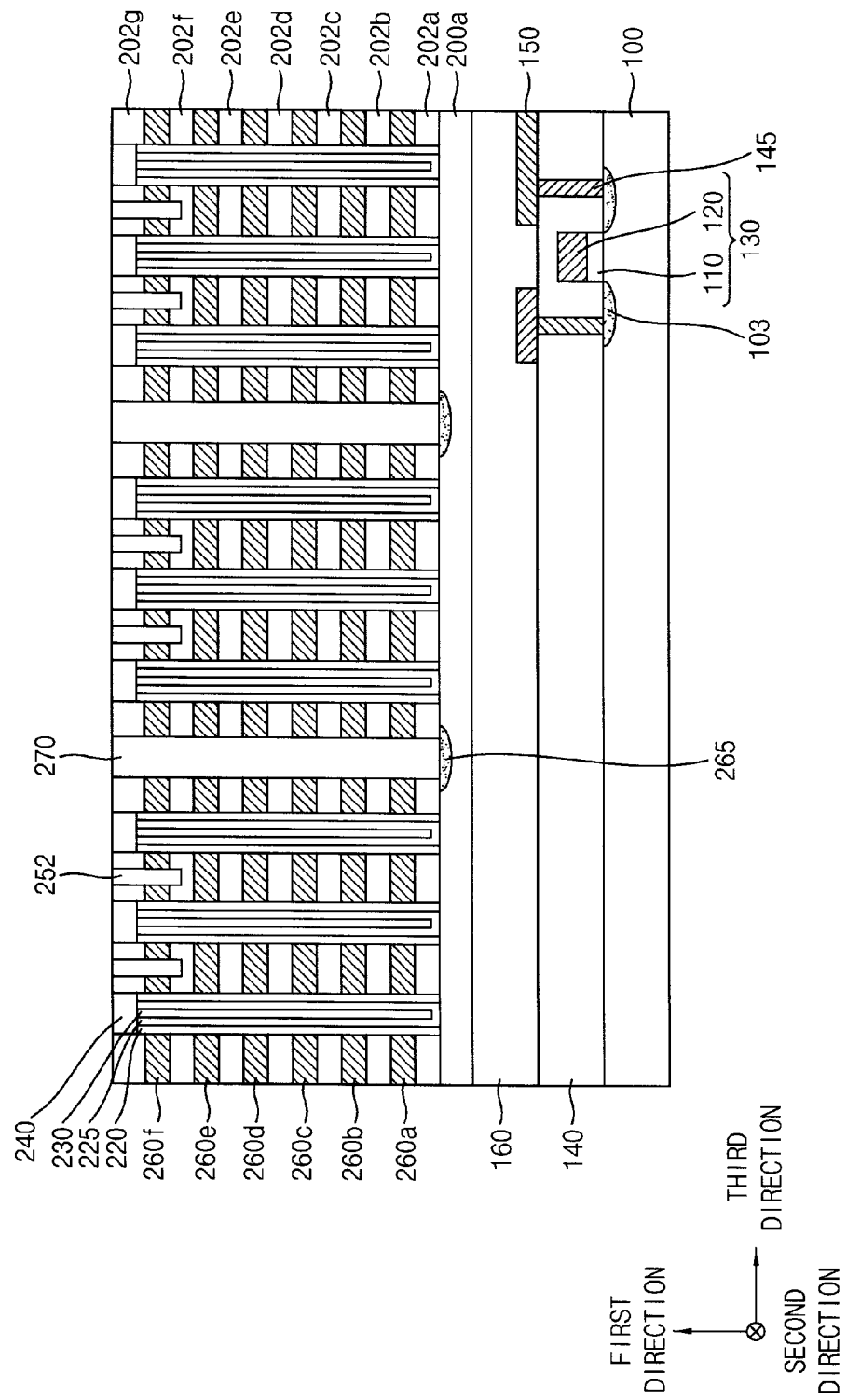

Referring to FIGS. 22A and 22B, a second impurity region 265 may be formed at an upper portion of the base layer pattern 200a, 200b and 200c exposed through the gate line cut region 255, and a gate line cut pattern 270 filling the gate line cut region 255 may be formed.

For example, n-type impurities may be implanted through the gate line cut region by an ion-implantation process to form the second impurity region 265. The n-type impurities may be also implanted into the pad 240 by the ion-implantation process. In example embodiments, the second impurity region 265 may serve as a CSL extending in the second direction.

As illustrated in FIG. 22A, the second impurity region 265 may be cut or separated by the separation layer pattern 205. Thus, the base layer pattern 200a, 200b and 200c may be further segmented into sub-cell blocks by the separation layer patterns 208 and the second impurity regions 265 crossing each other.

In one embodiment, a metal silicide pattern, e.g., a nickel silicide pattern or a cobalt silicide pattern may be further formed on the second impurity region to reduce a resistance of the CSL.

An insulation layer sufficiently filling the gate line cut region 255 may be formed on the second impurity region 265, the uppermost insulating interlayer 202g and the pad 240. An upper portion of the insulation layer may be planarized until the uppermost insulating interlayer 202g is exposed to form the gate line cut pattern 270. The insulation layer may be formed using, e.g., silicon oxide.

The gate line cut pattern 270 may extend in the second direction, and may intersect or cut the gate lines 260 by the cell block unit. The SSLs included in the cell block may be cut or separated by the upper gate line cut pattern 252.

Figure 23A:
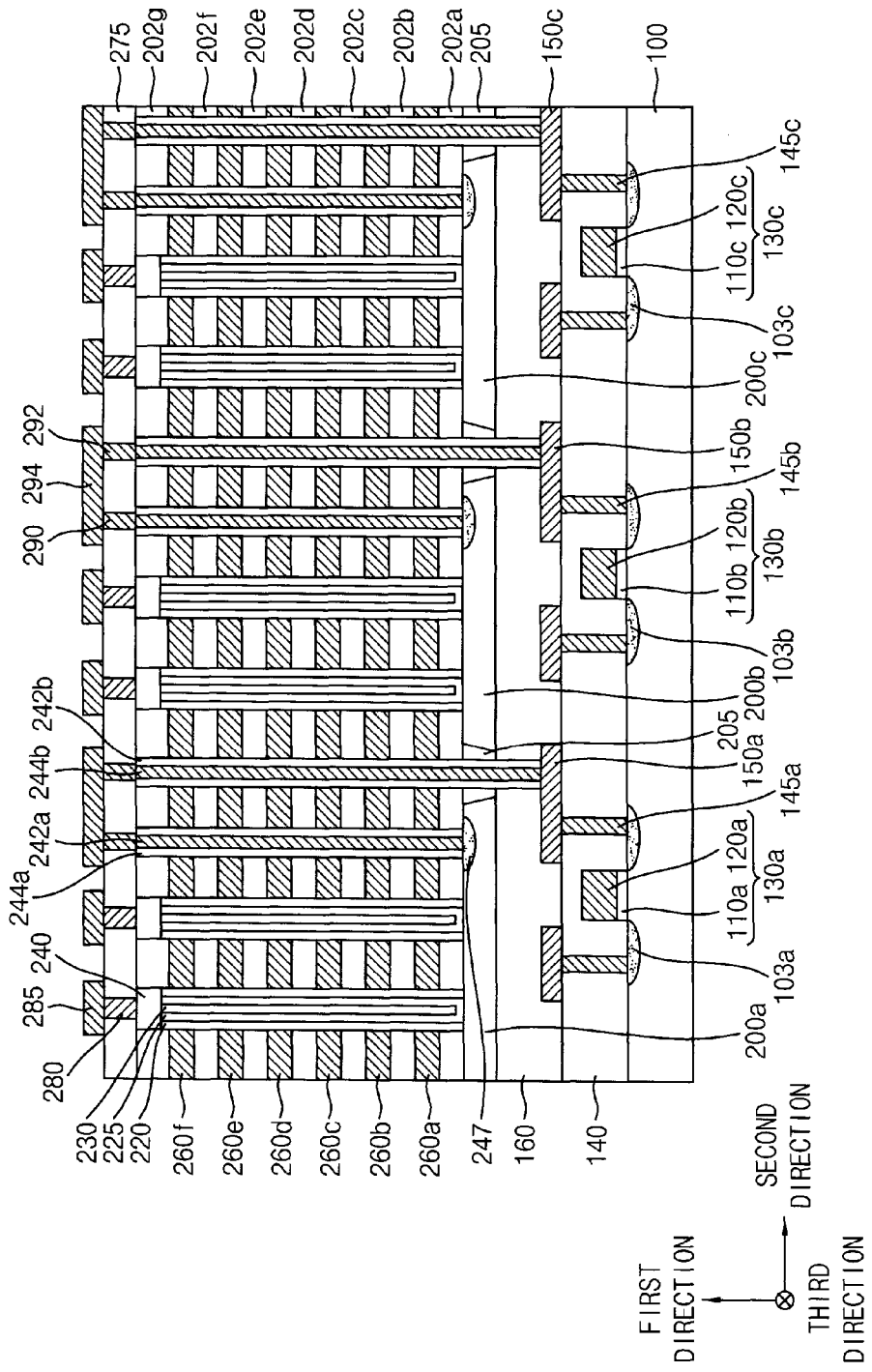
Figure 23B:
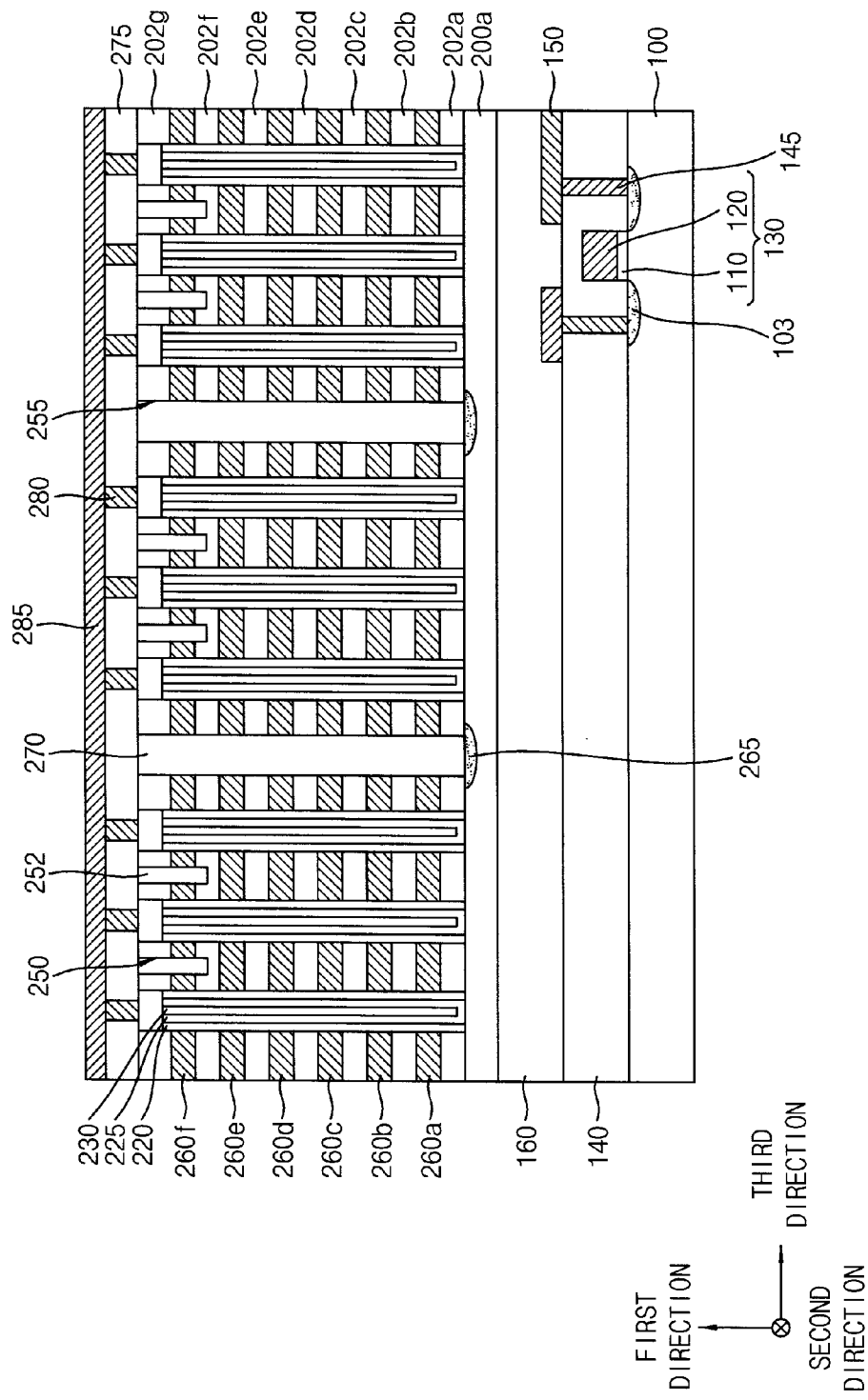

Referring to FIGS. 23A and 23B, an upper insulation layer 275 may be formed on the uppermost insulating interlayer 202g, the upper gate line cut pattern 252, the gate line cut pattern 270, the pad 240, the first and second connecting contacts 244a and 244b, and the first and second insulation layer patterns 242a and 242b. The upper insulation layer 275 may be formed using, e.g., silicon oxide by a CVD process.

A bit line contact 280, a first plug 290 and a second plug 292 may be formed through the upper insulation layer 275 to be in contact with the pad 240, the first connecting contact 244a and the second connecting contact 244b, respectively.

A bit line 285 may be formed on the upper insulation layer 275 to be electrically connected to the bit line contact 280. The bit line 285 may extend in the third direction to be electrically connected to a plurality of the bit line contacts 280. In this case, the bit line 285 and the separation layer pattern 205 may extend in substantially the same direction.

A connecting wiring 294 for connecting the first and second plugs 290 and 292 to each other may be formed on the upper insulation layer 275. An electrical signal or a voltage may be transferred from the first to third transistors to the first to third base layer patterns 200a, 200b and 200c through the connecting wiring 294.

For example, an upper conductive layer may be formed on the upper insulation layer 275 using a metal or a metal nitride, and then may be patterned to form the bit line 285 and the connecting wiring 294. The bit line 285 and the connecting wiring 294 may be formed from substantially the same etching process.

Figure 24:
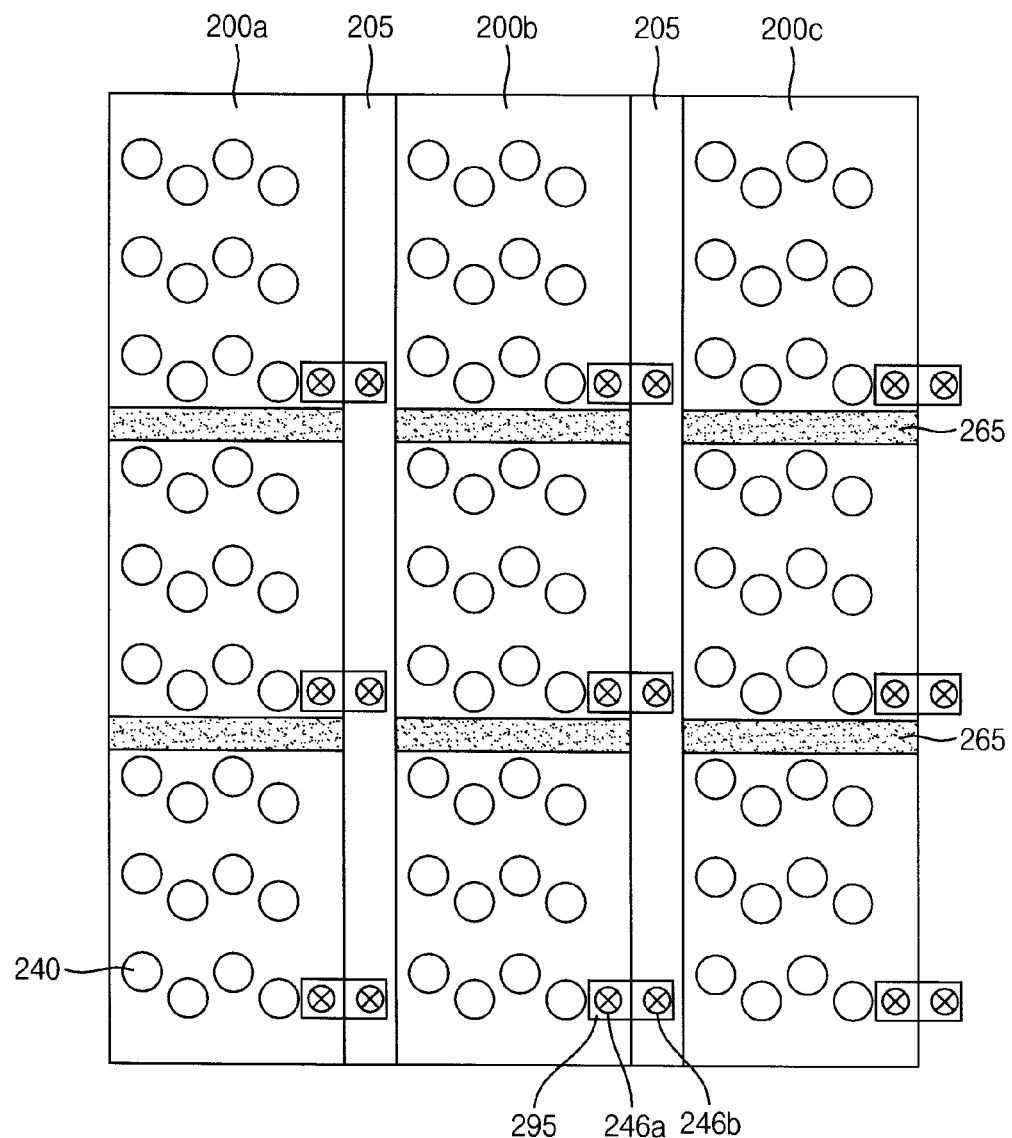

FIG. 24 is a top plan view illustrating a semiconductor device in accordance with some example embodiments. The semiconductor device of FIG. 24 may have elements and/or constructions substantially the same as or similar to those illustrated with reference to FIGS. 1 to 3 except for arrangements of a connecting contact and a connecting wiring. Thus, detailed descriptions on repeated elements, structures and manufacturing methods thereof are omitted herein.

For a convenience of descriptions, FIG. 24 only illustrates base layer patterns 200a, 200b and 200c, a pad 240, a separation layer pattern 205, first and second connecting contacts 246a and 246b, a connecting wiring 295, and a second impurity region 265.

Referring to FIG. 24, as described above, a sub-cell block may be defined by the separation layer patterns 205 and the second impurity regions 265.

In some embodiments, the first and second connecting contacts 246a and 246b may be provided per each of the sub-cell blocks. Thus, an electrical signal and/or a voltage may be transferred from a peripheral circuit independently to each of the sub-cell blocks, so that a desired operation of each sub-cell block may be easily controlled.

Figure 25:
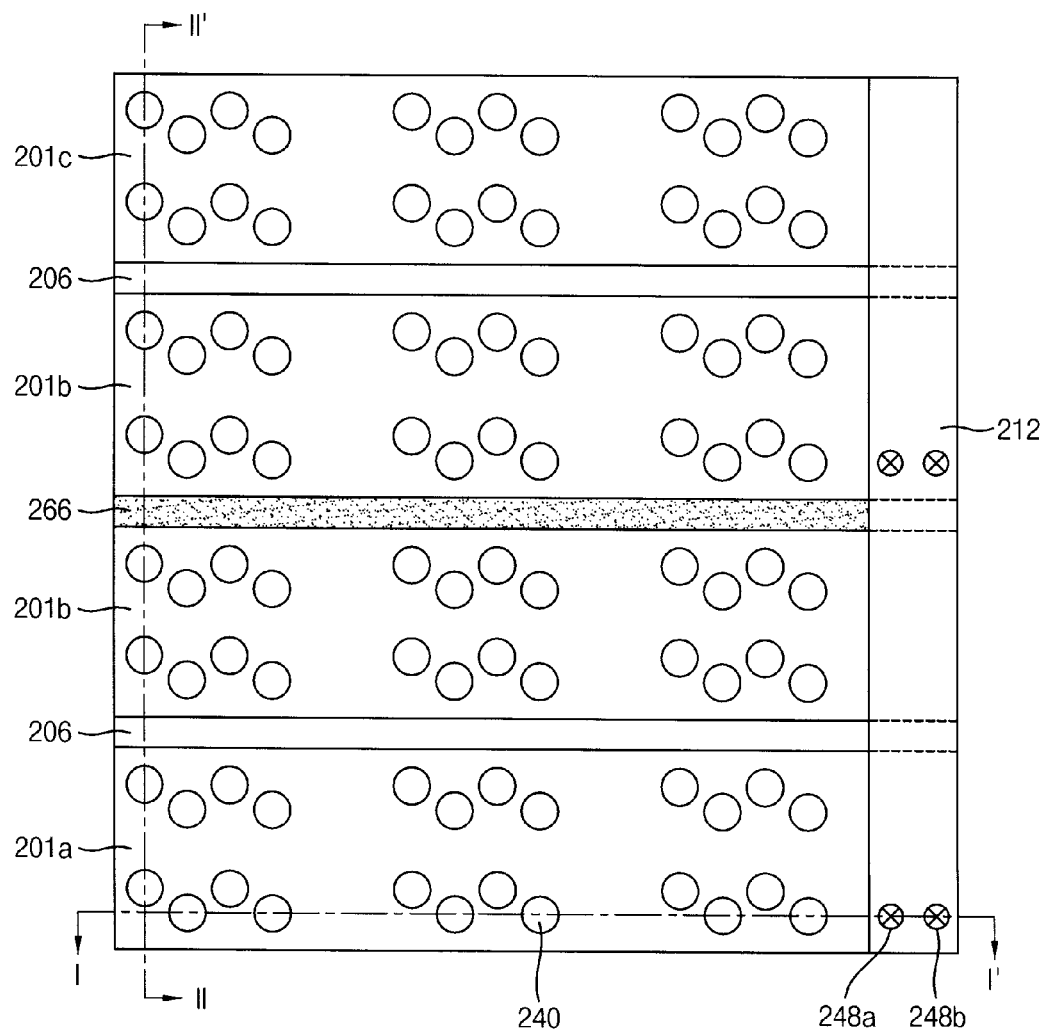
Figure 26:
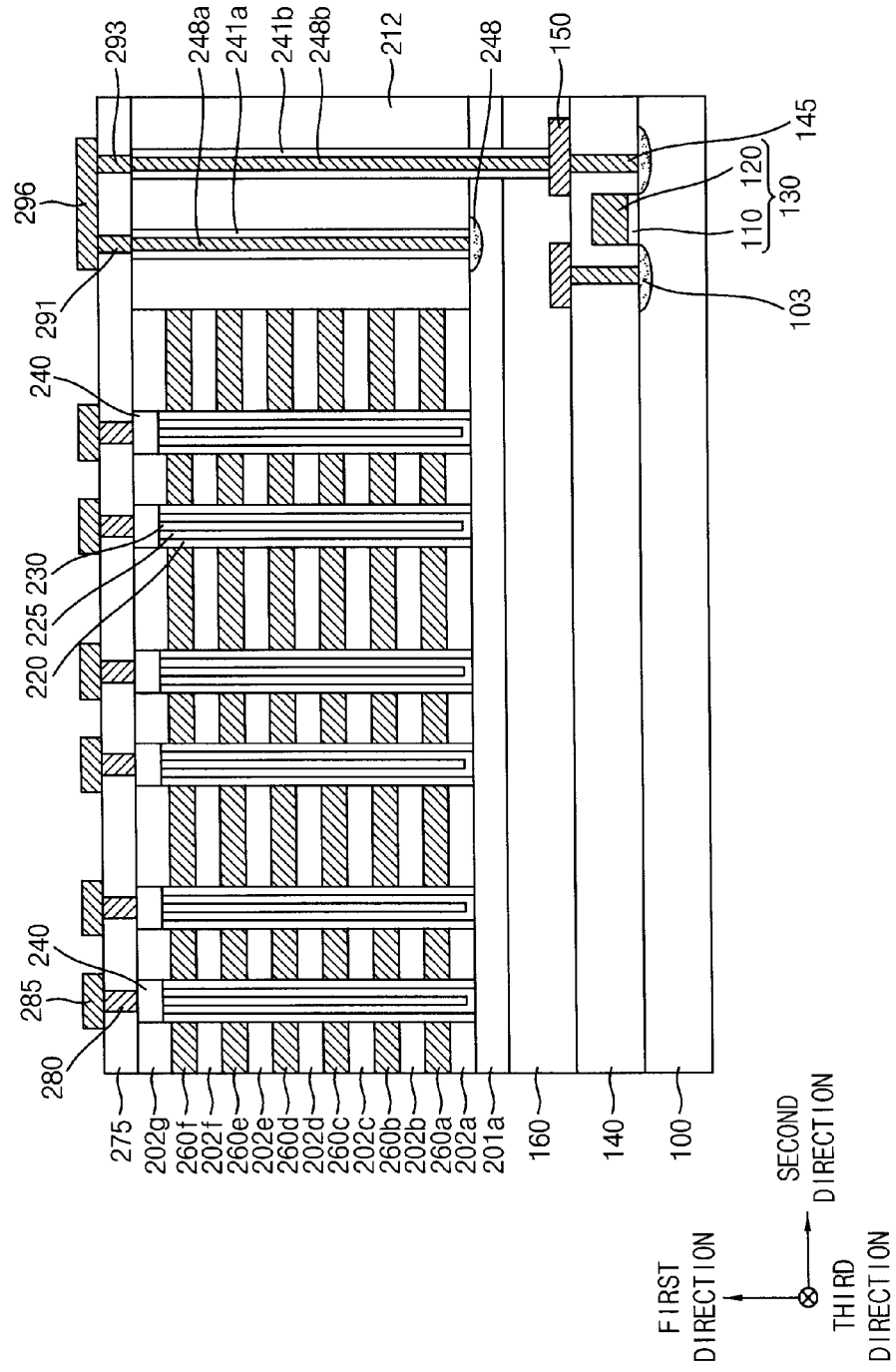
Figure 27:
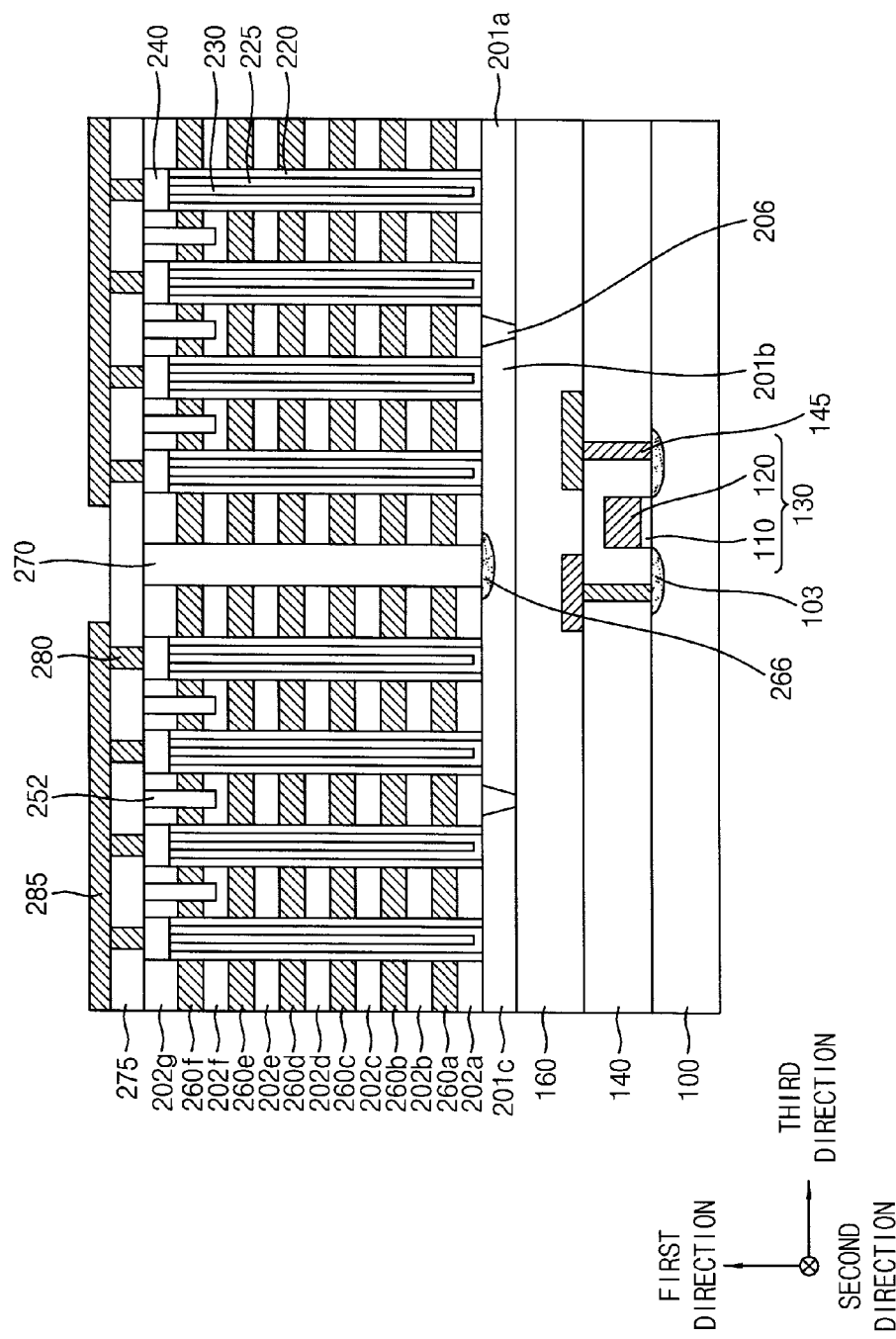

FIG. 25 is a top plan view illustrating a semiconductor device in accordance with example embodiments. FIGS. 26 and 27 are cross-sectional views taken along lines I-I' and II-IF of FIG. 25, respectively;

The semiconductor device of FIGS. 25 to 27 may have elements and/or constructions substantially the same as or similar to those illustrated with reference to FIGS. 1 to 3 except for arrangements of a separation layer pattern and a second impurity region. Thus, detailed descriptions on repeated elements and/or structures are omitted herein.

For a convenience of descriptions, FIG. 25 only illustrates base layer patterns 201a, 201b and 201c, a separation layer pattern 206, a second impurity region 266, a pad 240, a mold protection layer 212, a first connecting contact 248a and a second connecting contact 248b.

Referring to FIGS. 25 to 27, the separation layer pattern 206 may extend in the second direction, and a plurality of the separation layer patterns 206 may be arranged along the third direction. Thus, a base layer may be physically divided into the first to third base layer patterns 201a, 201b and 201c.

In example embodiments, the separation layer pattern 206, and the base layer pattern 201a, 201b and 201c may extend in substantially the same direction as that of the second impurity region 266, e.g., in the second direction. Further, the separation layer pattern 206 and the base layer pattern 201a, 201b and 201c may extend in substantially the same direction as that of the gate lines 260.

A gate line cut pattern 270 extending in the second direction may be disposed on the second impurity region 266. A plurality of the second impurity regions 266 and the gate line cut patterns 270 may be arranged along the third direction.

In example embodiments, a cell block sharing the gate lines 260 may be defined by the gate line cut pattern 270. The cell block may be divided into sub-cell blocks by the separation layer pattern 206. Thus, a dimension or a size of an individual block may be reduced, so that a segmented operational control may be achieved, In some embodiments, one of the first impurity regions 266 and one of the gate line cut patterns 270 may be provided per each base layer pattern 201a, 201b and 201c. As illustrated in FIG. 27, for example, the second impurity region 266 may be formed at a central region of the second base layer pattern 201b, and the gate line cut pattern 270 may be disposed on the second impurity region 266.

A connecting contact and a connecting wiring may be provided per each base layer pattern 201a, 201b and 201c to transfer an electrical signal and/or a voltage from a peripheral circuit.

In example embodiments, the mold protection layer 212 may be formed on lateral portions of the base layer pattern 201a, 201b and 201c, and the separation layer pattern 206. The first connecting contact 248a may extend through the mold protection layer 212 to make contact with a first impurity region 248 formed at the lateral portion of the base layer pattern 201a, 201b and 201c. The second contact 248b may extend through the mold protection layer 212, the base layer pattern 201a, 201b and 201c, and a second lower insulation layer 160 to make contact with a lower wiring 150. A first insulation layer pattern 241a and a second insulation layer pattern 241b may be formed on sidewalls of the first connecting contact 248a and the second connecting contact 248b, respectively.

A first plug 291 and a second plug 293 may extend through an upper insulation layer 275 to be in contact with the first connecting contact 248a and the second connecting contact 248b, respectively. The connecting wiring 296 may be disposed on the upper insulation layer to electrically connect the first and second plugs 291 and 293, respectively.

FIGS. 28A to 33 are cross-sectional views illustrating a method of manufacturing a vertical memory device in accordance with example embodiments. For example, FIGS. 28A to 33 illustrate a method of manufacturing the semiconductor device of FIGS. 25 to 27.

Specifically, FIGS. 28A, 29A, 30A and 31A are cross-sectional views taken along a line I-I' indicated in FIG. 25 along the first direction. FIGS. 28B, 29B, 30B, 31B, 32 and 33 are cross-sectional views taken along a line II-IF indicated in FIG. 25 along the first direction.

Detailed descriptions on processes substantially the same as or similar to those illustrated with reference to FIGS. 5 to 23B are omitted herein.

Figure 28A:
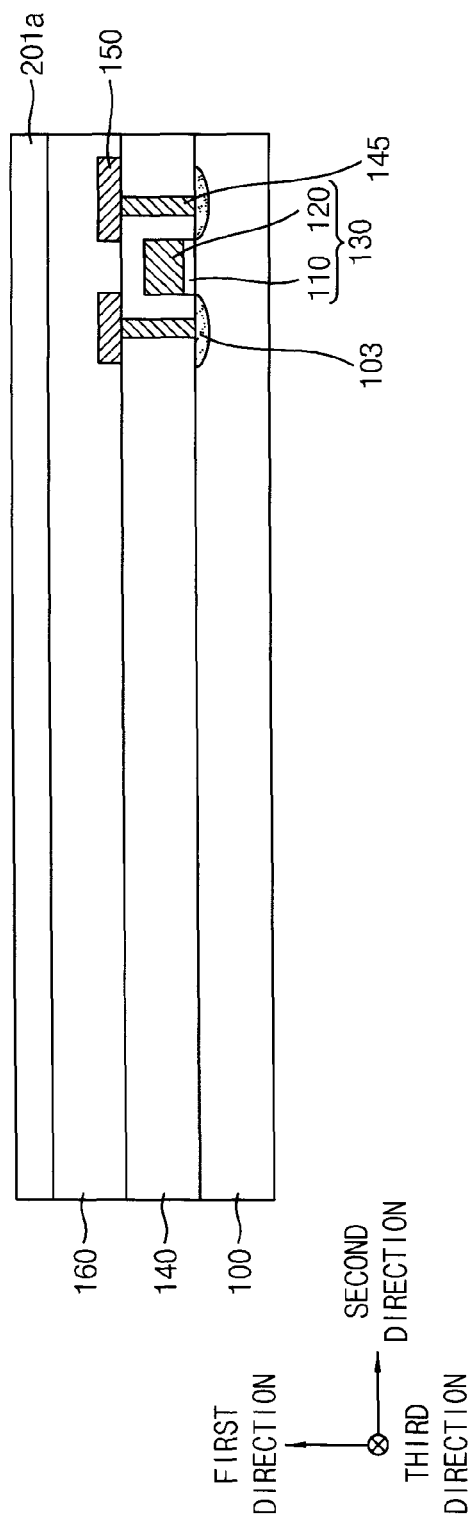
Figure 28B:
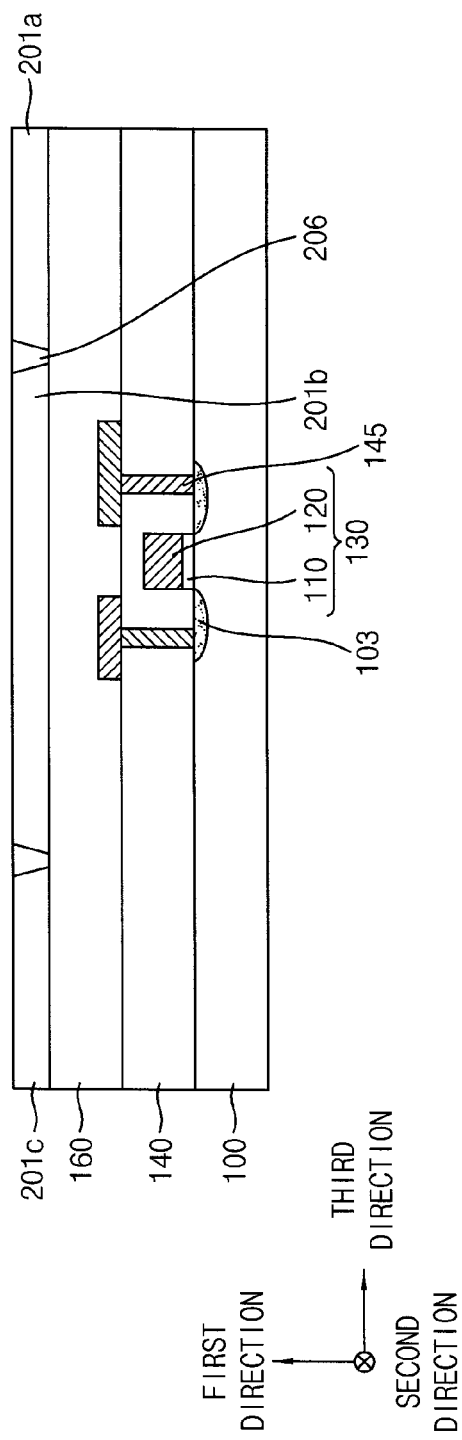

Referring to FIGS. 28A and 28B, processes substantially the same as or similar to those illustrated with reference to FIGS. 5 to 9B may be performed.

Accordingly, a peripheral circuit including a gate structure 130, a source/drain region 103, a lower contact 145 and a lower wiring 150 may be formed on a substrate 100, and first and second lower insulation layers 140 and 160 covering the peripheral circuit may be formed on the substrate 100.

A base layer may be formed on the second lower insulation layer 160. A separation layer pattern 206 may be formed such that the base layer may be patterned to first to third base layer patterns 201a, 201b and 201c physically separated from each other.

The separation layer pattern 206 and the base layer patterns 201a, 201b and 201c may extend in the second direction.

Figure 29A:
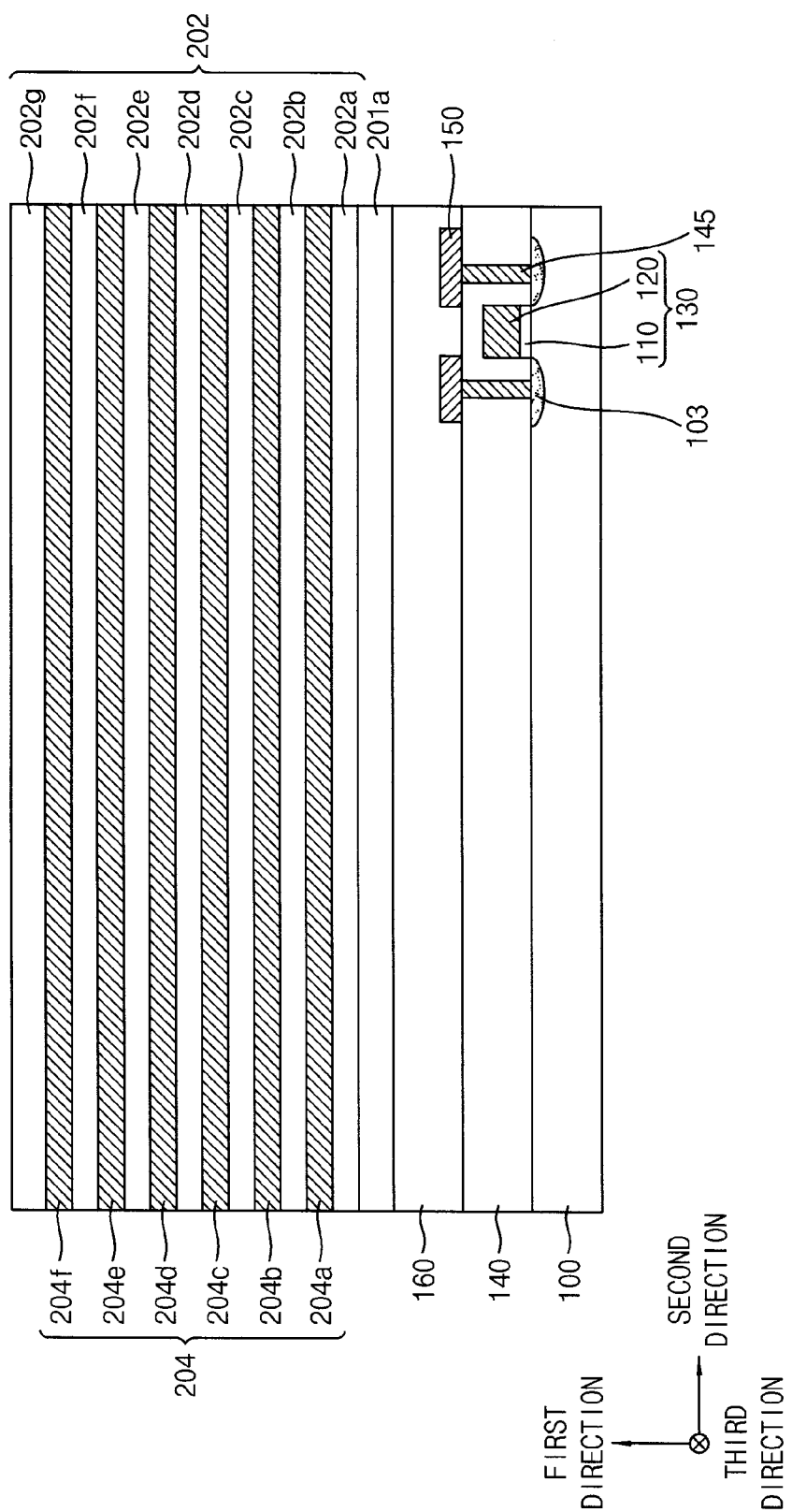
Figure 29B:
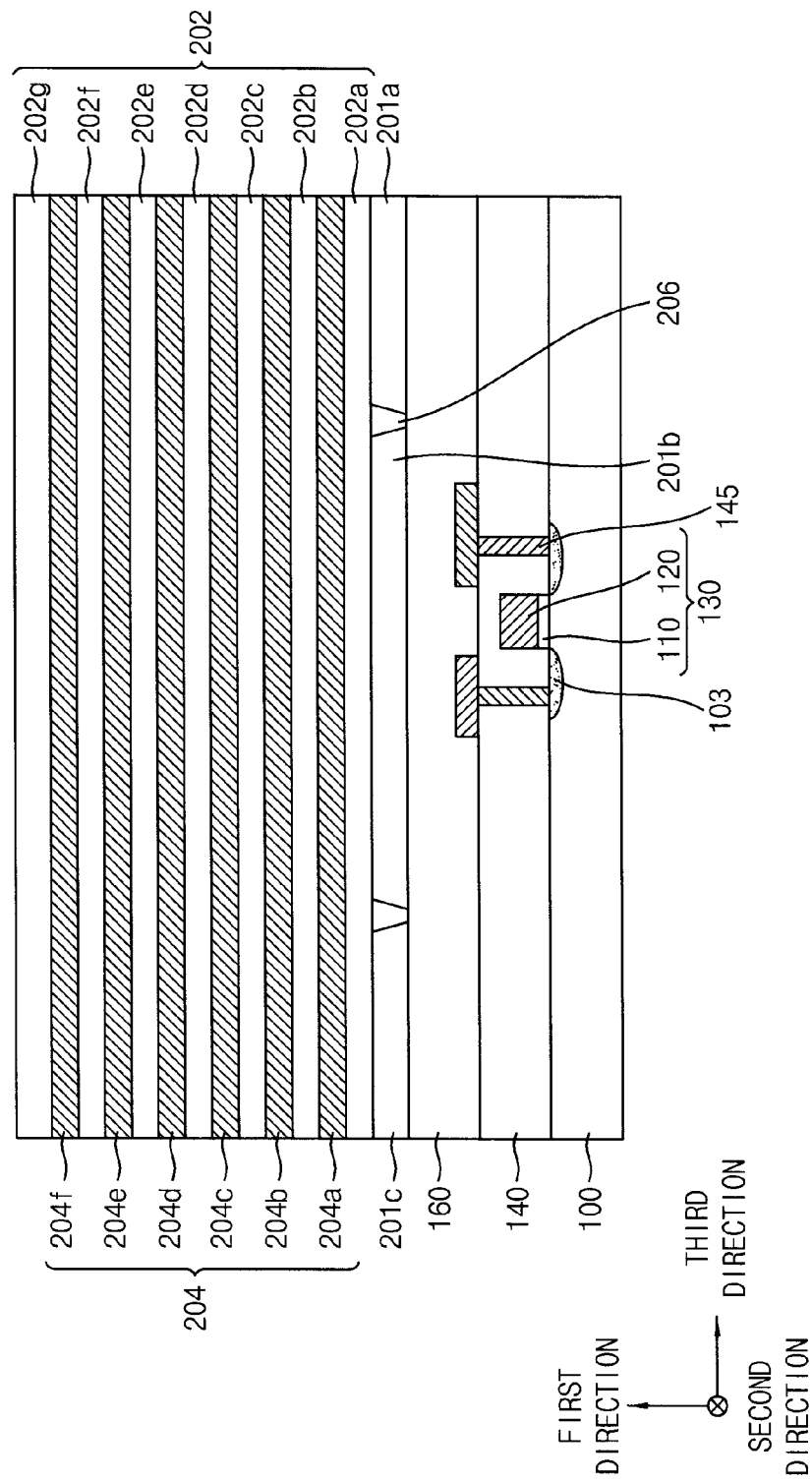

Referring to FIGS. 29A and 29B, a process substantially the same as or similar to that illustrated with reference to FIG. 10 may be performed to form a mold structure including insulating interlayers 202 and sacrificial layers 204 alternately and repeatedly stacked on the base layer patterns 201a, 201b and 201c, and the separation layer pattern 206.

Figure 30A:
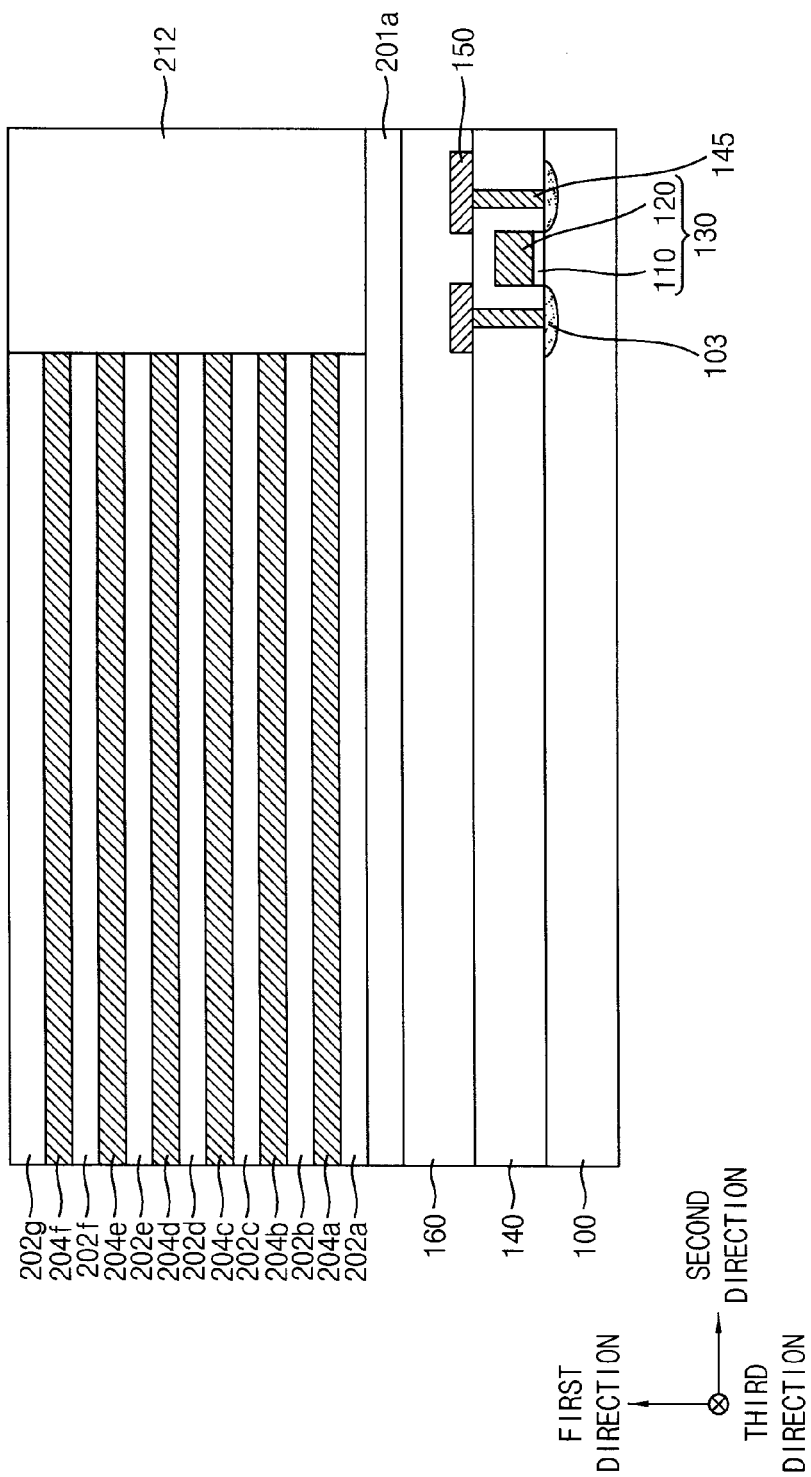
Figure 30B:
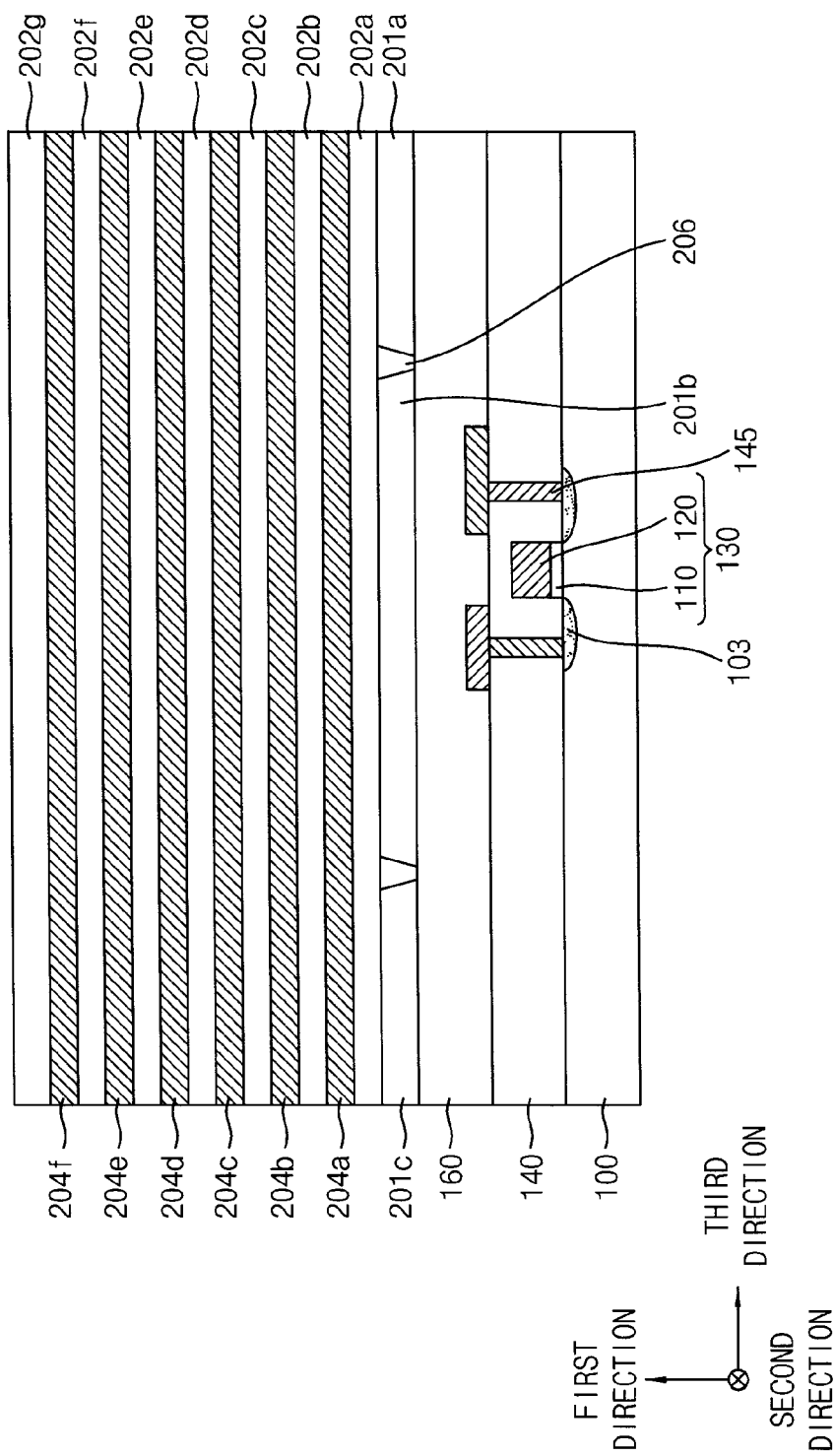

Referring to FIGS. 30A and 30B, a lateral portion of the mold structure may be removed, and an insulation layer covering the mold structure may be formed on the base layer patterns 201a, 201b and 201c, and the separation layer pattern 206. An upper portion of the insulation layer may be planarized until an uppermost insulating interlayer 202g is exposed to form a mold protection layer 212.

Figure 31A:
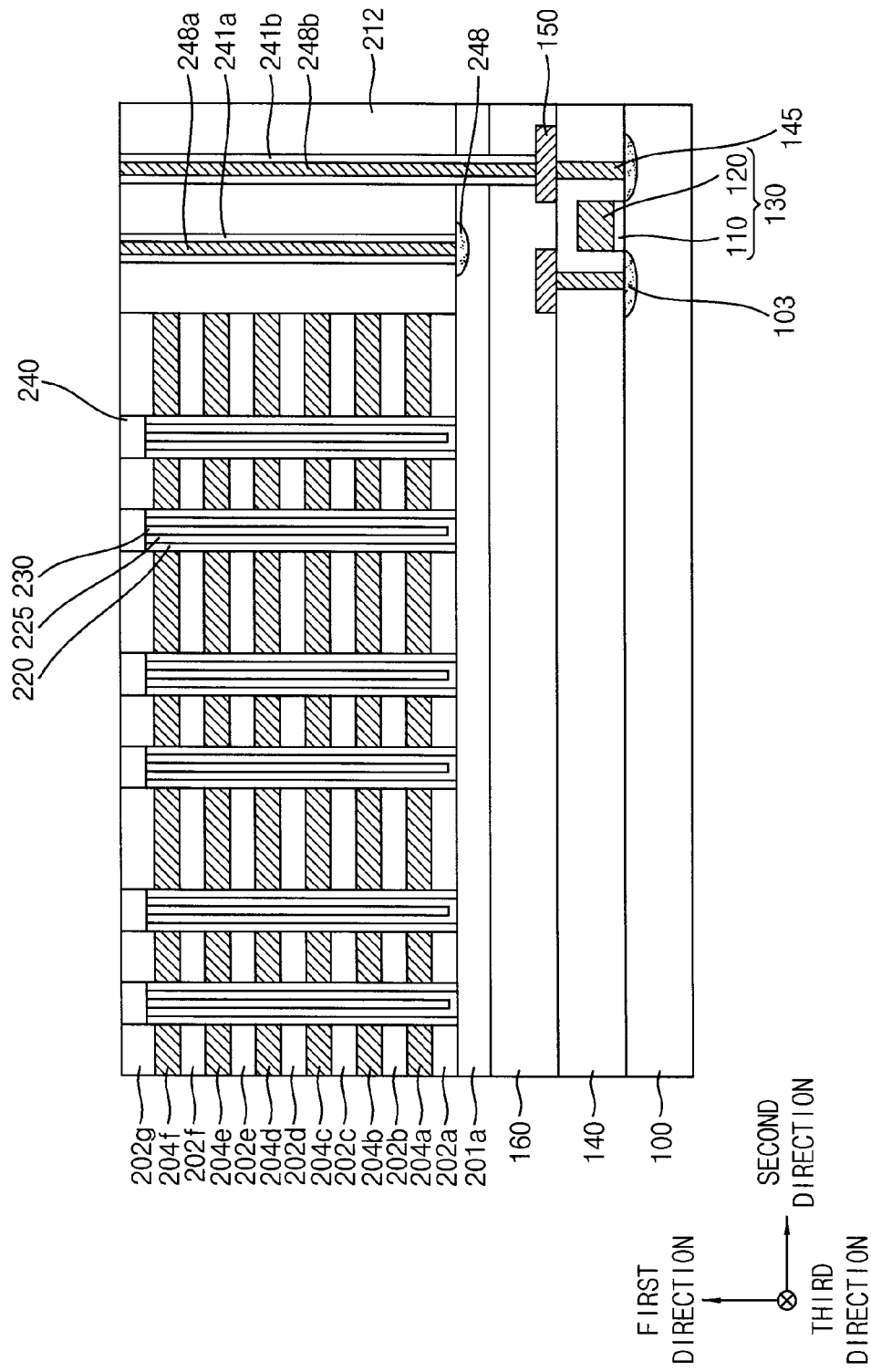
Figure 31B:
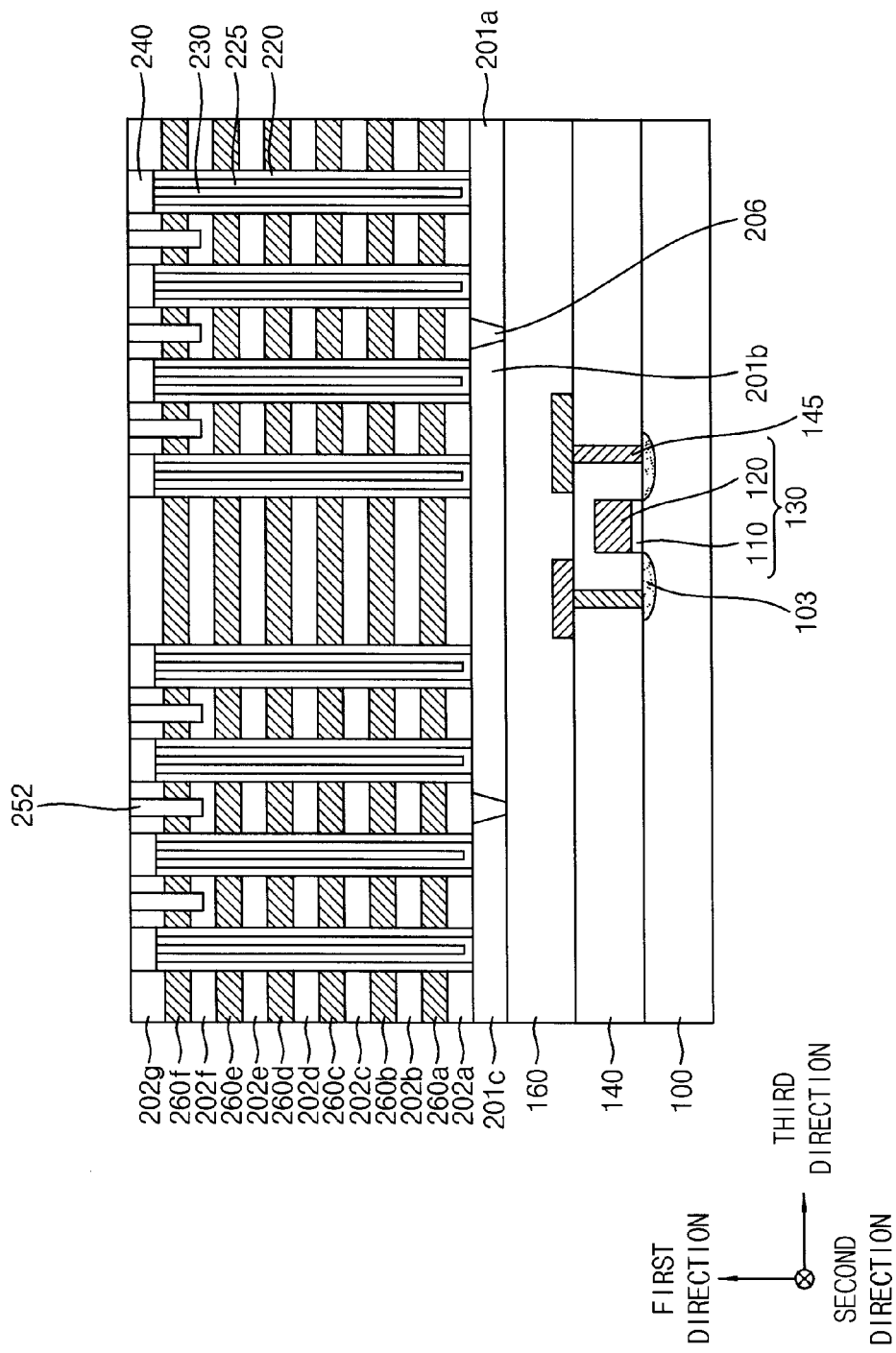

Referring to FIGS. 31A and 31B, processes substantially the same as or similar to those illustrated with reference to FIGS. 11A to 15B may be performed. Accordingly, channel holes may be formed through the mold structure, and a dielectric layer structure 220, a channel 225 and a filling layer pattern 230 may be formed in the channel hole. A pad 240 capping the channel hole may be formed on the dielectric layer structure 220, the channel 225 and the filling layer pattern 230.

Processes substantially the same as or similar to those illustrated with reference to FIGS. 16A to 17B may be performed to form a first connecting contact 248a and a second connecting contact 248b. For example, the mold protection layer 212 may be partially etched to form a first contact hole through which a top surface of the base layer pattern 201a, 201b and 201c is exposed. Impurities may be implanted through the first contact hole into an upper portion of the base layer pattern 201a, 201b and 201c to form a first impurity region 248.

The mold protection layer 212, the base layer pattern 201a, 201b and 201c, and the second lower insulation layer 160 may be partially etched to form a second contact hole through which the lower wiring 150 of the peripheral circuit is exposed. First and second insulation layer patterns 241a and 241b may be formed on sidewalls of the first and second contact holes, respectively, and then the first and second connecting contacts 248a and 248b may be formed to fill remaining portions of the first and second contact holes.

A pair of the first and second connecting contacts 248a and 248b may be formed per each of the base layer patterns 201a, 201b and 201c.

A process substantially the same as or similar to that illustrated with reference to FIGS. 18A and 18B may be performed to form an upper gate line cut pattern 252 intersecting, e.g., an SSL along the second direction.

Figure 32:
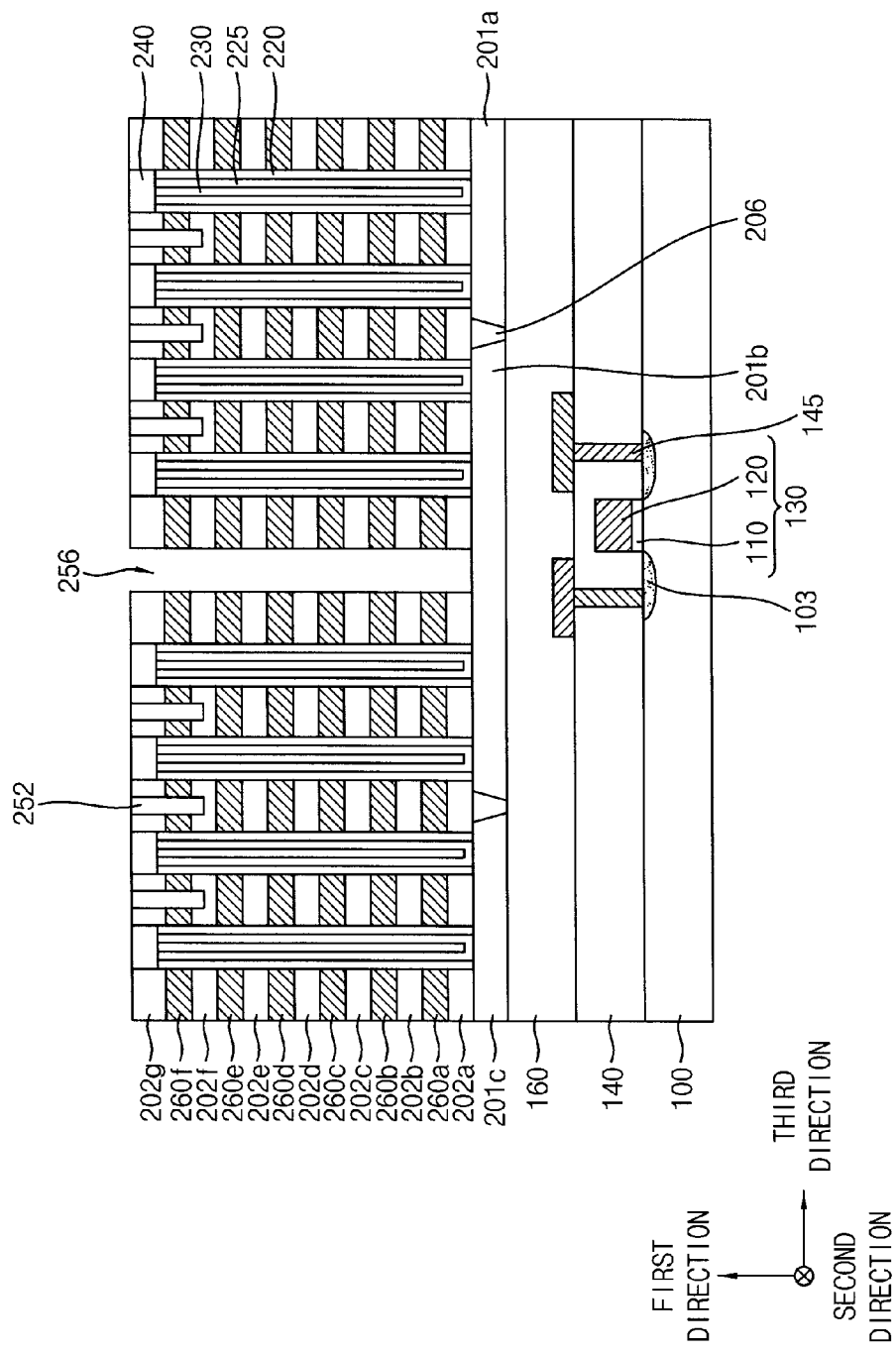

Referring to FIG. 32, processes substantially the same as or similar to those illustrated with reference to FIGS. 19A and 21B may be performed. Accordingly, a gate line cut region 256 extending in the second direction may be formed through the mold structure. The sacrificial layers 204 exposed by the gate line cut region 256 may be removed, and gate lines 260 may be formed at spaces from which the sacrificial layers 204 are removed.

In example embodiments, the gate line cut region 256 may be formed at a central portion of each of the base layer patterns 201a, 201b and 201c.

Figure 33:
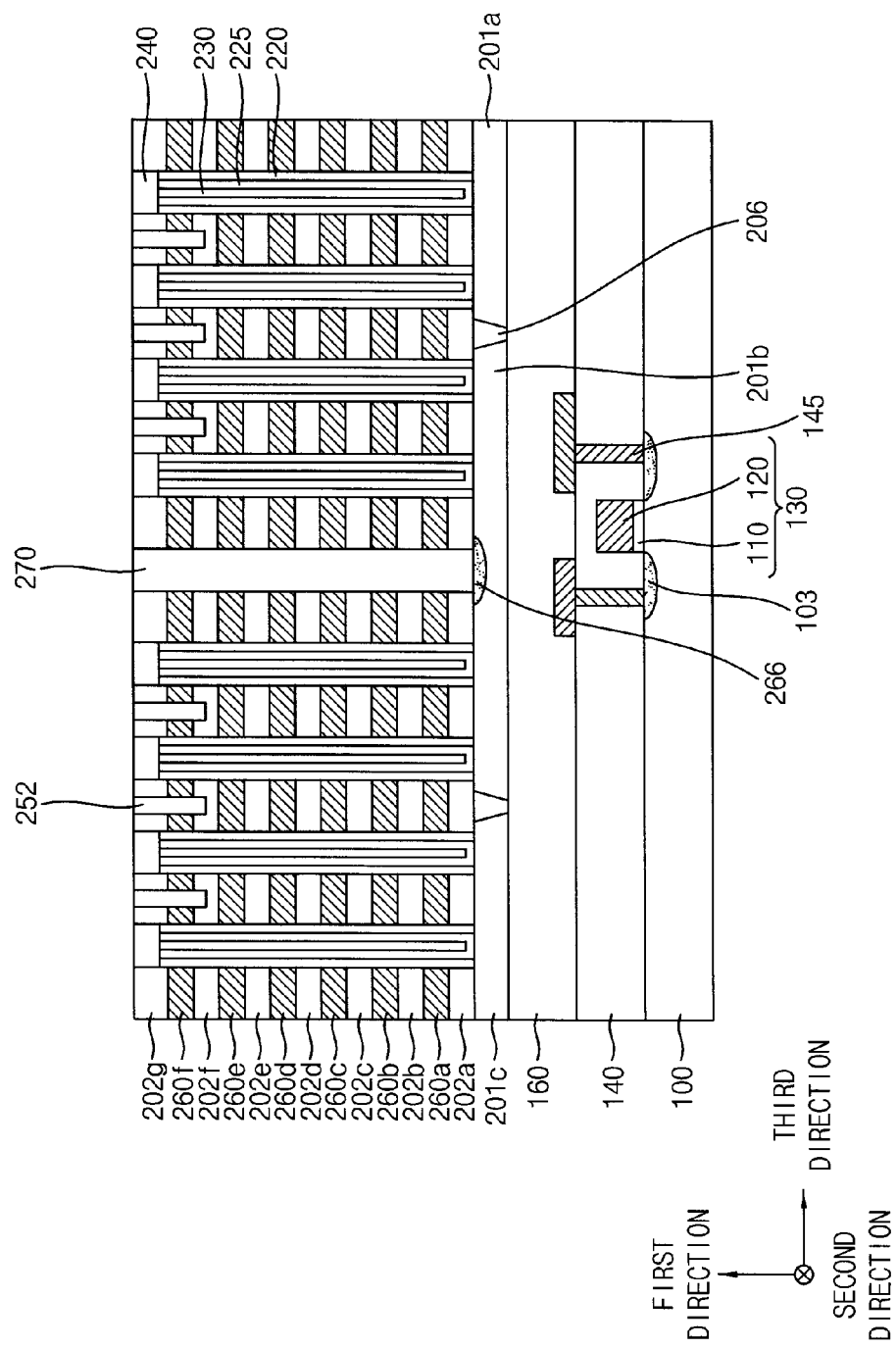

Referring to FIG. 33, a process substantially the same as or similar to that illustrated with reference to FIGS. 22A and 22B may be performed. Accordingly, a second impurity region 266 may be formed at an upper portion of the base layer pattern 201a, 201b and 201c exposed through the gate line cut region 256, and a gate line cut pattern 270 filling the gate line cut region 2556 may be formed on the second impurity region 266.

The second impurity region 266 may extend in the second direction. The second impurity region may be formed per each of the base layer patterns 201a, 201b to serve as a CSL.

Subsequently, processes substantially the same as or similar to those illustrated with reference to FIGS. 23A and 23B may be performed to obtain the semiconductor device of FIGS. 25 to 27.

Figure 34:
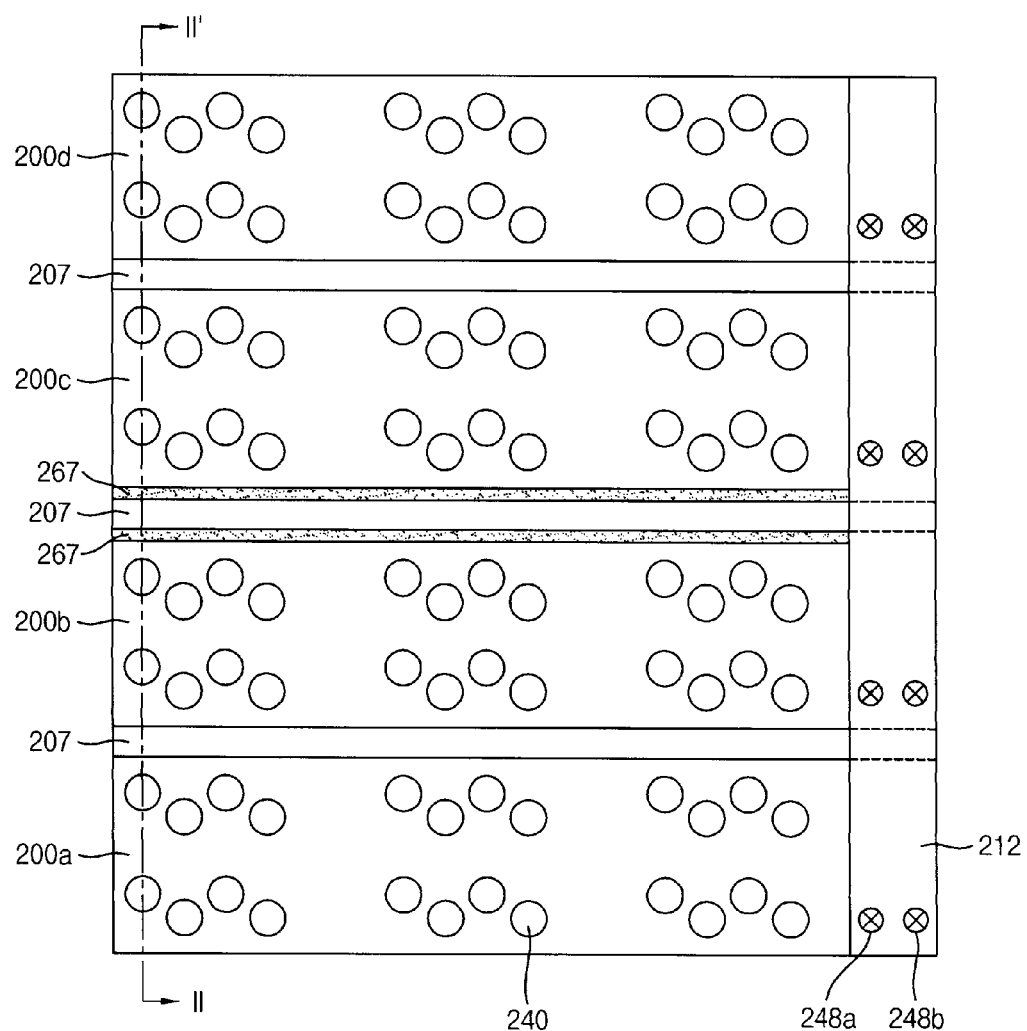
Figure 34:
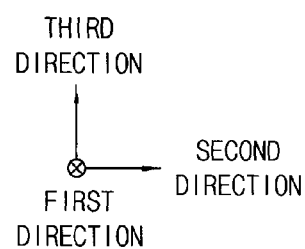
Figure 35:
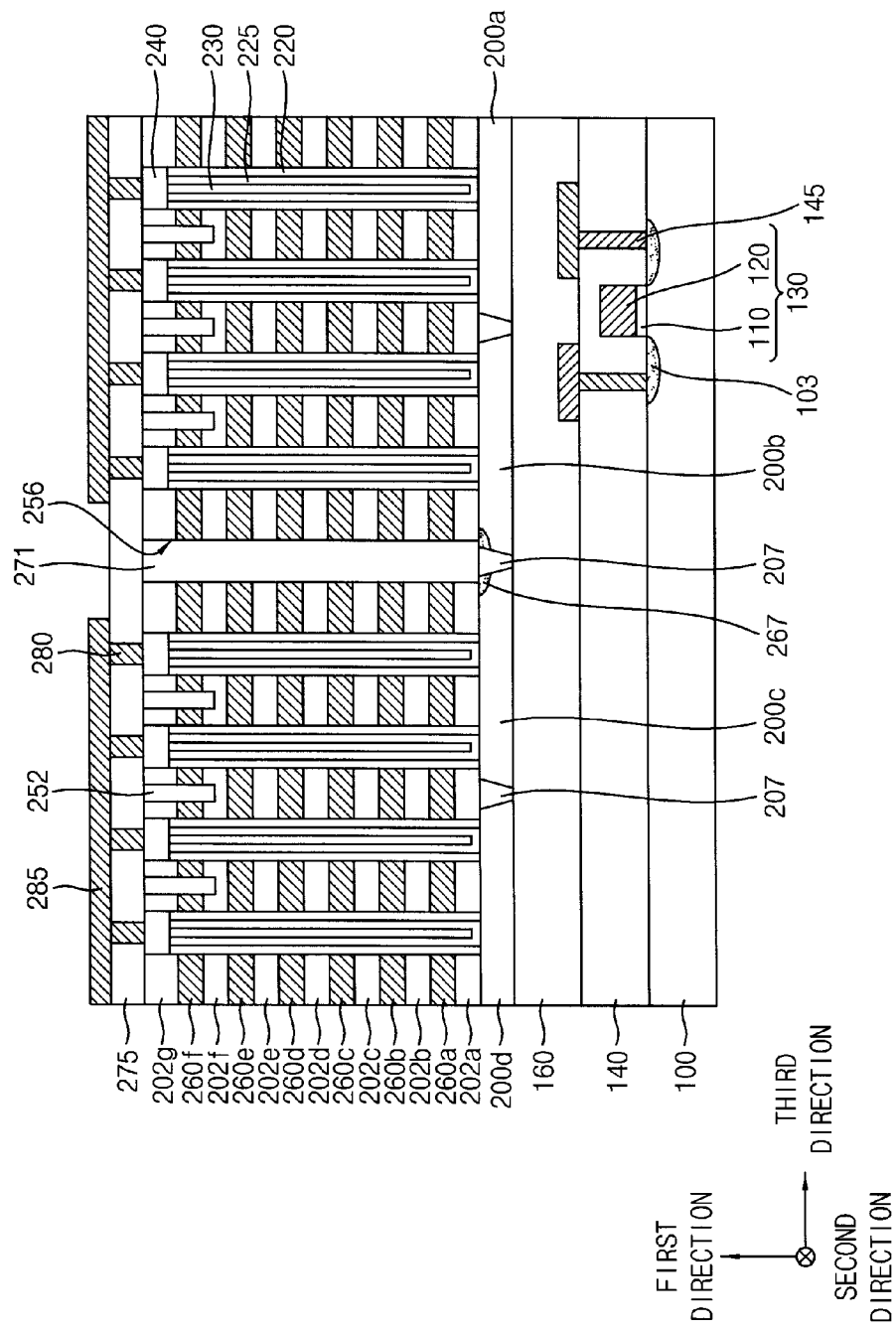

FIG. 34 is a top plan view illustrating a semiconductor device in accordance with some example embodiments. FIG. 35 is a cross-sectional view taken along a line II-II' of FIG. 34.

The semiconductor device of FIGS. 34 and 35 may have elements and/or constructions substantially the same as or similar to those illustrated with reference to FIGS. 25 to 27 except for structures and arrangements of a separation layer pattern and a second impurity region. Thus, detailed descriptions on repeated elements, structures and manufacturing methods thereof are omitted herein.

For a convenience of descriptions, FIG. 34 only illustrates base layer patterns 201a, 201b, 201c and 201d, a separation layer pattern 207, a second impurity region 267, a pad 240, a mold protection layer 212, a first connecting contact 248a and a second connecting contact 248b.

Referring to FIGS. 34 and 35, the separation layer pattern 207 may extend in the second direction, and the base layer patterns 200a, 200b, 200c and 200d may be physically separated from each other by the separation layer patterns 207.

A gate line cut region 256 may extend in the second direction, and a top surface of the separation layer pattern 207 may be exposed through the gate line cut region 256. In example embodiments, lateral portions of the neighboring base layer patterns, e.g., the second base layer pattern 200b and the third base layer pattern 200c may be also exposed through the gate line cut region 256.

The second impurity region 267 may be formed at the lateral portion of the base layer patterns exposed by the gate line cut region 256. In some embodiments, two second impurity regions 267 may extend together in contact with both lateral portions of the separation layer pattern 207.

A gate line cut pattern 271 may be formed in the gate line cut region 256. The gate line cut pattern 271 may have a width greater than that of the separation layer pattern 207. The gate line cut pattern 271 may substantially overlap the separation layer pattern 207.

The gate line cut pattern 271, the second impurity region 267, the separation layer pattern 207 and the gate line 260 may extend in substantially the same direction, e.g., the second direction.

According to example embodiments illustrated in FIGS. 34 and 35, CSLs for two base layer patterns may be formed through one gate line cut region 256.

Figure 36:
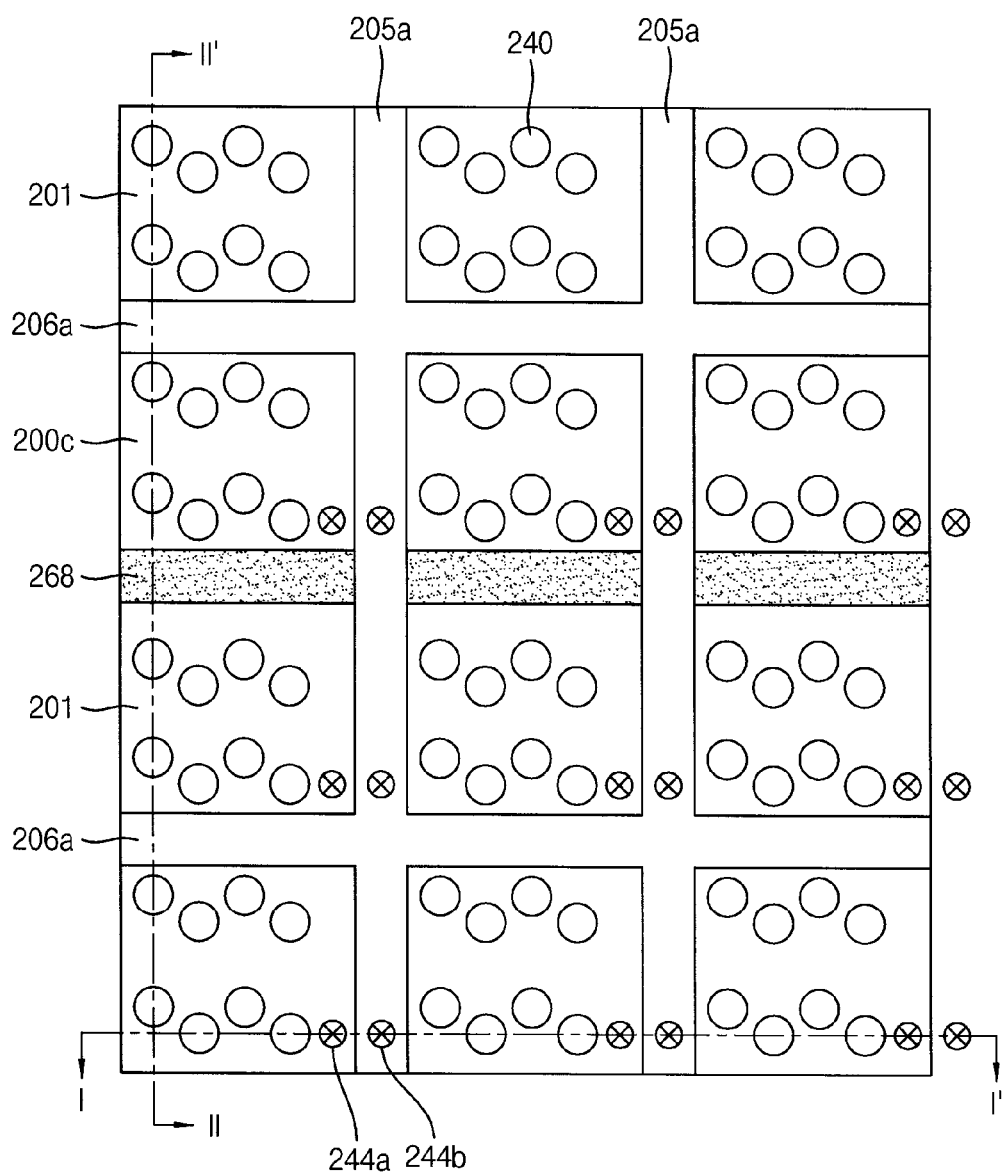
Figure 37:
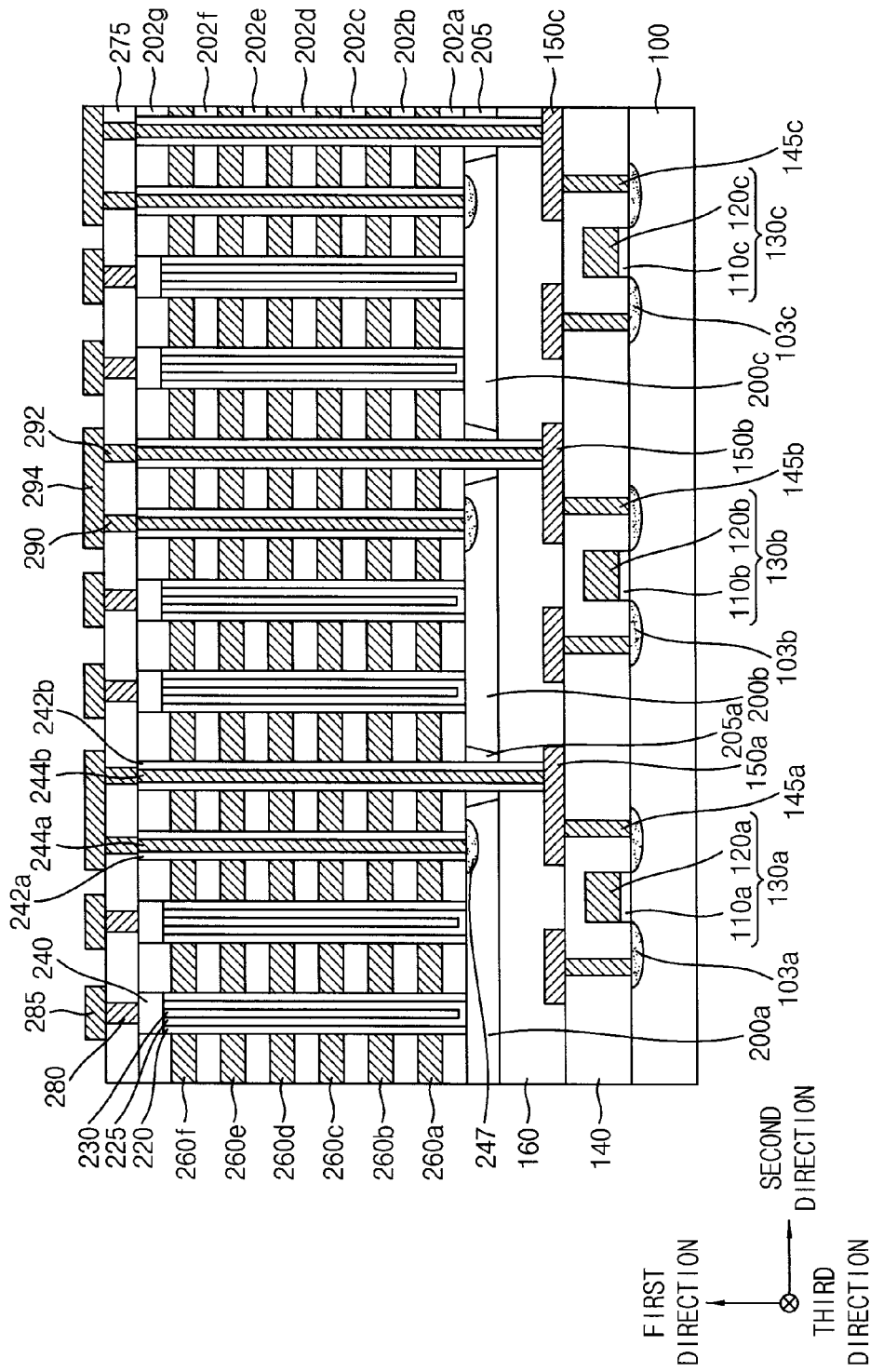
Figure 38:
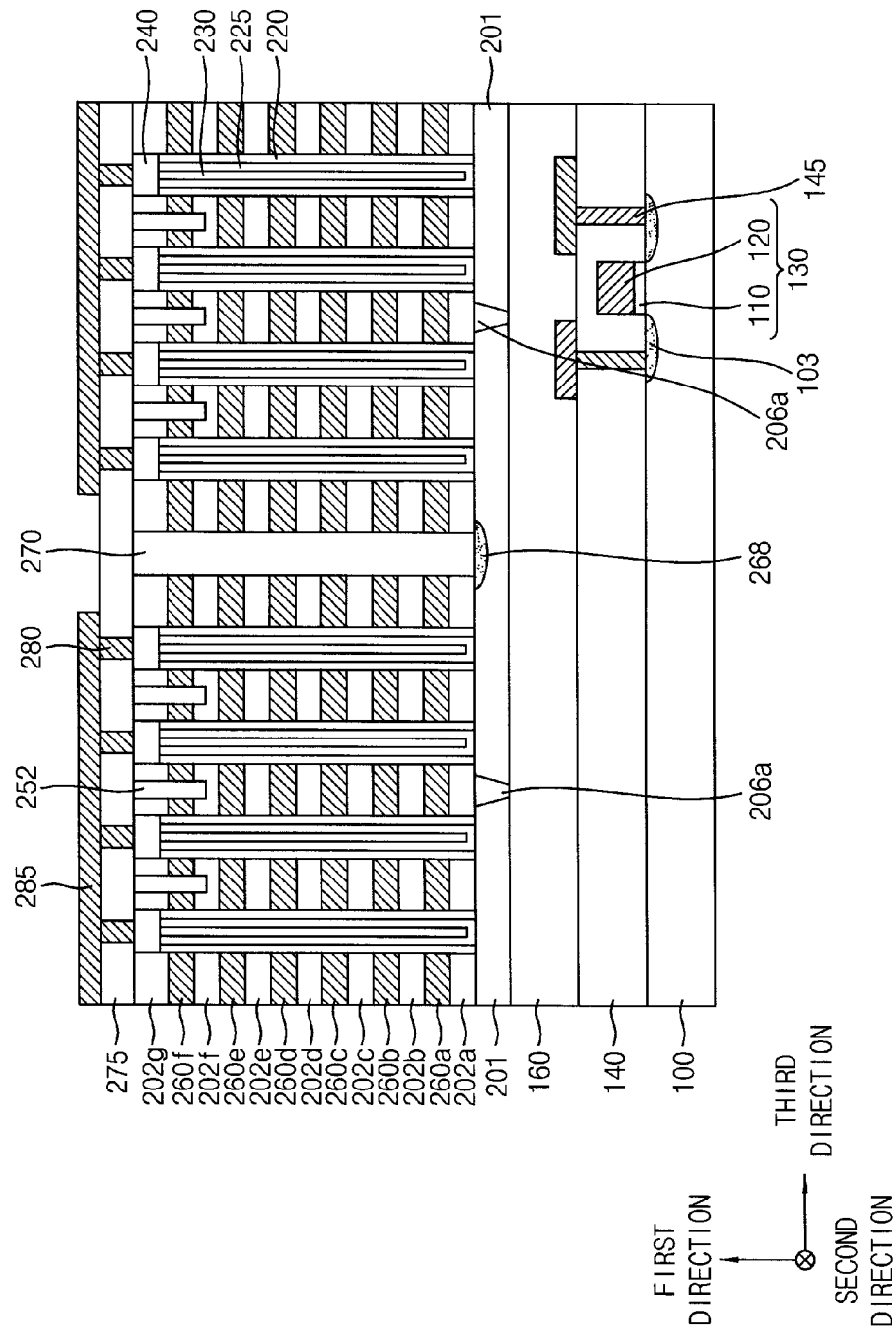

FIG. 36 is a top plan view illustrating a semiconductor device in accordance with example embodiments. FIGS. 37 and 38 are cross-sectional views taken along lines I-I' and II-II' of FIG. 36, respectively.

The semiconductor device of FIGS. 36 to 38 may have elements and/or constructions substantially the same as or similar to those illustrated with reference to FIGS. 1 to 3, or FIGS. 25 to 27 except for structures and arrangements of a separation layer pattern and a base layer pattern. Thus, detailed descriptions on repeated elements, structures and manufacturing methods thereof are omitted herein.

For a convenience of descriptions, FIG. 36 only illustrates a base layer pattern 201, separation layer patterns 205a and 206a, a second impurity region 268, a pad 240, and connecting contacts 244a and 244b.

Referring to FIGS. 36 to 38, the separation layer pattern may include the first separation layer pattern 205a and the second separation layer pattern 206a crossing each other. In example embodiments, the first separation layer pattern 205a and the second separation layer pattern 206a may be perpendicular to each other.

For example, the first separation layer pattern 205a may extend in the third direction. In this case, the first separation layer pattern 205a may extend in substantially the same direction as that of a bit line 285.

The second separation layer pattern 206a may extend in the second direction. In this case, the second separation layer pattern 206a may extend in substantially the same direction as that of a gate line 260.

In example embodiments, a base layer may be divided by the first and second separation layer patterns 205a and 206a crossing each other to form the base layer patterns 201 physically separated from each other. The base layer patterns 201 may be formed on a second lower insulation layer 160, and each of the base layer patterns 201 may be formed as an island pattern having a rectangular shape. Accordingly, cell blocks may be physically separated from each other, so that an interference or a crosstalk therebetween may be prevented.

The second impurity region 268 may be formed per each of the base layer patterns 201. For example, the second impurity region 268 may be formed at a central portion of each base layer pattern 201 and may extend in the second direction. The first separation layer pattern 205a may intersect or cut the second impurity region 268.

In some embodiments, as illustrated in FIGS. 34 and 35, the gate line cut pattern 270 may substantially overlap the second separation layer pattern 206a. In this case, the second impurity regions 268 may extend in contact with both lateral portions of the second separation layer pattern 206a.

The first connecting contact 244a, the second connecting contact 244b and a connecting wiring 294 may be provided per each of the base layer patterns 201.

Figure 39:
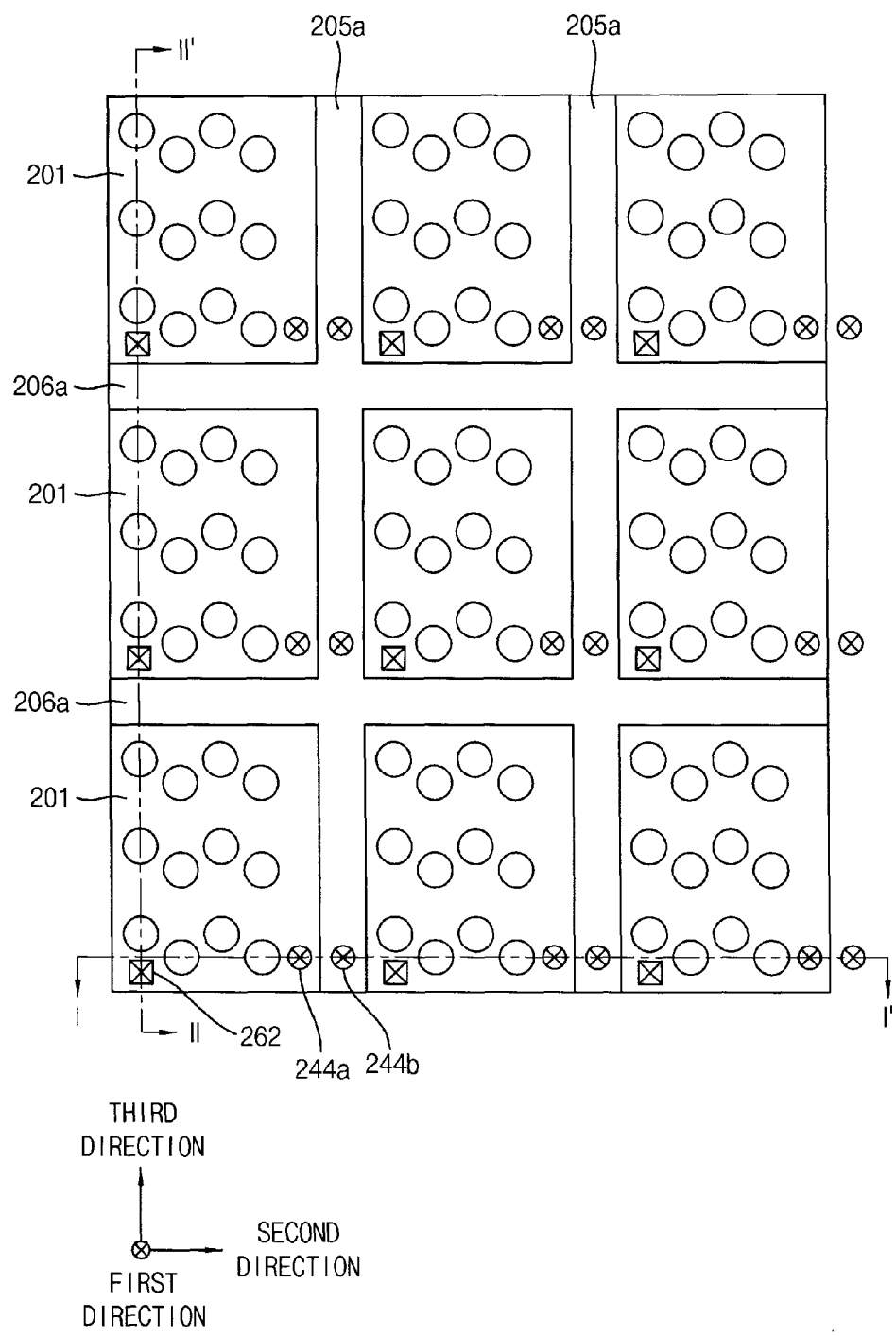
Figure 40:
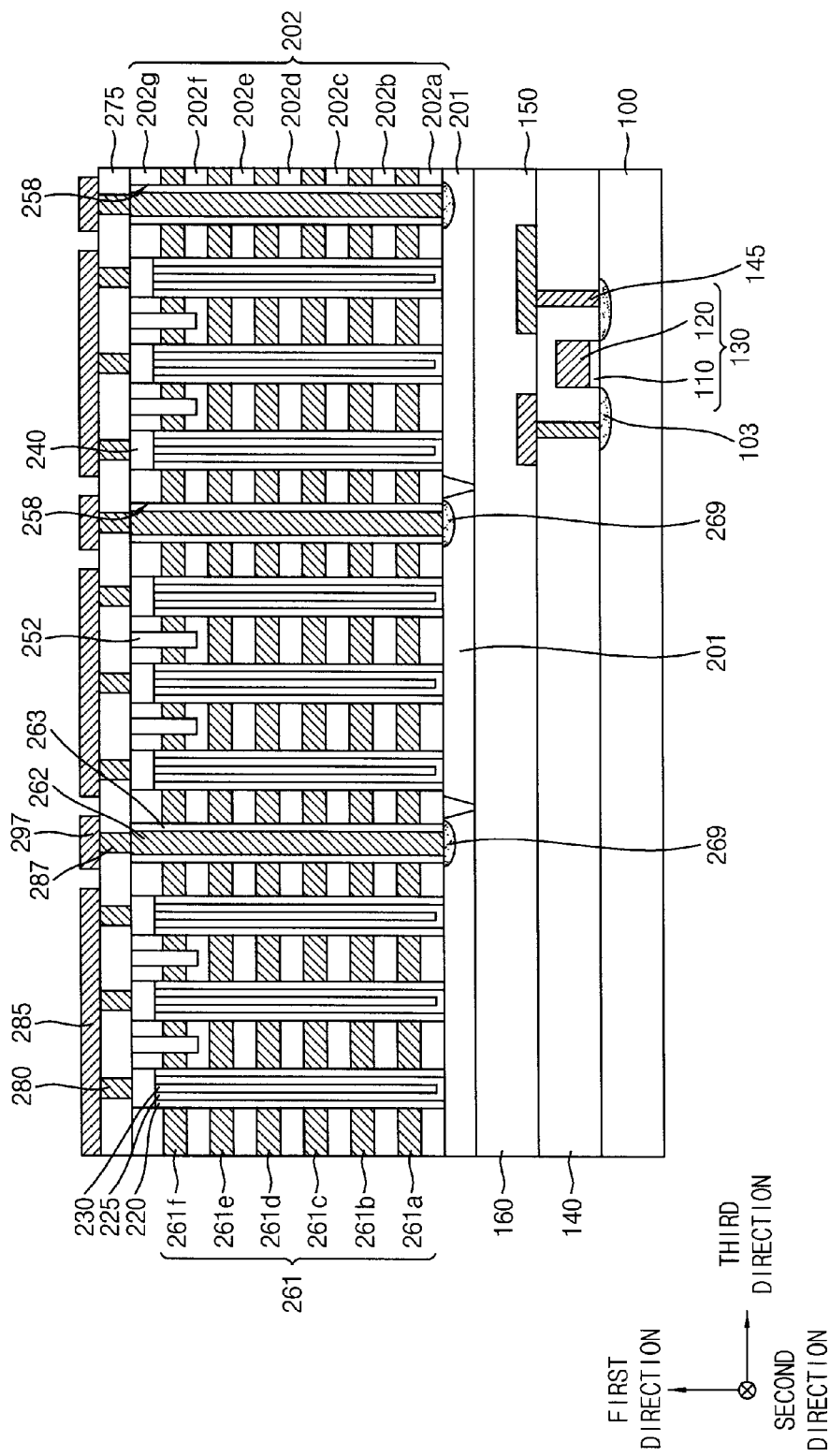
Figure 41:
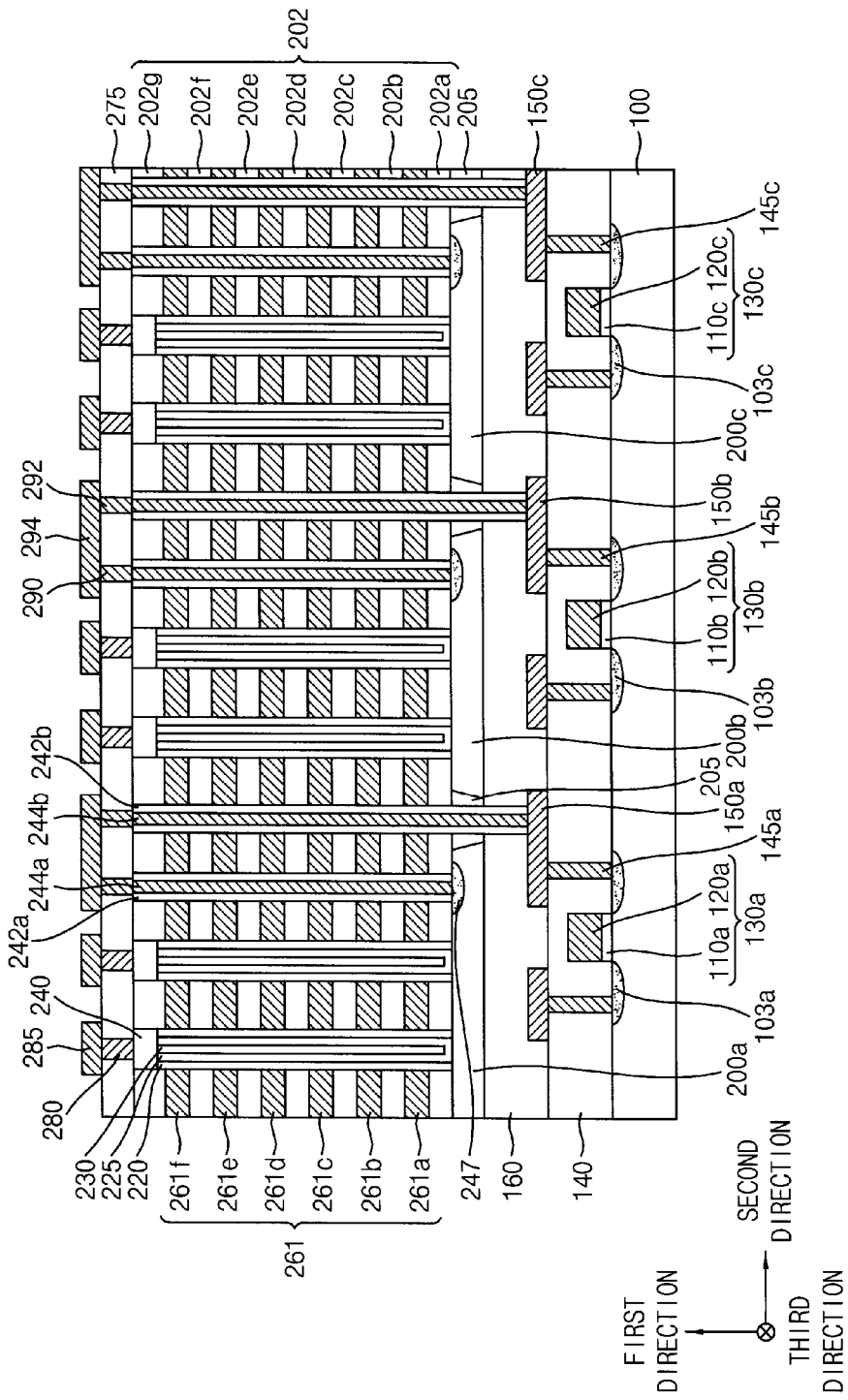

FIG. 39 is a top plan view illustrating a semiconductor device in accordance with some example embodiments. FIGS. 40 and 41 are cross-sectional views taken along lines I-I' and II-II' of FIG. 39, respectively.

The semiconductor device of FIGS. 39 to 41 may have elements and/or constructions substantially the same as or similar to those illustrated with reference to FIGS. 36 to 38 except for structures and arrangements of a second impurity region and a gate line. Thus, detailed descriptions on repeated elements, structures and manufacturing methods thereof are omitted herein.

For a convenience of descriptions, FIG. 39 only illustrates a base layer pattern 201, separation layer patterns 205a and 206a, a pad 240, a CSL contact 262 and connecting contacts 244a and 244b.

Referring to FIGS. 39 to 41, the semiconductor device may include the first separation layer pattern 205a and the second separation layer pattern 206a as illustrated in FIGS. 36 to 38. The base layer patterns 201 isolated from each other as an island pattern may be defined on a second lower insulation layer 160 by the first and second separation layer patterns 205a and 206a.

In example embodiments, a gate line 261 at each level may not be cur or separated, thereby to be provided commonly for the base layer patterns 201. For example, a word line and a GSL except for an SSL which may be separated by an upper gate line cut pattern 252 may be integral at each level to be provided commonly for cell blocks segmented by the base layer patterns 201.

In this case, a CSL hole 258 extending through the gate lines 261 and insulating interlayers 202 may be formed instead of a gate line cut region as described above. The CSL hole 258 may be formed per each of the base layer patterns 201. Sacrificial layers (not illustrated) exposed by the CSL holes 258 may be removed, and the gate lines 261 may be formed at spaces from which the sacrificial layers are removed.

A second impurity region 269 including, e.g., n-type impurities may be formed at an upper portion of the base layer pattern 201 exposed through the CSL hole 258. In example embodiments, the second impurity region 269 may have substantially an island shape formed at a predetermined region of the base layer pattern 201.

An insulation layer pattern 263 may be formed on a sidewall of the CSL hole 258. The CSL contact 262 may fill a remaining portion of the CSL hole 258 to be in contact with the second impurity region 269.

A CSL 297 may be formed on an upper insulation layer 275 to be electrically connected to the CSL contact 262. The CSL 297 may be electrically connected to the CSL contact 262 via a third plug 287 formed through the upper insulation layer 275. The CSL 297 may extend in a second direction or a third direction to be electrically connected to a plurality the CSL contacts 262.

In example embodiments, the CSL contact 262, the first and second connecting contacts 244a and 244b, and a connecting wiring 294 may be provided per each of the base layer patterns 201.

FIGS. 42A to 44C are top plan views and cross-sectional views illustrating a method of manufacturing a semiconductor device in accordance with example embodiments. For example, FIGS. 42A to 44C illustrate example embodiments of growing a base layer pattern from a substrate.

Figure 42A:
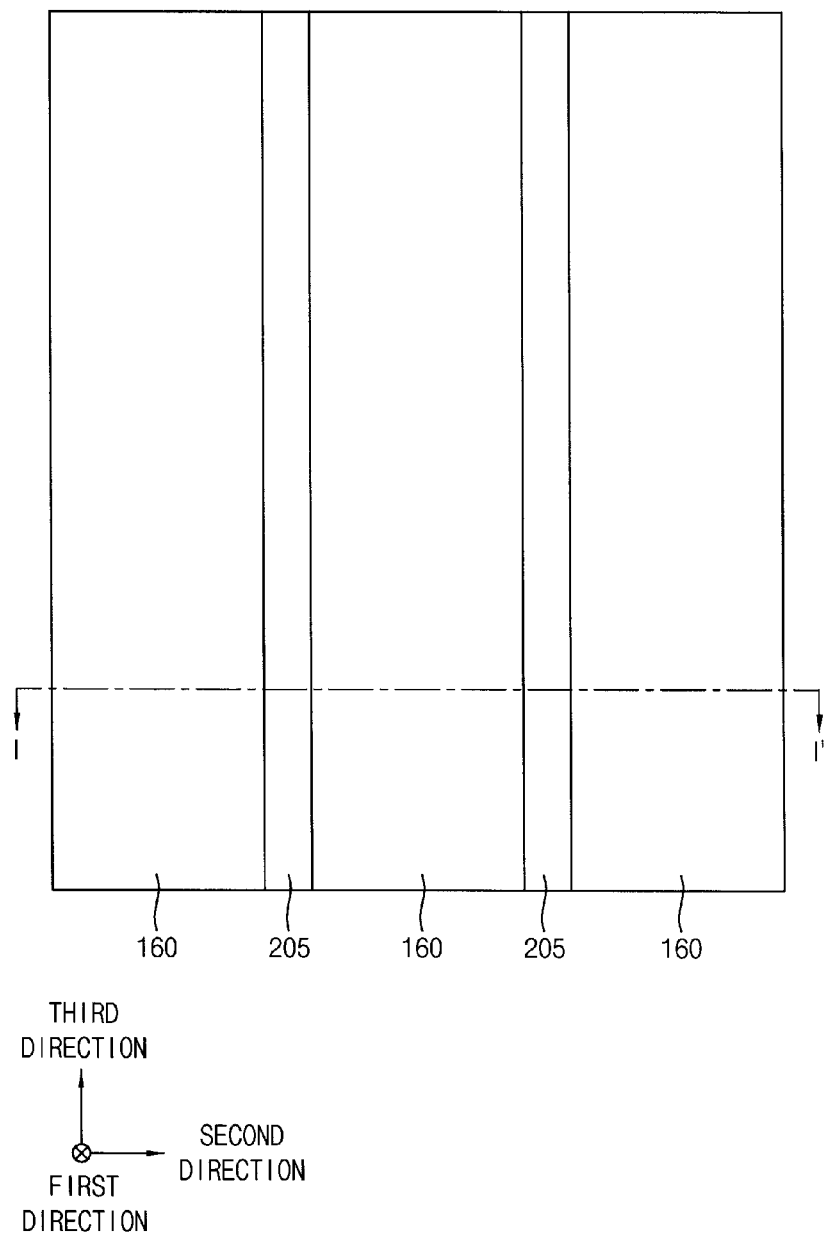
Figure 43A:
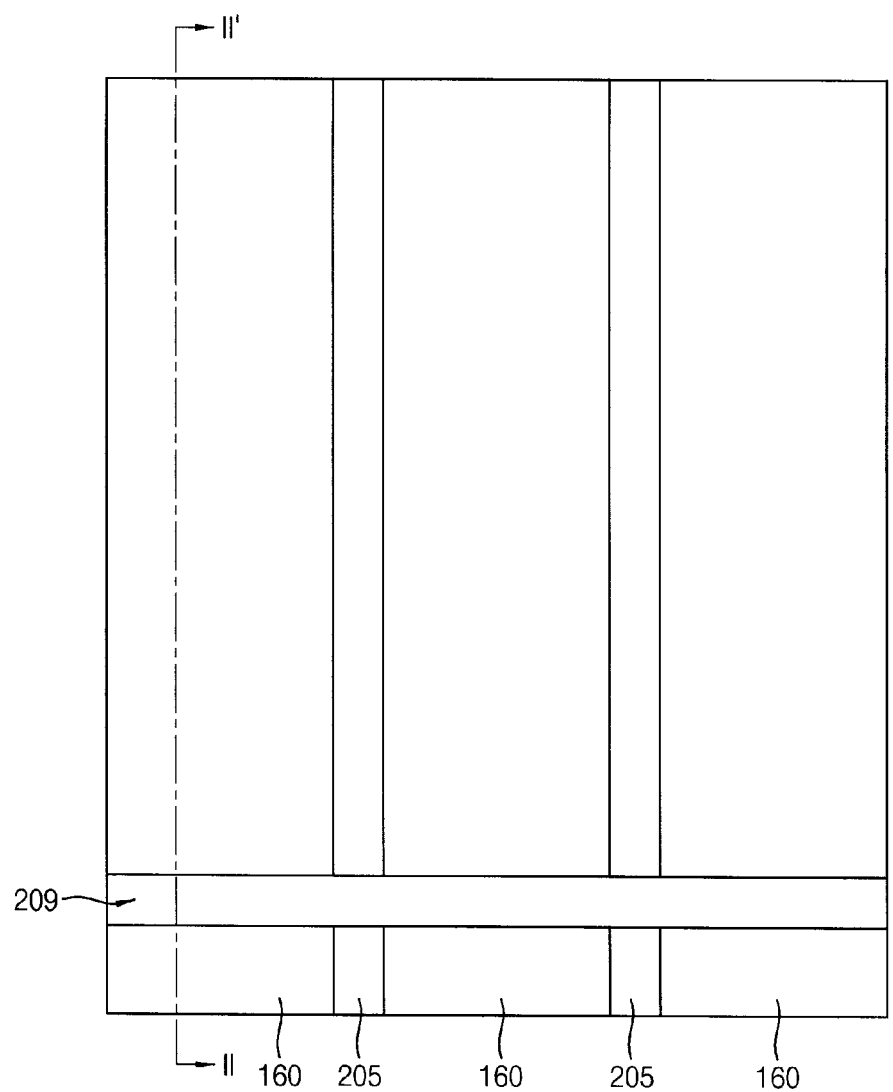
Figure 43B:
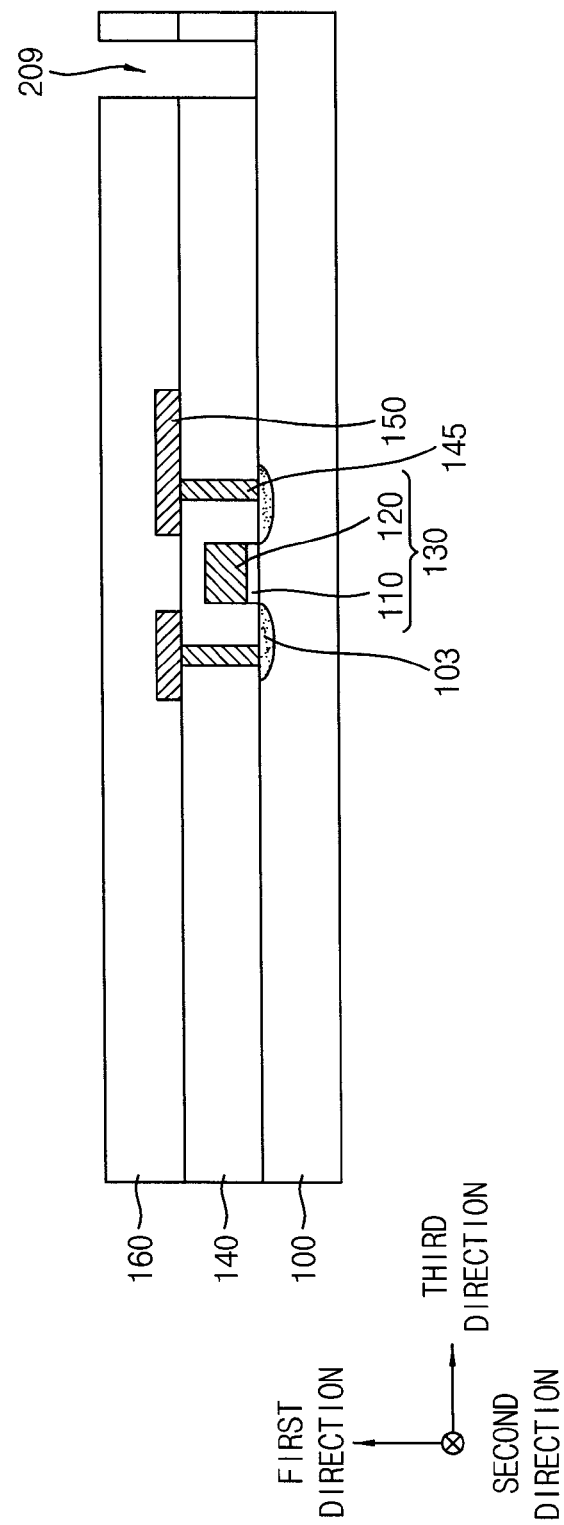
Figure 44A:
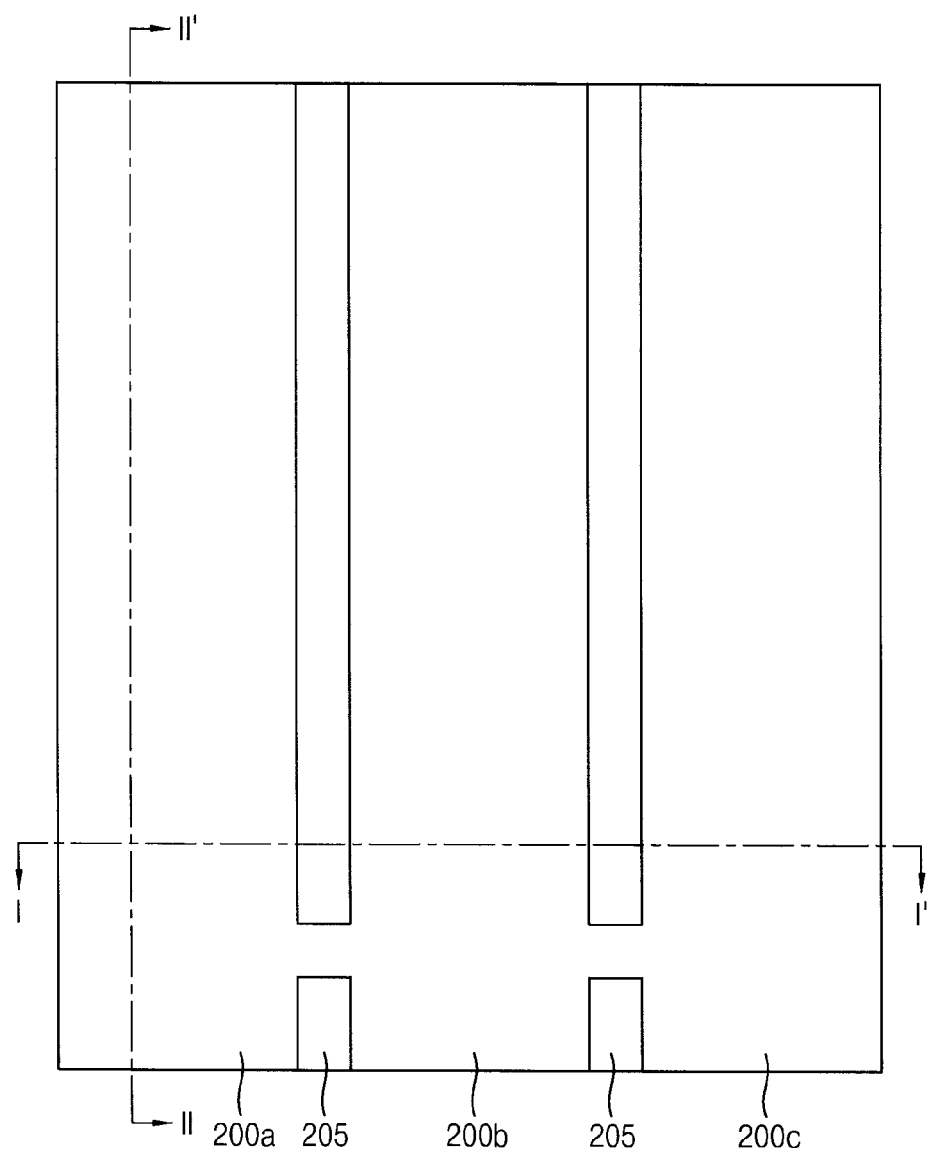
Figure 44B:
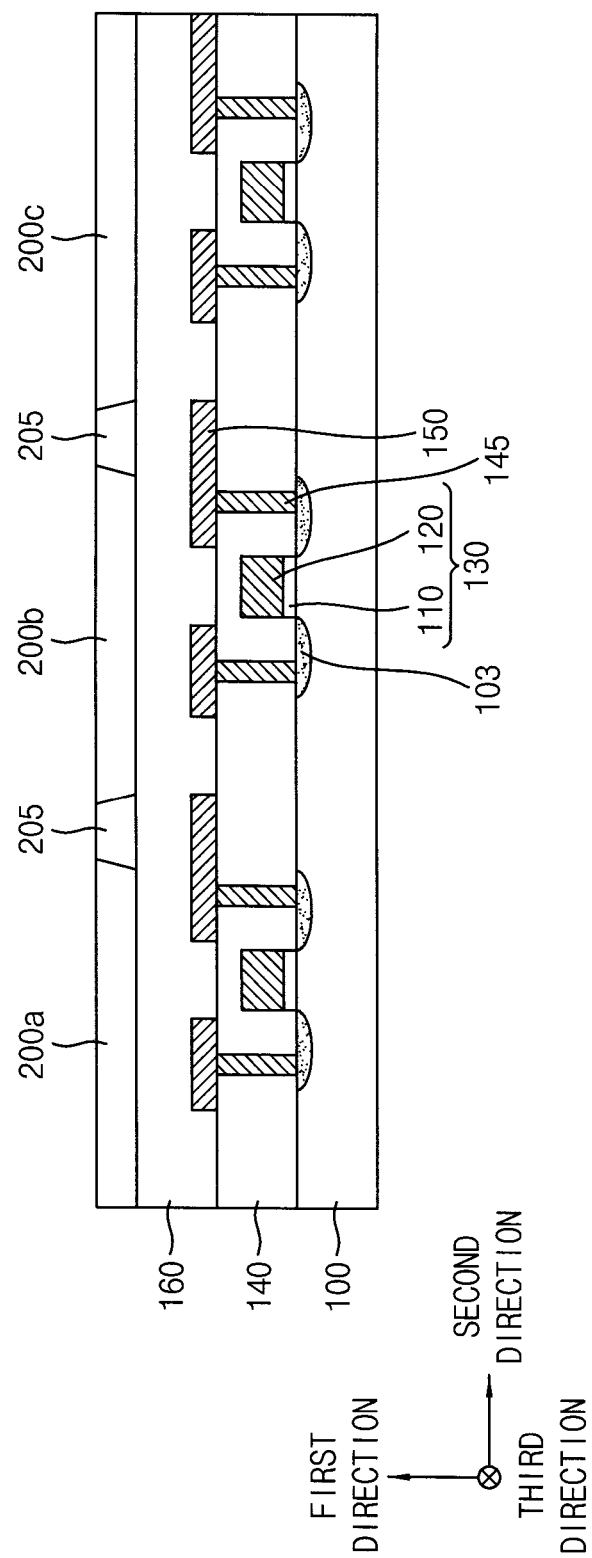
Figure 44C:
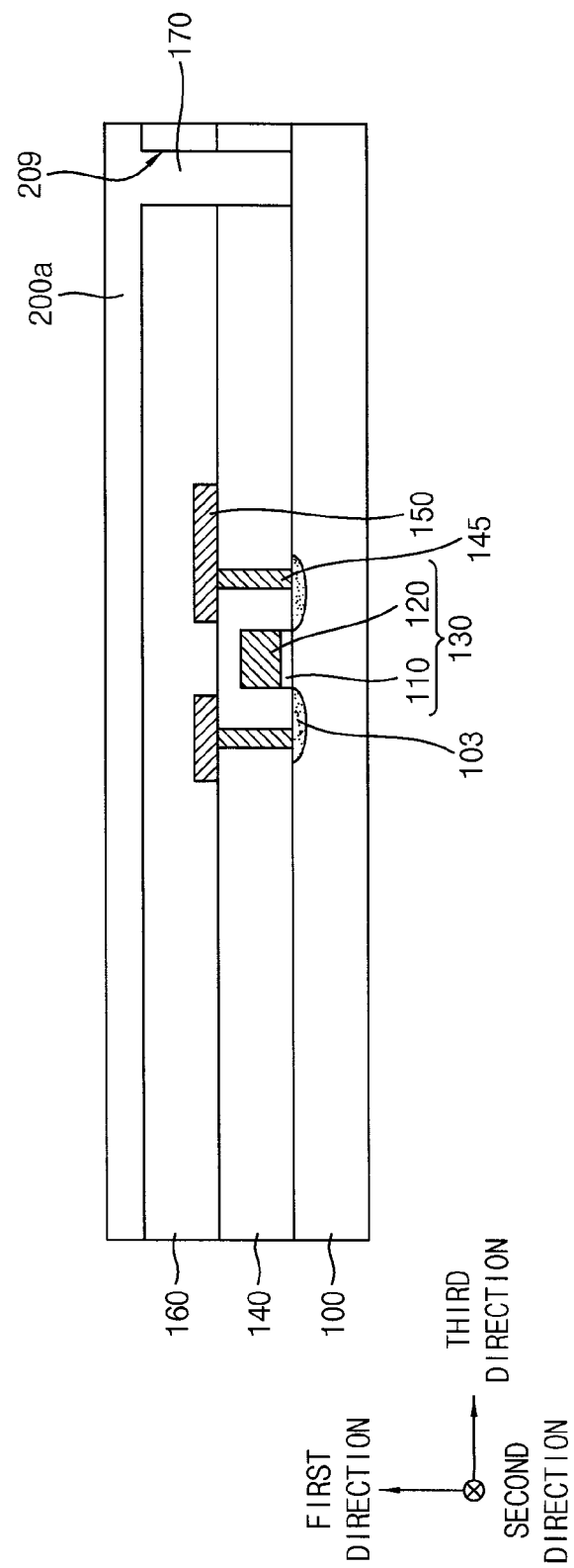

Specifically, FIGS. 42A, 43A and 44A are top plan views illustrating the method of manufacturing the semiconductor device. FIGS. 42B and 44B are cross-sectional views taken along a line I-I' of the top plan views. FIGS. 43B and 44C are cross-sectional views taken along a line II-IF of the top plan views.

Detailed descriptions on processes substantially the same as or similar to those illustrated with reference to FIGS. 5 to 23B are omitted herein.

Referring to FIGS. 42A and 42B, processes substantially the same as or similar to those illustrated with reference to FIGS. 5 and 6 may be performed to form a peripheral circuit on a substrate 100, and first and second lower insulation layers 140 and 160 may be formed on the substrate 100 to cover the peripheral circuit.

A separation layer pattern 205 extending in, e.g., the third direction may be formed on the second lower insulation layer 160. A plurality of the separation layer patterns 205 may be formed by a predetermined distance along the second direction.

In example embodiments, a separation layer may be formed on the second lower insulation layer 160 using silicon oxide. The separation layer may be partially etched to form the separation layer patterns 205.

Referring to FIGS. 43A and 43B, the separation layer pattern 205, the second lower insulation layer 160 and the first lower insulation layer 140 may be partially etched to form an opening 209. A top surface of the substrate 100 may be exposed through the opening 209.

In example embodiments, the opening 209 may extend in the second direction. FIGS. 43A and 43B illustrate that the opening 209 is formed at one end portion of the substrate 100. However, in an embodiment, the openings 209 may be formed at both end portions of the substrate 100.

Referring to FIGS. 44A to 44C, an SEG process may be performed using the substrate as a seed to form a base layer. The base layer may be grown from the substrate 100, and may fill the opening 209 and at least partially cover the separation layer pattern 205. An upper portion of the base layer may be planarized to form base layer patterns 200a, 200b and 200c.

In example embodiments, the base layer may include single crystalline silicon. A portion of the base layer formed in the opening 209 may be defined as a semiconductor growth pattern 170.

Subsequently, the one end portion of the substrate 100 including the semiconductor growth pattern 170 may be cut and removed along, e.g., the line I-I'. Accordingly, portions of the separation layer pattern 205, the second lower insulation layer 160 and the first lower insulation layer 140 may be also removed together with the one end portion of the substrate 100.

In some embodiments, if the openings 209 may be formed at the both end portions of the substrate 100, portions of the semiconductor patterns 170, the separation layer pattern 205, and the first and second lower insulation layers 140 and 160 formed on the both end portions of the substrate 100 may be cut and removed.

Accordingly, the base layer patterns 200a, 200b and 200c physically separated from each other by the separation layer patterns 205 may be obtained.

Processes substantially the same as or similar to those illustrated with reference to FIGS. 10 to 23B may be further performed to obtain the semiconductor device in accordance with example embodiments.

Figure 45:
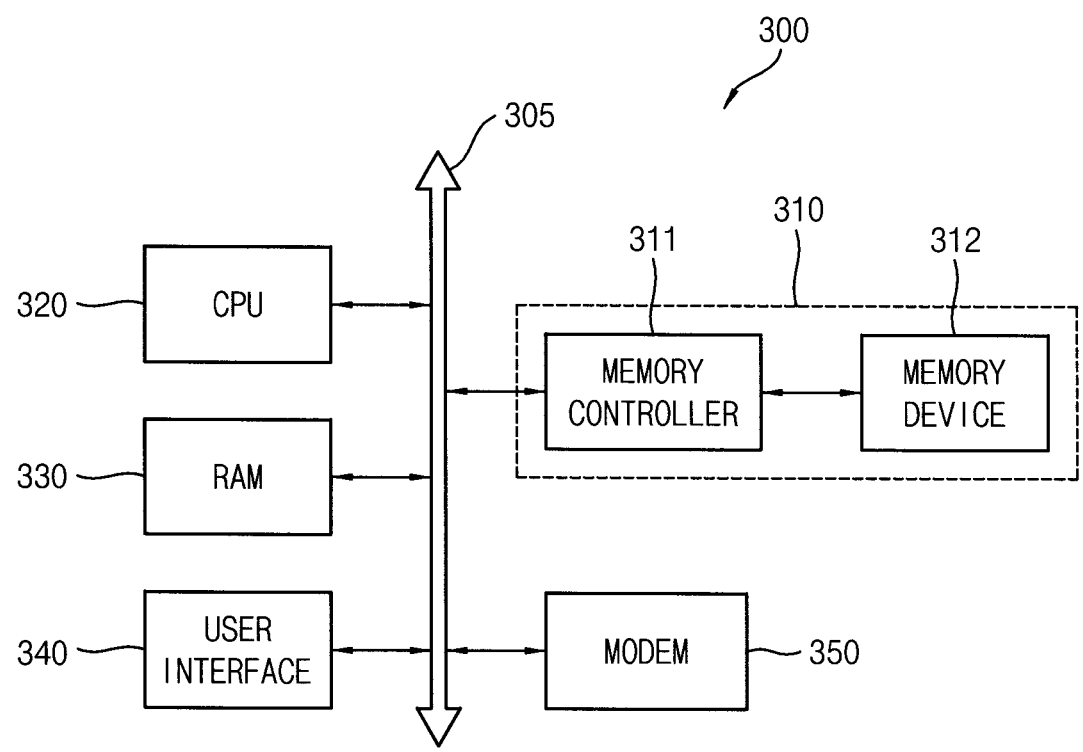

FIG. 45 is a block diagram illustrating a schematic construction of an information processing system in accordance with some example embodiments.

Referring to FIG. 45, an information processing system 300 may include a CPU 320, a RAM 330, a user interface 340, a modem 350 such as a baseband chipset and a memory system 310 electrically connected to a system bus 305. The memory system 310 may include a memory device 312 and a memory controller 311. The memory device 312 may include the semiconductor device in accordance with example embodiments described above. Thus, large data processed by the CPU 320 or input from an external device may be stored in the memory device 312 with high reliability. The memory controller 311 may have a construction capable of controlling the memory device 312. The semiconductor device in accordance with example embodiments may include cell blocks segmented by independent base layer patterns, and thus an operation of each cell block may be controlled easily with an improved efficiency.

The memory system 310 may be provided as, e.g., an electronic device such as a memory card or a solid state disk (SSD) by a combination of the memory device 312 and the memory controller 311. In a case that the information processing system 300 is implemented to an electronic device such as a mobile device, a battery may be further provided for supplying an driving voltage of the information processing system 300. The information processing system 300 may further include an application chipset, a camera image processor (CIS), a mobile DRAM, etc.

According to example embodiments of the present invention, a base layer formed on a peripheral circuit structure may be divided into a plurality of base layer patterns physically separated from each other by a separation layer pattern. Thus, a memory cell structure stacked on the base layer may be segmented into smaller units. Accordingly, a semiconductor device may be operated independently in a cell block or a sub-cell block, and data may be stored and utilized more efficiently.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor device, comprising:
   a lower insulation layer;
   a plurality of base layer patterns separated from each other on the lower insulation layer;
   a separation layer pattern between the base layer patterns;
   a plurality of channels extending in a vertical direction with respect to top surfaces of the base layer patterns;
   a plurality of gate lines surrounding outer sidewalls of the channels, the gate lines being stacked in the vertical direction and spaced apart from each other; and
   a bit line electrically connected to the channels,
   wherein the separation layer pattern extends in the same direction as an extending direction of the bit line.

2. The semiconductor device of claim 1, wherein the base layer patterns include polysilicon or single crystalline silicon.

3. The semiconductor device of claim 2, wherein the base layer patterns serve as p-type wells.

4. The semiconductor device of claim 1, wherein the separation layer pattern includes a first separation layer pattern and a second separation layer pattern crossing each other.

5. The semiconductor device of claim 4, wherein the base layer patterns include island patterns isolated from each other.

6. The semiconductor device of claim 1, further comprising a peripheral circuit on a substrate,
wherein the lower insulation layer covers the peripheral circuit.

7. The semiconductor device of claim 6, further comprising:
a first impurity region formed on an upper portion of each of the base layer patterns;
a first connecting contact in contact with the first impurity region;
a second connecting contact electrically connected to the peripheral circuit; and
a connecting wiring for electrically connecting the first connecting contact and the second connecting contact to each other,
wherein the first impurity region, the first connecting contact, the second connecting contact and the connecting wiring are provided for each of the base layer patterns.

8. The semiconductor device of claim 1, further comprising:
a gate line cut pattern intersecting the gate lines in the vertical direction; and
a second impurity region formed at a portion of the base layer patterns under the gate line cut pattern.

9. The semiconductor device of claim 8, wherein the gate line cut pattern and the second impurity region extend in a direction crossing the separation layer pattern.

10. The semiconductor device of claim 9, wherein the second impurity region is cut or separated by the separation layer pattern.

11. The semiconductor device of claim 8, wherein the gate line cut pattern and the second impurity region extend in the same direction as an extending direction of the separation layer pattern.

12. The semiconductor device of claim 11, wherein the gate line cut pattern overlaps the separation layer pattern along the vertical direction.

13. The semiconductor device of claim 11, wherein the second impurity region is formed at a central portion of each of the base layer patterns.

14. A semiconductor device, comprising:
a peripheral circuit on a substrate;
a lower insulation layer covering the peripheral circuit;
a plurality of base layer patterns separated from each other on the lower insulation layer; and
a plurality of cell blocks on the base layer patterns, the cell blocks including:
a plurality of channels extending in a vertical direction with respect to top surfaces of the base layer patterns; and
a plurality of gate lines surrounding outer sidewalls of the channels, the gate lines being stacked in the vertical direction and spaced apart from each other.

15. The semiconductor device of claim 14, wherein each one of the cell blocks is segmented into a plurality of sub-cell blocks.

16. The semiconductor device of claim 15, further comprising:
separation layer patterns between the base layer patterns; and
gate line cut patterns between the cell blocks, the gate line cut patterns extending in a direction that crosses the separation layer patterns,
wherein the sub-cell blocks are defined by the separation layer patterns and the gate line cut patterns.

17. The semiconductor device of claim 16, further comprising a connecting contact electrically connected to the peripheral circuit and provided for each of the sub-cell blocks.

18. A semiconductor device, comprising:
lower transistor on a substrate;
a lower insulation layer; on the substrate, the lower insulation layer covering the lower transitor;
a plurality of base layer patterns separated from each other on the lower insulation layer;
a separation layer pattern between the base layer patterns;
a plurality of channels extending in a vertical direction with respect to top surfaces of the base layer patterns;
a plurality of gate lines surrounding outer sidewalls of the channels, the gate lines being stacked in the vertical direction and spaced apart from each other; and
a first contact extending through the separation layer pattern and the lower insulation layer to be electrically connected to the lower transitor.

19. The semiconductor device of claim 18, further comprising:
a second contact electrically connected to one of the base layer patterns; and
a connecting wiring electrically connecting the first contact and the second contact to each other.

* * * * *